(12) United States Patent
Koezuka et al.

(10) Patent No.: US 11,637,208 B2
(45) Date of Patent: Apr. 25, 2023

(54) SEMICONDUCTOR DEVICE

(71) Applicant: Semiconductor Energy Laboratory Co., Ltd., Atsugi (JP)

(72) Inventors: Junichi Koezuka, Tochigi (JP); Kenichi Okazaki, Tochigi (JP); Yasuharu Hosaka, Tochigi (JP); Toshimitsu Obonai, Shimotsuke (JP); Yasutaka Nakazawa, Tochigi (JP); Seiji Yasumoto, Tochigi (JP); Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 124 days.

(21) Appl. No.: 17/262,793

(22) PCT Filed: Jul. 24, 2019

(86) PCT No.: PCT/IB2019/056307
§ 371 (c)(1),
(2) Date: Jan. 25, 2021

(87) PCT Pub. No.: WO2020/026081
PCT Pub. Date: Feb. 6, 2020

(65) Prior Publication Data
US 2021/0167212 A1 Jun. 3, 2021

(30) Foreign Application Priority Data

Aug. 3, 2018 (JP) .............................. JP2018-146787
Sep. 19, 2018 (JP) .............................. JP2018-175352
(Continued)

(51) Int. Cl.
*H01L 29/786* (2006.01)
*H01L 27/12* (2006.01)
(Continued)

(52) U.S. Cl.
CPC ...... *H01L 29/7869* (2013.01); *H01L 27/1225* (2013.01); *H01L 29/78603* (2013.01);
(Continued)

(58) Field of Classification Search
CPC ........ H05B 33/22; H05B 33/28; H05B 33/14; H01L 27/1225; H01L 27/11639;
(Continued)

(56) References Cited

U.S. PATENT DOCUMENTS

2013/0161608 A1 6/2013 Yamazaki
2013/0320334 A1 12/2013 Yamazaki et al.
(Continued)

FOREIGN PATENT DOCUMENTS

CN 107017210 A 8/2017
JP 2013-149965 A 8/2013
(Continued)

OTHER PUBLICATIONS

International Search Report (Application No. PCT/IB2019/056307) dated Oct. 29, 2019.
(Continued)

*Primary Examiner* — Nikolay K Yushin
(74) *Attorney, Agent, or Firm* — Robinson Intellectual Property Law Office; Eric J. Robinson

(57) ABSTRACT

A semiconductor device with favorable electrical characteristics is provided. A highly reliable semiconductor device is provided. A semiconductor device with stable electrical characteristics is provided. A semiconductor device includes a first insulating layer, a second insulating layer, a semiconductor layer, and a first conductive layer. The semiconductor layer, the second insulating layer, and the first conductive layer are stacked in this order over the first insulating layer. The second insulating layer has a stacked-layer structure in which a first insulating film, a second insulating film, and a
(Continued)

third insulating film are stacked in this order. The first insulating film, the second insulating film, and the third insulating film each contain an oxide. The first insulating film includes a portion in contact with the semiconductor layer. The semiconductor layer contains indium, gallium, and oxygen and includes a region with an indium content percentage higher than a gallium content percentage.

27 Claims, 41 Drawing Sheets

(30) Foreign Application Priority Data

Oct. 25, 2018 (JP) .............................. JP2018-201126
Mar. 27, 2019 (JP) .............................. JP2019-061174

(51) Int. Cl.
  *H01L 51/50* (2006.01)
  *H05B 33/22* (2006.01)

(52) U.S. Cl.
  CPC ........ *H01L 29/78696* (2013.01); *H01L 51/50* (2013.01); *H05B 33/22* (2013.01)

(58) Field of Classification Search
  CPC ......... H01L 27/11582; H01L 27/11565; H01L 27/11543; H01L 29/78648; H01L 29/78603; H01L 29/78696; H01L 29/4908; H01L 29/7869; H01L 51/0097; H01L 51/50; H01L 51/43123; H01L 51/4213

See application file for complete search history.

(56) References Cited

U.S. PATENT DOCUMENTS

| | | |
|---|---|---|
| 2014/0103335 A1 | 4/2014 | Yamazaki et al. |
| 2015/0263141 A1 | 9/2015 | Yamazaki et al. |
| 2017/0104090 A1 | 4/2017 | Koezuka et al. |
| 2017/0200829 A1 | 7/2017 | Watakabe et al. |

FOREIGN PATENT DOCUMENTS

| | | |
|---|---|---|
| JP | 2014-007399 A | 1/2014 |
| JP | 2014-099599 A | 5/2014 |
| JP | 2015-188079 A | 10/2015 |
| JP | 2017-076788 A | 4/2017 |
| JP | 2017-123427 A | 7/2017 |

OTHER PUBLICATIONS

Written Opinion (Application No. PCT/IB2019/056307) dated Oct. 29, 2019.

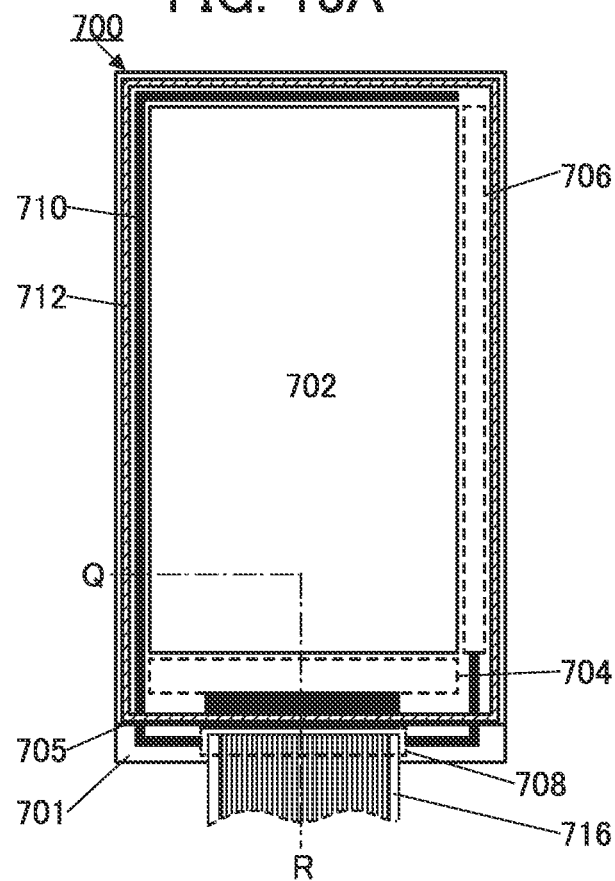
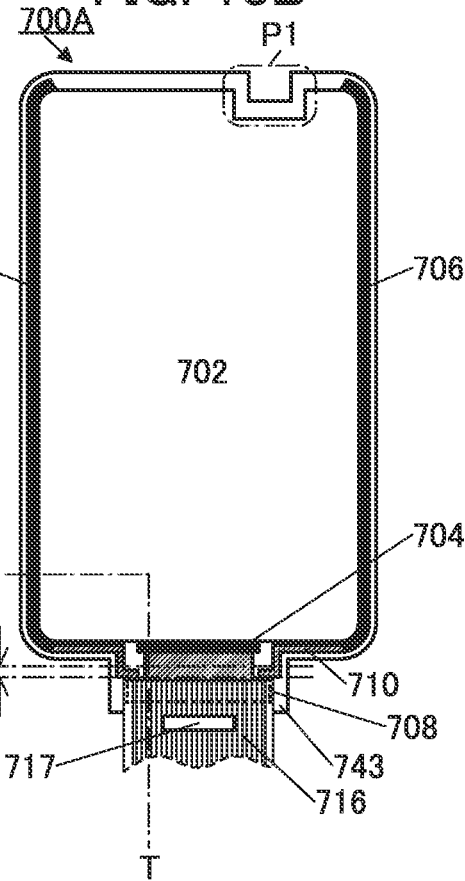
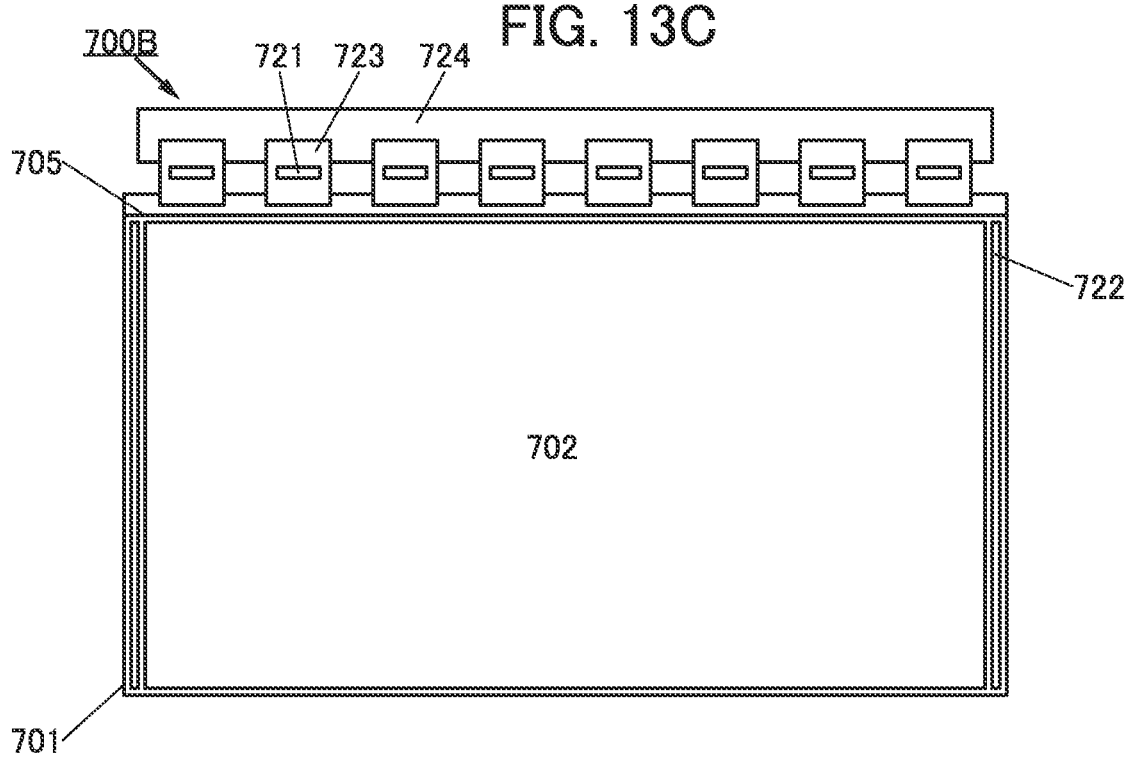

9100

9200

9101

9201

9102

9201

9201

Sample A1  IGZO(516)

Sample A2  IGZO(423)

Sample A3  IGZO(111)

Sample A4  IGZO(134)

Sample A5 IGZO(516) / IGZO(111)

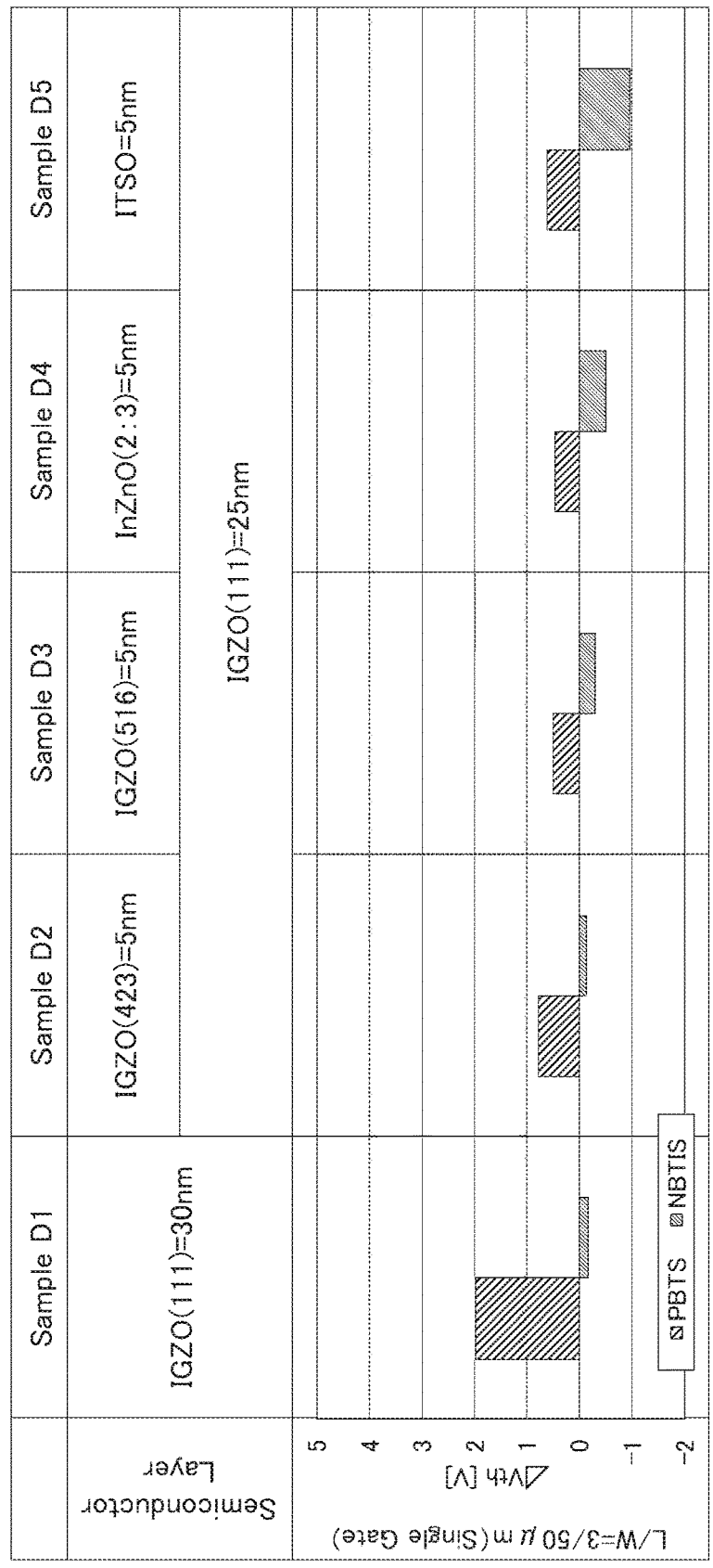
FIG. 30B Single Gate

Single Gate

Dual Gate

SEMICONDUCTOR DEVICE

TECHNICAL FIELD

One embodiment of the present invention relates to a semiconductor device and a method for manufacturing the semiconductor device. One embodiment of the present invention relates to a display device.

Note that one embodiment of the present invention is not limited to the above technical field. Examples of the technical field of one embodiment of the present invention disclosed in this specification and the like include a semiconductor device, a display device, a light-emitting device, a power storage device, a memory device, an electronic device, a lighting device, an input device, an input/output device, a driving method thereof, and a manufacturing method thereof. A semiconductor device generally means a device that can function by utilizing semiconductor characteristics.

BACKGROUND ART

As a semiconductor material applicable to a transistor, an oxide semiconductor containing a metal oxide has been attracting attention. For example, Patent Document 1 discloses a semiconductor device achieving high field-effect mobility (in some cases, simply referred to as mobility or µFE) with a structure where a plurality of oxide semiconductor layers are stacked, and among them, the oxide semiconductor layer serving as a channel contains indium and gallium and has a higher indium content than a gallium content.

A metal oxide that can be used for a semiconductor layer can be formed by a sputtering method or the like, and thus can be used for a semiconductor layer of a transistor in a large display device. In addition, capital investment can be reduced because part of production equipment for a transistor including polycrystalline silicon or amorphous silicon can be retrofitted and utilized. A transistor including a metal oxide has higher field-effect mobility than a transistor including amorphous silicon, and thus can achieve a high-performance display device with a driver circuit.

REFERENCE

Patent Document

[Patent Document 1] Japanese Published Patent Application No. 2014-007399

DISCLOSURE OF INVENTION

An object of one embodiment of the present invention is to provide a semiconductor device with favorable electrical characteristics. An object of one embodiment of the present invention is to provide a highly reliable semiconductor device. An object of one embodiment of the present invention is to provide a semiconductor device with stable electrical characteristics. An object of one embodiment of the present invention is to provide a highly reliable display device.

Note that the description of these objects does not preclude the existence of other objects. One embodiment of the present invention does not have to achieve all the objects. Note that other objects can be derived from the description of the specification, the drawings, the claims, and the like.

One embodiment of the present invention is a semiconductor device including a first insulating layer, a second insulating layer, a semiconductor layer, and a first conductive layer. The semiconductor layer, the second insulating layer, and the first conductive layer are stacked in this order over the first insulating layer. The second insulating layer has a stacked-layer structure in which a first insulating film, a second insulating film, and a third insulating film are stacked in this order. The first insulating film, the second insulating film, and the third insulating film each contain an oxide. The first insulating film includes a portion in contact with the semiconductor layer. The semiconductor layer contains indium and oxygen.

In the above, it is preferable that the semiconductor layer not contain gallium.

In the above, it is preferable that the semiconductor layer contain zinc.

Another embodiment of the present invention is a semiconductor device including a first insulating layer, a second insulating layer, a semiconductor layer, and a first conductive layer. The semiconductor layer, the second insulating layer, and the first conductive layer are stacked in this order over the first insulating layer. The second insulating layer has a stacked-layer structure in which a first insulating film, a second insulating film, and a third insulating film are stacked in this order. The first insulating film, the second insulating film, and the third insulating film each contain an oxide. The first insulating film includes a portion in contact with the semiconductor layer. The semiconductor layer contains indium, gallium, and oxygen and includes a region having an indium content percentage higher than a gallium content percentage.

In the above, it is preferable that the semiconductor layer contain zinc. In this case, it is preferable that the semiconductor layer include a region having a zinc content percentage higher than a gallium content percentage.

Another embodiment of the present invention is a semiconductor device including a first insulating layer, a second insulating layer, a first semiconductor layer, a second semiconductor layer, and a first conductive layer. The second semiconductor layer, the first semiconductor layer, the second insulating layer, and the first conductive layer are stacked in this order over the first insulating layer. The second insulating layer has a stacked-layer structure in which a first insulating film, a second insulating film, and a third insulating film are stacked in this order. The first insulating film, the second insulating film, and the third insulating film each contain an oxide.

The first insulating film includes a portion in contact with the first semiconductor layer. The first semiconductor layer contains indium and oxygen. The second semiconductor layer contains indium, zinc, gallium, and oxygen. The first semiconductor layer includes a region having a higher indium content percentage than the second semiconductor layer.

In the above, it is preferable that the first semiconductor layer contain zinc and gallium. It is preferable that the first semiconductor layer include a region having a gallium content percentage lower than an indium content percentage and a zinc content percentage higher than the gallium content percentage. It is preferable that the first semiconductor layer include a region having a zinc content percentage higher than or equal to a zinc content percentage of the second semiconductor layer.

In the above, it is preferable that a metal oxide layer be provided between the second insulating layer and the first conductive layer. In this case, it is preferable that the metal oxide layer contain one or more elements selected from aluminum, hafnium, indium, gallium, and zinc.

In particular, it is preferable that the metal oxide layer contain indium. Furthermore, it is preferable that the metal oxide layer and the first semiconductor layer have substantially the same indium content percentage.

In the above, it is preferable that the first insulating film be formed at a lower deposition rate than the second insulating film.

In the above, it is preferable that a second conductive layer be included and that a third insulating layer be included instead of the first insulating layer. In this case, it is preferable that the second conductive layer include a region overlapping with the first semiconductor layer with the third insulating layer therebetween and that the third insulating layer have a stacked-layer structure in which a fourth insulating film, a fifth insulating film, a sixth insulating film, and a seventh insulating film are stacked in this order. It is preferable that the seventh insulating film contain oxygen and that the fourth insulating film, the fifth insulating film, and the sixth insulating film each contain nitrogen.

In the above, it is preferable that the seventh insulating film contain silicon oxide and that the fourth insulating film, the fifth insulating film, and the sixth insulating film each contain silicon nitride.

With one embodiment of the present invention, a semiconductor device with favorable electrical characteristics can be provided. A highly reliable semiconductor device can be provided. A semiconductor device with stable electrical characteristics can be provided. A highly reliable display device can be provided.

Note that the description of these effects does not disturb the existence of other effects. One embodiment of the present invention does not necessarily achieve all the effects listed above. Other effects can be derived from the description of the specification, the drawings, the claims, and the like.

BRIEF DESCRIPTION OF DRAWINGS

In the accompanying drawings:

FIGS. 13A to 13C are top views of display devices;

FIG. 30B shows results of a reliability test of the transistors;

BEST MODE FOR CARRYING OUT THE INVENTION

Figure 1A:
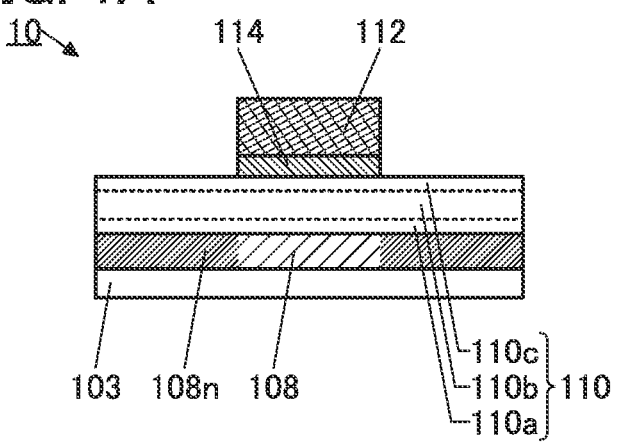
FIGS. 1A and 1B each illustrate a structure example of a transistor.

Hereinafter, embodiments will be described with reference to drawings. Note that embodiments can be implemented in many different modes, and it will be readily understood by those skilled in the art that modes and details thereof can be changed in various ways without departing from the spirit and scope of the present invention. Thus, the present invention should not be interpreted as being limited to the following description of the embodiments.

In each drawing described in this specification, the size, the layer thickness, or the region of each component is sometimes exaggerated for clarity.

In this specification and the like, ordinal numbers such as first, second, and third are used in order to avoid confusion among components, and the terms do not limit the components numerically.

In this specification and the like, terms for describing arrangement, such as "over", "above", "under", and "below", are used for convenience in describing a positional relationship between components with reference to drawings. Furthermore, the positional relationship between components changes as appropriate in accordance with the direction in which each component is described. Thus, terms for the description are not limited to those used in this specification, and description can be made appropriately depending on the situation.

In this specification and the like, functions of a source and a drain of a transistor are sometimes replaced with each other when a transistor of opposite polarity is used or when the direction of current flow is changed in circuit operation, for example. Therefore, the terms source and drain can be used interchangeably.

Note that in this specification and the like, the channel length direction of a transistor refers to one of directions parallel to the shortest straight line connecting a source region and a drain region. That is, the channel length direction corresponds to one of directions of current flow in a semiconductor layer when a transistor is in an on state. The channel width direction refers to a direction orthogonal to the channel length direction. Each of the channel length direction and the channel width direction is not fixed to one direction in some cases depending on the structure and the shape of a transistor.

In this specification and the like, the term "electrically connected" includes the case where components are connected through an "object having any electric function". There is no particular limitation on an "object having any electric function" as long as electric signals can be transmitted and received between components that are connected through the object. Examples of the "object having any electric function" are a switching element such as a transistor, a resistor, an inductor, a capacitor, and an element with a variety of functions as well as an electrode and a wiring.

In this specification and the like, the terms "film" and "layer" can be interchanged with each other. For example, in some cases, the terms "conductive layer" and "insulating layer" can be changed into "conductive film" and "insulating film", respectively.

Unless otherwise specified, off-state current in this specification and the like refers to drain current of a transistor in an off state (also referred to as non-conducting state or cutoff state). Unless otherwise specified, the off state of an n-channel transistor means that the voltage between a gate and a source ($V_g$s) is lower than the threshold voltage (Vth), and the off state of a p-channel transistor means that $V_g$s is higher than Vth.

In this specification and the like, a display panel that is one embodiment of the display device has a function of displaying (outputting) an image or the like on (to) a display surface. Thus, the display panel is one embodiment of an output device.

In this specification and the like, a structure in which a connector such as a flexible printed circuit (FPC) or a tape carrier package (TCP) is attached to a substrate of a display panel, or a structure in which an integrated circuit (IC) is mounted on a substrate by a chip on glass (COG) method or the like is referred to as a display panel module or a display module, or simply referred to as a display panel or the like in some cases.

Note that in this specification and the like, a touch panel that is one embodiment of the display device has a function of displaying an image or the like on a display surface and a function as a touch sensor capable of sensing contact, press, approach, or the like of an object such as a finger or a stylus with, on, or to the display surface. Therefore, the touch panel is one embodiment of an input/output device.

A touch panel can be referred to as, for example, a display panel (or a display device) with a touch sensor or a display panel (or a display device) with a touch sensor function. A touch panel can include a display panel and a touch sensor panel. Alternatively, a touch panel can have a function of a touch sensor inside a display panel or on a surface of the display panel.

In this specification and the like, a structure in which a connector or an IC is attached to a substrate of a touch panel is referred to as a touch panel module or a display module, or simply referred to as a touch panel or the like in some cases.

Embodiment 1

In this embodiment, a semiconductor device of one embodiment of the present invention and a method for manufacturing the semiconductor device will be described. Particularly in this embodiment, as an example of the semiconductor device, a transistor including an oxide semiconductor for a semiconductor layer in which a channel is formed will be described.

STRUCTURE EXAMPLE 1

Structure Example 1-1

FIG. 1A is a schematic cross-sectional view of a transistor 10 in the channel length direction.

The transistor 10 includes an insulating layer 103, a semiconductor layer 108, an insulating layer 110, a metal oxide layer 114, and a conductive layer 112. The insulating layer 110 functions as a gate insulating layer. The conductive layer 112 functions as a gate electrode.

The conductive layer 112 is preferably formed using a conductive film containing a metal or an alloy, in which case electric resistance can be reduced. Note that a conductive film containing an oxide may be used as the conductive layer 112.

The metal oxide layer 114 has a function of supplying oxygen to the insulating layer 110. In the case where a conductive film containing a metal or an alloy that is easily oxidized is used as the conductive layer 112, the metal oxide layer 114 can also function as a barrier layer that prevents oxidation of the conductive layer 112 by oxygen in the insulating layer 110. Note that the metal oxide layer 114 may be removed before formation of the conductive layer 112 so that the conductive layer 112 and the insulating layer 110 are in contact with each other.

The insulating layer 103 is preferably formed using an insulating film containing an oxide. It is particularly preferable to use an oxide film for a portion in contact with the semiconductor layer 108.

The semiconductor layer 108 contains a metal oxide exhibiting semiconductor characteristics (hereinafter also referred to as an oxide semiconductor). The semiconductor layer 108 preferably contains at least indium and oxygen. When an oxide of indium is contained in the semiconductor layer 108, carrier mobility can be increased. For example, a transistor which can flow larger current than a transistor using amorphous silicon can be provided.

A region of the semiconductor layer 108 overlapping with the conductive layer 112 functions as a channel formation region. Furthermore, the semiconductor layer 108 preferably includes a pair of low-resistance regions 108$n$ with the channel formation region therebetween.

The low-resistance regions 108$n$ each have higher carrier concentration than the channel formation region and function as a source region and a drain region.

The low-resistance regions 108$n$ can also be referred to as regions having lower resistance, regions having a higher carrier concentration, regions having a larger amount of oxygen vacancies, regions having a higher hydrogen concentration, or regions having a higher impurity concentration than the channel formation region.

The insulating layer 110 has a stacked-layer structure in which an insulating film 110a, an insulating film 110b, and an insulating film 110c are stacked in this order from the insulating layer 103 side. The insulating film 110a includes a region in contact with the channel formation region of the semiconductor layer 108. The insulating film 110c includes a region in contact with the metal oxide layer 114. The insulating film 110b is positioned between the insulating film 110a and the insulating film 110c.

Each of the insulating films 110a, 110b, and 110c is preferably an insulating film containing an oxide. In this case, it is preferable that the insulating film 110a, the insulating film 110b, and the insulating film 110c be successively formed in one deposition apparatus.

As each of the insulating films 110a, 110b, and 110c, for example, an insulating layer including at least one of the following films can be used: a silicon oxide film, a silicon oxynitride film, a silicon nitride oxide film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film.

The insulating layer 110 in contact with the semiconductor layer 108 preferably has a stacked-layer structure of oxide insulating films. The insulating layer 110 further preferably includes a region containing oxygen in excess of the stoichiometric composition. In other words, the insulating layer 110 includes an insulating film capable of releasing oxygen. For example, the insulating layer 110 is formed in an oxygen atmosphere, the formed insulating layer 110 is subjected to heat treatment, plasma treatment, or the like in an oxygen atmosphere, or an oxide film is formed over the insulating layer 110 in an oxygen atmosphere, so that oxygen can be supplied to the insulating layer 110.

For example, each of the insulating films 110a, 110b, and 110c can be formed by any of a sputtering method, a chemical vapor deposition (CVD) method, a vacuum evaporation method, a pulsed laser deposition (PLD) method, an atomic layer deposition (ALD) method, and the like. As a CVD method, a plasma-enhanced chemical vapor deposition (PECVD) method or a thermal CVD method can be used.

In particular, the insulating film 110a, the insulating film 110b, and the insulating film 110c are preferably formed by a PECVD method.

The insulating film 110a is formed over the semiconductor layer 108, and thus is preferably formed under conditions where the semiconductor layer 108 is damaged as little as possible. For example, the insulating film 110a can be formed under conditions where the deposition rate is sufficiently low.

For example, when a silicon oxynitride film is formed as the insulating film 110a by a PECVD method, damage to the semiconductor layer 108 can be extremely small by low-power film formation.

For a formation gas used for forming a silicon oxynitride film, for example, a source gas of a deposition gas containing silicon, such as silane or disilane, and an oxidation gas such as oxygen, ozone, dinitrogen monoxide, or nitrogen dioxide can be used. In addition to the source gas, a dilution gas such as argon, helium, or nitrogen may also be contained.

For example, when the proportion of flow rate of the deposition gas to the total flow rate of the formation gas (hereinafter, also simply referred to as flow rate ratio) is reduced, the deposition rate can be low and a dense film with few defects can be formed.

The insulating film 110b is preferably formed under conditions where the deposition rate is higher than that of the insulating film 110a. The productivity can be thus increased.

For example, the insulating film 110b can be formed at an increased deposition rate by setting the flow rate ratio of the deposition gas to be higher than that of the insulating film 110a.

The insulating film 110c is preferably an extremely dense film in which defects in its surface are reduced and impurities included in the air, such as water, are hardly adsorbed. For example, like the insulating film 110a, the insulating film 110c can be formed at a sufficiently low deposition rate.

Since the insulating film 110c is formed over the insulating film 110b, the formation of the insulating film 110c affects the semiconductor layer 108 less than the formation of the insulating film 110a. Thus, the insulating film 110c can be formed with a higher power than the insulating film 110a. The reduced flow rate ratio of the deposition gas and the relatively high-power film formation enable formation of a dense film in which defects in its surface are reduced.

That is, the insulating layer 110 can be formed using a stacked-layer film formed under conditions where the deposition rate of the insulating film 110b is the highest, that of the insulating film 110a is the second highest, and that of the insulating film 110c is the lowest. In the insulating layer 110, the etching rate of the insulating layer 110b is the highest, that of the insulating film 110a is the second highest, and that of the insulating film 110c is the lowest when wet etching or dry etching is performed under the same condition.

The insulating film 110b is preferably formed to be thicker than the insulating film 110a and the insulating film 110c. The time taken for forming the insulating layer 110 can be shortened by forming the insulating film 110b, which is formed at the highest deposition rate, to be thick.

Here, a boundary between the insulating film 110a and the insulating film 110b and a boundary between the insulating film 110b and the insulating film 110c are unclear in some cases; thus, the boundaries are denoted by dashed lines in FIG. 1A and the like. Note that since the insulating film 110a and the insulating film 110b have different film densities, the boundary between the insulating film 110a and the insulating film 110b can be sometimes found from difference in contrast in a cross-sectional image of the insulating layer 110 obtained with a transmission electron microscope (TEM). Similarly, the boundary between the insulating film 110b and the insulating film 110c can be found from difference in contrast in some cases.

Here, the composition of the semiconductor layer 108 is described. The semiconductor layer 108 preferably contains a metal oxide containing at least indium and oxygen. In addition, the semiconductor layer 108 may contain zinc. The semiconductor layer 108 may contain gallium.

Typically, an indium oxide, an indium zinc oxide (In—Zn oxide), an indium gallium zinc oxide (also denoted as In—Ga—Zn oxide or IGZO), or the like can be used for the semiconductor layer 108. Alternatively, an indium tin oxide (In—Sn oxide), an indium tin oxide containing silicon, or the like can be used. The material that can be used for the semiconductor layer 108 is described in detail later.

Here, the composition of the semiconductor layer 108 greatly affects the electrical characteristics and reliability of the transistor 10. For example, an increase in the indium content in the semiconductor layer 108 can increase the carrier mobility and achieve a transistor with high field-effect mobility.

Here, one of indexes for evaluating the reliability of a transistor is a gate bias-temperature stress (GBT) test in which an electric field applied to a gate is retained. A GBT test includes a positive bias-temperature stress (PBTS) test in which a positive potential with respect to a source potential and a drain potential is supplied to a gate and retained at a high temperature and a negative bias-temperature stress (NBTS) test in which a negative potential is supplied to a gate and retained at a high temperature. A PBTS test with light from a white light-emitting diode (LED) or the like is referred to as a positive bias-temperature illumination stress (PBTIS) test, while an NBTS test with light from a white LED or the like is referred to as a negative bias-temperature illumination stress (NBTIS) test.

Particularly in an n-channel transistor including an oxide semiconductor, a positive potential is supplied to a gate when the transistor becomes an on state (a state in which a current flows); thus, the amount of change in the threshold voltage in a PBTS test is one of important indexes to be focused on as a reliability indicator of the transistor.

Here, a metal oxide film that does not contain gallium or has a low gallium content percentage is used as the semiconductor layer 108, whereby the amount of change in the threshold voltage in a PBTS test can be reduced. In the case where gallium is contained, the gallium content is preferably smaller than the indium content in the semiconductor layer 108. A highly reliable transistor can be thus provided.

One of the factors in change in the threshold voltage in the PBTS test is a defect state at the interface between a semiconductor layer and a gate insulating layer or in the vicinity of the interface. As the density of defect states increases, degradation in the PBTS test becomes significant. Generation of the defect states can be suppressed by reducing the gallium content in a portion of the semiconductor layer in contact with the gate insulating layer.

The following can be given as the reason why degradation in the PBTS test can be suppressed when the semiconductor layer 108 does not contain gallium or has a small gallium content, for example. Gallium contained in the semiconductor layer 108 more easily attracts oxygen than another metal element (e.g., indium or zinc). Therefore, when, at the interface between a metal oxide film containing a large amount of gallium and the insulating layer 110 containing an oxide, gallium is bonded to excess oxygen in the insulating layer 110, trap sites of carriers (here, electrons) are likely to be generated easily. This might cause the change in the threshold voltage when a positive potential is supplied to a gate and carriers are trapped at the interface between the semiconductor layer and the gate insulating layer.

Specifically, in the case where an In—Ga—Zn oxide is used for the semiconductor layer 108, a metal oxide film whose atomic proportion of In is higher than that of Ga can be used as the semiconductor layer 108. It is further preferable to use a metal oxide film whose atomic proportion of Zn is higher than that of Ga. In other words, a metal oxide film in which the atomic proportions of metal elements satisfy both relationships In>Ga and Zn>Ga is preferably used as the semiconductor layer 108.

For example, a metal oxide film that has any of the following atomic ratios of metal elements can be used as the semiconductor layer 108: In:Ga:Zn=2:1:3, In:Ga:Zn=3:1:2, In:Ga:Zn =4:2:3, In:Ga:Zn=4:2:4.1, In:Ga:Zn=5:1:6, In:Ga:Zn=5:1:7, In:Ga:Zn=5:1:8, In:Ga:Zn=6:1:6, In:Ga:Zn=5:2:5, and a neighborhood thereof.

In the case where a metal oxide film containing indium and gallium is used as the semiconductor layer 108, the proportion (atomic proportion) of gallium atoms to atoms of metal elements contained in the metal oxide can be higher than 0 and lower than 50%, preferably higher than or equal to 0.05% and lower than or equal to 30%, further preferably higher than or equal to 0.1% and lower than or equal to 15%, still further preferably higher than or equal to 0.1% and lower than or equal to 5%. Note that oxygen vacancies are less likely to be generated when the semiconductor layer 108 contains gallium.

A metal oxide film not containing gallium may be used as the semiconductor layer 108. For example, an In—Zn oxide can be used for the semiconductor layer 108. In this case, when the atomic proportion of In to metal elements contained in the metal oxide film is increased, the field-effect mobility of the transistor can be increased. In contrast, when the atomic proportion of Zn to metal elements contained in the metal oxide is increased, the metal oxide film has high crystallinity; thus, a change in the electrical characteristics of the transistor can be suppressed and the reliability can be increased. Alternatively, a metal oxide film that contains neither gallium nor zinc, such as indium oxide, can be used as the semiconductor layer 108. The use of a metal oxide film not containing gallium can make a change in the threshold voltage particularly in the PBTS test extremely small.

In the transistor 10 of one embodiment of the present invention, a metal oxide film that has a small gallium content or does not contain gallium is used as the semiconductor layer 108, and a film formed by a deposition method in which damage to the semiconductor layer 108 is reduced is used as the insulating film 110*a* in contact with a top surface of the semiconductor layer 108. Therefore, the density of defect states at the interface between the semiconductor layer 108 and the insulating layer 110 is reduced and the transistor 10 can thus have high reliability.

Although the case of using gallium is described as an example, the same applies in the case where an element M (M is one or more of aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium) is used instead of gallium. In particular, M is preferably one or more of gallium, aluminum, yttrium, and tin.

In particular, a metal oxide film that has an atomic proportion of In higher than that of the element M is preferably used as the semiconductor layer 108. Furthermore, a metal oxide film that has an atomic proportion of Zn higher than that of the element M is preferably used.

It is preferable to use a metal oxide film having crystallinity as the semiconductor layer 108. For example, a metal oxide film having a c-axis aligned crystal (CAAC) structure, which is described later, a polycrystalline structure, a microcrystalline structure, or the like can be used. By using a metal oxide film having crystallinity as the semiconductor layer 108, the density of defect states in the semiconductor layer 108 can be reduced, which enables the semiconductor device to have high reliability.

As the semiconductor layer 108 has higher crystallinity, the density of defect states in the film can be smaller. In contrast, the use of a metal oxide film with low crystallinity enables a transistor to flow large current.

In the case where a metal oxide film is formed by a sputtering method, the crystallinity of the metal oxide film can be increased as the substrate temperature (the stage temperature) in film formation is higher. The crystallinity of the metal oxide film can be increased as the proportion of a flow rate of an oxygen gas to the whole formation gas (also referred to as oxygen flow rate ratio) used in film formation is higher.

Structure Example 1-2

Figure 1B:
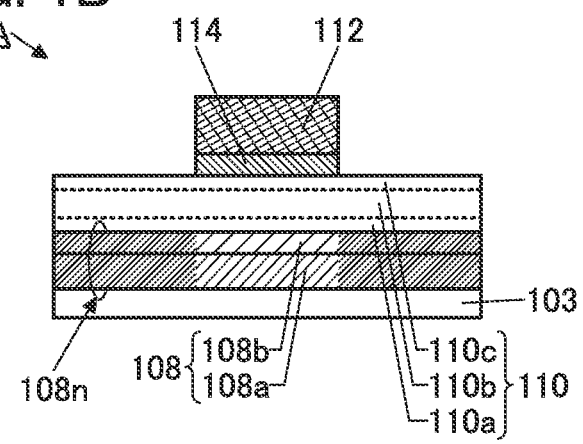

FIG. 1B is a schematic cross-sectional view of a transistor 10A. The transistor 10A is different from the transistor 10 mainly in the structure of the semiconductor layer 108.

The semiconductor layer 108 included in the transistor 10A has a stacked-layer structure in which a semiconductor layer 108a and a semiconductor layer 108b are stacked in this order from the insulating layer 103 side. A metal oxide film is preferably used as each of the semiconductor layers 108a and 108b.

Note that for simplicity, a low-resistance region included in the semiconductor layer 108a and a low-resistance region included in the semiconductor layer 108b are collectively referred to as the low-resistance region 108n and denoted by the same hatching pattern. The semiconductor layer 108a and the semiconductor layer 108b actually have different compositions; therefore, the low-resistance region 108n in the semiconductor layer 108a and the low-resistance region 108n in the semiconductor layer 108b have different electric resistances, carrier concentrations, amounts of oxygen vacancies, hydrogen concentrations, impurity concentrations, or the like in some cases.

The semiconductor layer 108b is in contact with a top surface of the semiconductor layer 108a and a bottom surface of the insulating film 110a. It is possible to use the metal oxide film that is described in Structure Example 1-1 and can be used as the semiconductor layer 108 for the semiconductor layer 108b.

Meanwhile, a metal oxide film that has a higher atomic proportion of gallium than the semiconductor layer 108b can be used as the semiconductor layer 108a.

Gallium has a higher bonding strength with oxygen than indium; therefore, when a metal oxide film having a high atomic proportion of gallium is used as the semiconductor layer 108a, oxygen vacancies are less likely to be formed. Many oxygen vacancies in the semiconductor layer 108a lead to a reduction in electrical characteristics and reliability of the transistor. Therefore, when a metal oxide film that has a higher atomic proportion of gallium than the semiconductor layer 108b is used as the semiconductor layer 108a, the transistor 10A can have favorable electrical characteristics and high reliability.

Specifically, the semiconductor layer 108a can be favorably formed using a metal oxide film that contains indium, gallium, and zinc, and includes a region that has a higher atomic proportion of gallium and a lower atomic proportion of indium than the semiconductor layer 108b. In other words, the semiconductor layer 108b can be formed using a metal oxide film that includes a region having a higher atomic proportion of indium and a lower atomic proportion of gallium than the semiconductor layer 108a.

It is preferable to use, as the semiconductor layer 108a, a metal oxide film that includes a region having an atomic proportion of zinc lower than or equal to an atomic proportion of zinc in the semiconductor layer 108b.

For example, a metal oxide film that has any of the following atomic ratios of metal elements can be used as the semiconductor layer 108a: In:Ga:Zn=1:1:1, In:Ga:Zn=1:3:2, In:Ga:Zn=1:3:4, In:Ga:Zn=1:3:6, In:Ga:Zn=2:2:1, and a neighborhood thereof.

Typically, it is preferable to use a metal oxide film that has an atomic ratio of metal elements of In:Ga:Zn=1:1:1 or a neighborhood thereof as the semiconductor layer 108a, and to use a metal oxide film that has an atomic ratio of metal elements of In:Ga:Zn=4:2:3, 5:1:6, or a neighborhood thereof as the semiconductor layer 108b.

When a metal oxide film in which oxygen vacancies are less likely to be generated is used as the semiconductor layer 108a, degradation in the above-described NBTIS test can be reduced.

A metal oxide film that has a relatively high gallium content percentage is used as the semiconductor layer 108a positioned on the insulating layer 103 side in the transistor 10A illustrated in FIG. 1B, whereby oxygen vacancies in the semiconductor layer 108 is reduced. Furthermore, a metal oxide film that has a low gallium content percentage or does not contain gallium is used as the semiconductor layer 108b positioned on the insulating layer 110 side, whereby the defect density of the interface between the semiconductor layer 108 and the insulating layer 110 is reduced. Therefore, the transistor 10A has both extremely high electrical characteristics and extremely high reliability.

Here, the semiconductor layer 108b is preferably formed thinner than the semiconductor layer 108a. Even when the semiconductor layer 108b is as extremely thin as 0.5 nm or more and 10 nm or less, for example, the defect density of the interface with the insulating layer 110 can be reduced. In contrast, the semiconductor layer 108a in which oxygen vacancies are less likely to be generated is made to be relatively thick, whereby a transistor with higher reliability can be provided.

For example, the thickness of the semiconductor layer 108a can be 1.5 to 20 times, preferably 2 to 15 times, further preferably 3 to 10 times the thickness of the semiconductor layer 108b. The thickness of the oxide semiconductor layer 108b is preferably greater than or equal to 0.5 nm and less than or equal to 30 nm, further preferably greater than or equal to 1 nm and less than or equal to 20 nm, still further preferably greater than or equal to 2 nm and less than or equal to 10 nm.

It is preferable to use the above-described metal oxide film having crystallinity as each of the semiconductor layer 108a and the semiconductor layer 108b. A metal oxide film having high crystallinity or a metal oxide film having low crystallinity may be used as both the semiconductor layer 108a and the semiconductor layer 108b. Alternatively, the semiconductor layer 108a and the oxide semiconductor layer 108b may have different crystallinities. For example, the semiconductor layer 108a may have higher crystallinity than the semiconductor layer 108b, or the semiconductor layer 108b may have higher crystallinity than the semiconductor layer 108a. The crystallinity of the metal oxide film used as each of the semiconductor layer 108a and the semiconductor layer 108b can be determined on the basis of the required electrical characteristics and reliability of the transistor and specifications of a deposition apparatus or the like.

Structure Example 1-3

Figure 2A:
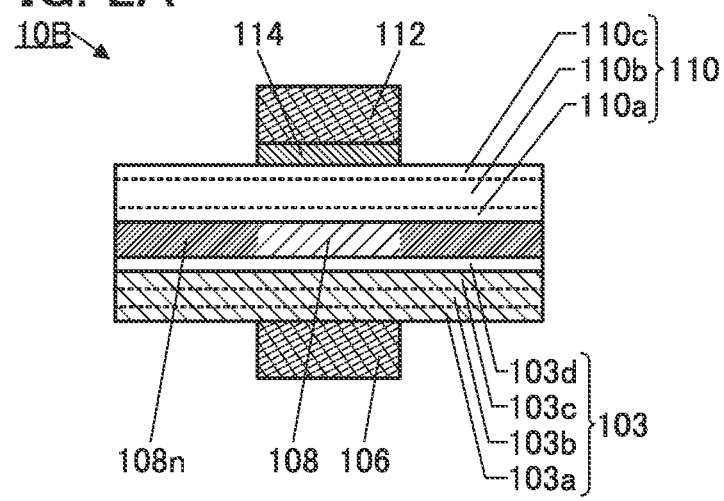
FIGS. 2A and 2B each illustrate a structure example of a transistor.

FIG. 2A is a schematic cross-sectional view of a transistor 10B. The transistor 10B is different from the transistor 10 mainly in the structure of the insulating layer 103 and the existence of a conductive layer 106.

The conductive layer 106 includes a region overlapping with the semiconductor layer 108, the insulating layer 110, the metal oxide layer 114, and the conductive layer 112 with the insulating layer 103 therebetween. The conductive layer 106 functions as a first gate electrode (also referred to as a back gate electrode). The insulating layer 103 functions as a first gate insulating layer. In this case, the conductive layer 112 functions as a second gate electrode, and the insulating layer 110 functions as a second gate insulating layer.

For example, when the same potential is supplied to the conductive layer 112 and the conductive layer 106, the amount of current that can flow in the transistor 10B in an on state can be increased. Furthermore, in the transistor 10B, it is possible that a potential for controlling the threshold voltage is supplied to one of the conductive layer 112 and the conductive layer 106, and that a potential for controlling an on/off state of the transistor 10B is supplied to the other of the conductive layer 112 and the conductive layer 106.

The insulating layer 103 has a stacked-layer structure in which an insulating film 103a, an insulating film 103b, an insulating film 103c, and an insulating film 103d are stacked from the conductive layer 106 side. The insulating film 103a is in contact with the conductive layer 106. The insulating film 103d is in contact with the semiconductor layer 108.

The insulating layer 103 functioning as the second gate insulating layer preferably satisfies at least one of the following characteristics, further preferably satisfies all of the following characteristics: high withstand voltage, low stress, unlikeliness of releasing hydrogen and water, a small number of defects, and prevention of diffusion of metal elements contained in the conductive layer 106.

Among the four insulating films included in the insulating layer 103, the insulating films 103a, 103b, and 103c positioned on the conductive layer 106 side are each preferably formed using an insulating film containing nitrogen. In contrast, the insulating film 103d in contact with the semiconductor layer 108 is preferably formed using an insulating film containing oxygen. The four insulating films included in the insulating layer 103 are preferably formed successively without exposure to the air with a plasma CVD apparatus.

As each of the insulating films 103a, 103b, and 103c, an insulating film containing nitrogen, such as a silicon nitride film, a silicon nitride oxide film, an aluminum nitride film, or a hafnium nitride film can be used, for example. Furthermore, as the insulating film 103c, an insulating film that can be used as the insulating layer 110 can also be used.

The insulating film 103a and the insulating film 103c are preferably dense films that can prevent diffusion of impurities from the layers below. It is preferable that the insulating film 103a be able to block a metal element contained in the conductive layer 106 and that the insulating film 103c be able to block hydrogen and water contained in the insulating film 103b. Thus, an insulating film that is formed at a lower deposition rate than the insulating film 103b can be used as each of the insulating film 103a and the insulating film 103c.

In contrast, it is preferable that the insulating film 103b be formed using an insulating film having low stress and being formed at a high deposition rate. The insulating film 103b is preferably thicker than the insulating film 103a and the insulating film 103c.

For example, in the case where silicon nitride films formed by a PECVD method are used as the insulating films 103a, 103b, and 103c, the film density of the insulating film 103b is smaller than the film densities of the other two insulating films. Thus, in a transmission electron microscope image of a cross section of the insulating layer 103, difference in contrast is observed and thus these films can be distinguished from each other in some cases. Since a boundary between the insulating film 103a and the insulating film 103b and a boundary between the insulating film 103b and the insulating film 103c are unclear in some cases, the boundaries are denoted by dashed lines in FIG. 2A and the like.

As the insulating film 103d in contact with the semiconductor layer 108, it is preferable to use a dense insulating film on a surface of which an impurity such as water is less likely to be adsorbed. In addition, it is preferable to use an insulating film which includes as few defects as possible and in which impurities such as water and hydrogen are reduced. For example, an insulating film similar to the insulating film 110c included in the insulating layer 110 can be used as the insulating film 103d.

For example, in the case where a metal film or an alloy film whose constituent element is less likely to be diffused into the insulating layer 103 is used as the conductive layer 106, a structure may be employed in which the insulating film 103a is not provided and the three insulating films of the insulating film 103b, the insulating film 103c, and the insulating film 103d are stacked.

With the insulating layer 103 having such a stacked-layer structure, the transistor can have extremely high reliability.

Structure Example 1-4

Figure 2B:
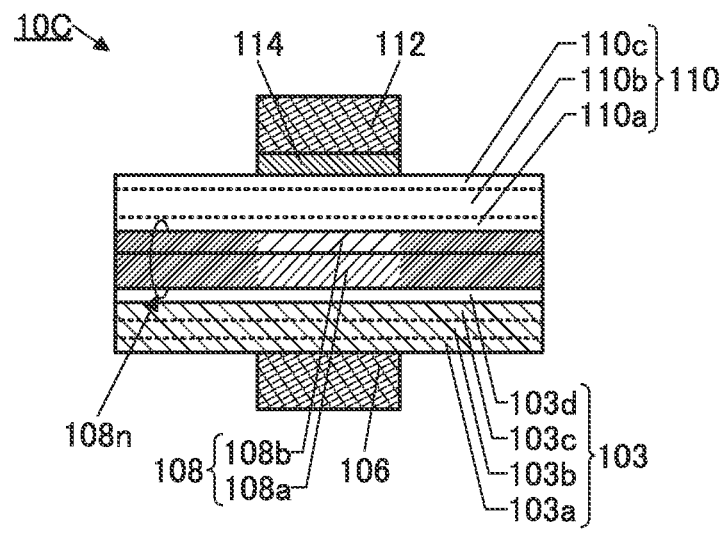

FIG. 2B is a schematic cross-sectional view of a transistor 10C. The transistor 10C is an example in which the conductive layer 106 and the insulating layer 103, which are included in the transistor 10B described in Structure Example 1-3, are added to the transistor 10A described in Structure Example 1-2.

With such a structure, a transistor that has favorable electrical characteristics and extremely high reliability can be provided.

Structure Example 2

Hereinafter, a more specific structure example of a transistor is described.

Structure Example 2-1

Figure 3A:
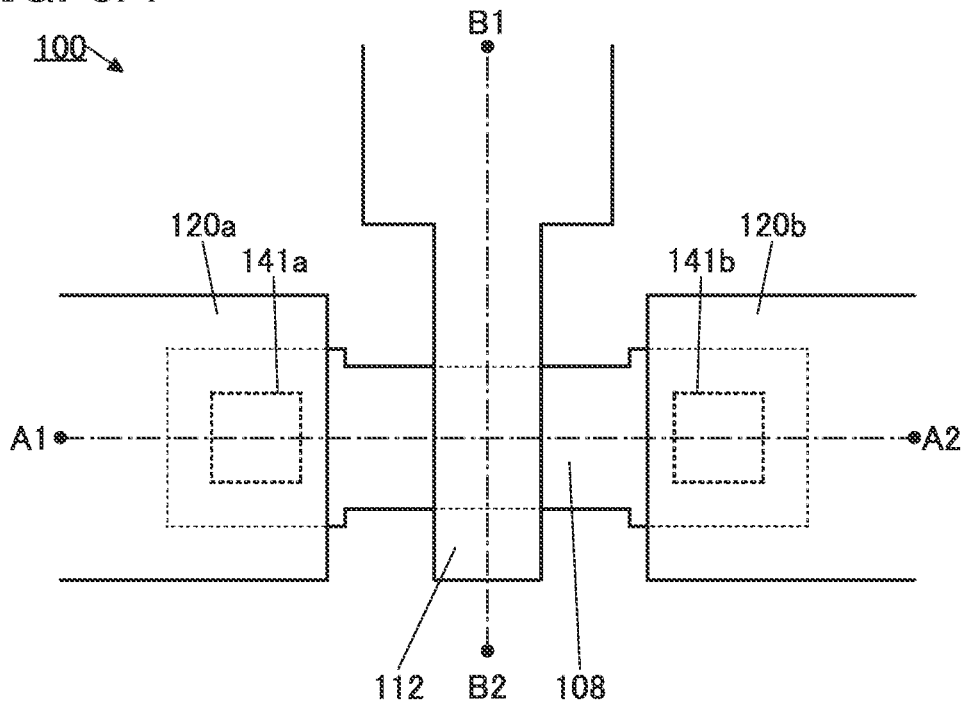
FIGS. 3A to 3C illustrate a structure example of a transistor.
Figure 3B:
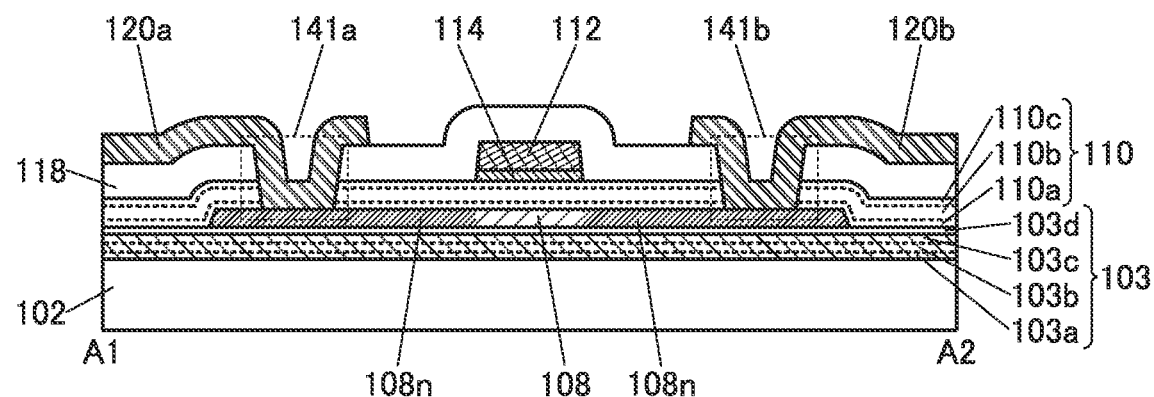
Figure 3C:
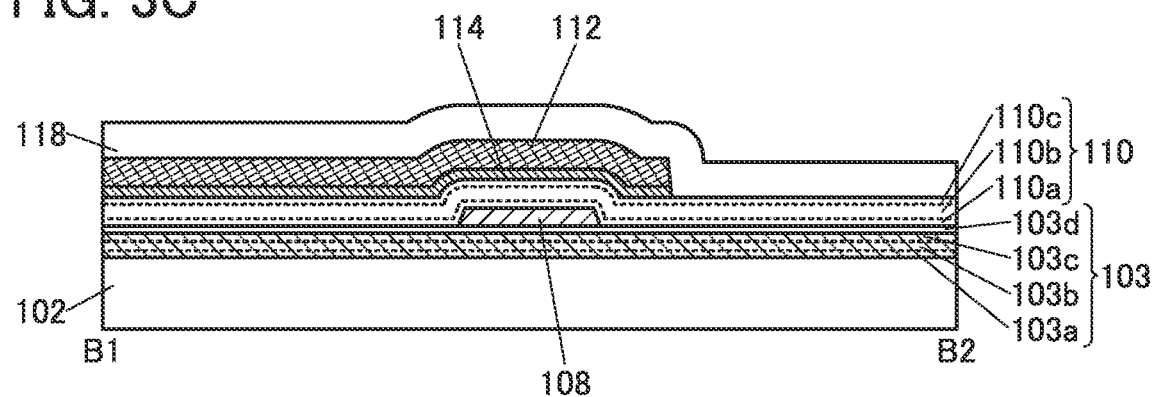

FIG. 3A is a top view of a transistor 100. FIG. 3B is a cross-sectional view taken along dashed-dotted line A1-A2 in FIG. 3A. FIG. 3C is a cross-sectional view taken along dashed-dotted line B1-B2 in FIG. 3A. Note that in FIG. 3A, some components of the transistor 100 (e.g., a gate insulating layer) are not illustrated. The direction of the dashed-dotted line A1-A2 corresponds to a channel length direction, and the direction of the dashed-dotted line B1-B2 corresponds to a channel width direction. As in FIG. 3A, some components are not illustrated in top views of transistors described below.

The transistor 100 is provided over a substrate 102 and includes the insulating layer 103, the semiconductor layer 108, the insulating layer 110, the metal oxide layer 114, the conductive layer 112, an insulating layer 118, and the like. The island-shaped semiconductor layer 108 is provided over the insulating layer 103. The insulating layer 110 is provided in contact with a top surface of the insulating layer 103 and top and side surfaces of the semiconductor layer 108. The metal oxide layer 114 and the conductive layer 112 are stacked in this order over the insulating layer 110 and include portions overlapping with the semiconductor layer 108. The insulating layer 118 is provided to cover a top surface of the insulating layer 110, a side surface of the metal oxide layer 114, and a top surface of the conductive layer 112.

The insulating layer 103 has the stacked-layer structure in which the insulating film 103a, the insulating film 103b, the insulating film 103c, and the insulating film 103d are stacked from the substrate 102 side. The insulating layer 110 has the stacked-layer structure in which the insulating film 110a, the insulating film 110b, and the insulating film 110c are stacked from the semiconductor layer 108 side.

As illustrated in FIGS. 3A and 3B, the transistor 100 may include a conductive layer 120a and a conductive layer 120b over the insulating layer 118. The conductive layers 120a and 120b function as a source electrode and a drain electrode. The conductive layers 120a and 120b are electrically connected to the low-resistance regions 108n through openings 141a and 141b provided in the insulating layer 118 and the insulating layer 110.

Part of the conductive layer 112 functions as a gate electrode. Part of the insulating layer 110 functions as a gate insulating layer. The transistor 100 is what is called a top-gate transistor in which the gate electrode is provided over the semiconductor layer 108.

The conductive layer 112 and the metal oxide layer 114 are processed so as to have substantially the same top surface shapes.

Note that in this specification and the like, the expression "having substantially the same top surface shapes" means that at least outlines of stacked layers partly overlap with each other. For example, the case of patterning or partly patterning an upper layer and a lower layer with the use of the same mask pattern is included in the expression. The expression "having substantially the same top surface shapes" also includes the case where the outlines do not completely overlap with each other; for instance, the edge of the upper layer may be positioned on the inner side or the outer side of the edge of the lower layer.

The metal oxide layer 114 positioned between the insulating layer 110 and the conductive layer 112 functions as a barrier film that prevents diffusion of oxygen contained in the insulating layer 110 into the conductive layer 112 side. Furthermore, the metal oxide layer 114 also functions as a barrier film that prevents diffusion of hydrogen and water contained in the conductive layer 112 into the insulating layer 110 side. The metal oxide layer 114 is preferably formed using a material that is less permeable to oxygen and hydrogen than at least the insulating layer 110, for example.

Even in the case where a metal material that is likely to absorb oxygen, such as aluminum or copper, is used for the conductive layer 112, the metal oxide layer 114 can prevent diffusion of oxygen from the insulating layer 110 to the conductive layer 112. Furthermore, even in the case where the conductive layer 112 contains hydrogen, diffusion of hydrogen from the conductive layer 112 to the semiconductor layer 108 through the insulating layer 110 can be prevented. Consequently, the carrier density of the channel formation region of the semiconductor layer 108 can be extremely low.

The metal oxide layer 114 can be formed using an insulating material or a conductive material. When the metal oxide layer 114 has an insulating property, the metal oxide layer 114 functions as part of the gate insulating layer. In contrast, when the metal oxide layer 114 has conductivity, the metal oxide layer 114 functions as part of the gate electrode.

The metal oxide layer 114 is preferably formed using an insulating material having a higher dielectric constant than silicon oxide. It is particularly preferable to use an aluminum oxide film, a hafnium oxide film, a hafnium aluminate film, or the like, in which case the driving voltage can be reduced.

The metal oxide layer 114 can also be formed using a conductive oxide such as indium oxide, indium tin oxide (ITO), or indium tin oxide containing silicon (ITSO). A conductive oxide containing indium is particularly preferable because of its high conductivity.

An oxide material containing one or more kinds of elements contained in the semiconductor layer 108 is preferably used for the metal oxide layer 114. In particular, an oxide semiconductor material that can be used for the semiconductor layer 108 is preferably used. At this time, a metal oxide film formed using the same sputtering target as the semiconductor layer 108 is preferably used as the metal oxide layer 114, in which case the same apparatus can be used.

The metal oxide layer 114 is preferably formed using a sputtering apparatus. For example, when an oxide film is formed using a sputtering apparatus, film formation in an atmosphere containing an oxygen gas enables oxygen to be added to the insulating layer 110 and the semiconductor layer 108 in a favorable manner.

The semiconductor layer 108 includes a region overlapping with the conductive layer 112 and the pair of low-resistance regions 108n with the region therebetween. The region of the semiconductor layer 108 overlapping with the conductive layer 112 functions as the channel formation region of the transistor 100. The pair of low-resistance regions 108n functions as a source region and a drain region of the transistor 100.

The low-resistance regions 108n can also be referred to as n-type regions or regions having lower resistance, regions having a higher carrier concentration, regions having a higher oxygen vacancy density, or regions having a higher impurity concentration than the channel formation region.

The low-resistance regions 108n of the semiconductor layer 108 contain an impurity element. Examples of the impurity element include hydrogen, boron, carbon, nitrogen, fluorine, phosphorus, sulfur, arsenic, aluminum, and a rare gas. Typical examples of the rare gas include helium, neon, argon, krypton, and xenon. In particular, boron or phosphorus is preferably contained. Two or more of these elements may be contained.

As described later, an impurity can be added to the low-resistance regions 108n through the insulating layer 110 with the use of the conductive layer 112 as a mask.

It is preferable that the low-resistance regions 108n each include a region having an impurity concentration of higher than or equal to $1 \times 10^{19}$ atoms/cm$^3$ and lower than or equal to $1 \times 10^{23}$ atoms/cm$^3$, preferably higher than or equal to $5 \times 10^{19}$ atoms/cm$^3$ and lower than or equal to $5 \times 10^{22}$ atoms/cm$^3$, further preferably higher than or equal to $1 \times 10^{20}$ atoms/cm$^3$ and lower than or equal to $1 \times 10^{22}$ atoms/cm$^3$.

The concentration of an impurity contained in the low-resistance regions 108n can be measured by an analysis method such as secondary ion mass spectrometry (SIMS) or X-ray photoelectron spectroscopy (XPS). In the case of using XPS analysis, ion sputtering from the top surface side or the back surface side is combined with XPS analysis, whereby the concentration distribution in the depth direction can be found.

Furthermore, an impurity element is preferably oxidized in the low-resistance regions 108n. For example, it is preferable to use an element that is easily oxidized, such as boron, phosphorus, magnesium, aluminum, or silicon, as the impurity element. Since such an element that is easily oxidized can exist stably in a state of being bonded to oxygen in the semiconductor layer 108 to be oxidized, the element can be inhibited from being released even when a high temperature (e.g., higher than or equal to 400° C., higher than or equal to 600° C., or higher than or equal to 800° C.) is applied in a later step. Furthermore, the impurity element deprives the semiconductor layer 108 of oxygen, whereby many oxygen vacancies are generated in the low-resistance regions 108n. The oxygen vacancies are bonded to hydrogen in the film to serve as carrier supply sources; thus, the low-resistance regions 108n are in an extremely low-resistance state.

For example, in the case where boron is used as the impurity element, boron contained in the low-resistance regions 108n can exist in a state of being bonded to oxygen. This can be confirmed by a spectrum peak derived from a $B_2O_3$ bond, which is observed in XPS analysis. In the XPS analysis, a peak spectrum derived from elemental boron is not observed, or the peak strength becomes extremely small such that a spectrum peak is lost in the background noise that is detected around the lower measurement limit.

The insulating layer 110 includes a region in contact with the channel formation region of the semiconductor layer 108, i.e., a region overlapping with the conductive layer 112. The insulating layer 110 includes a region that is in contact with the low-resistance region 108n of the semiconductor layer 108 and does not overlap with the conductive layer 112.

In some cases, the region of the insulating layer 110 overlapping with the low-resistance region 108n contains the above impurity element. In this case, as in the low-resistance region 108n, the impurity element in the insulating layer 110 preferably exists in a state of being bonded to oxygen. Since such an element that is easily oxidized can exist stably in a state of being bonded to oxygen in the insulating layer 110 to be oxidized, the element can be inhibited from being released even when a high temperature is applied in a later step. Particularly in the case where oxygen (also referred to as excess oxygen) that might be released by heating is contained in the insulating layer 110, the excess oxygen and the impurity element are bonded to each other and stabilized, so that oxygen can be prevented from being supplied from the insulating layer 110 to the low-resistance regions 108n. Furthermore, since oxygen is less likely to be diffused into part of the insulating layer 110 containing the oxidized impurity element, supply of oxygen to the low-resistance regions 108n from layers above the insulating layer 110 therethrough is suppressed and an increase in the resistance of the low-resistance regions 108n can also be prevented.

The insulating layer 118 functions as a protective layer for protecting the transistor 100. An inorganic insulating material such as an oxide or a nitride can be used for the insulating layer 110, for example. Specific examples of the inorganic insulating material include silicon oxide, silicon oxynitride, silicon nitride, silicon nitride oxide, aluminum oxide, aluminum oxynitride, aluminum nitride, hafnium oxide, and hafnium aluminate.

Structure Example 2-2

Figure 4A:
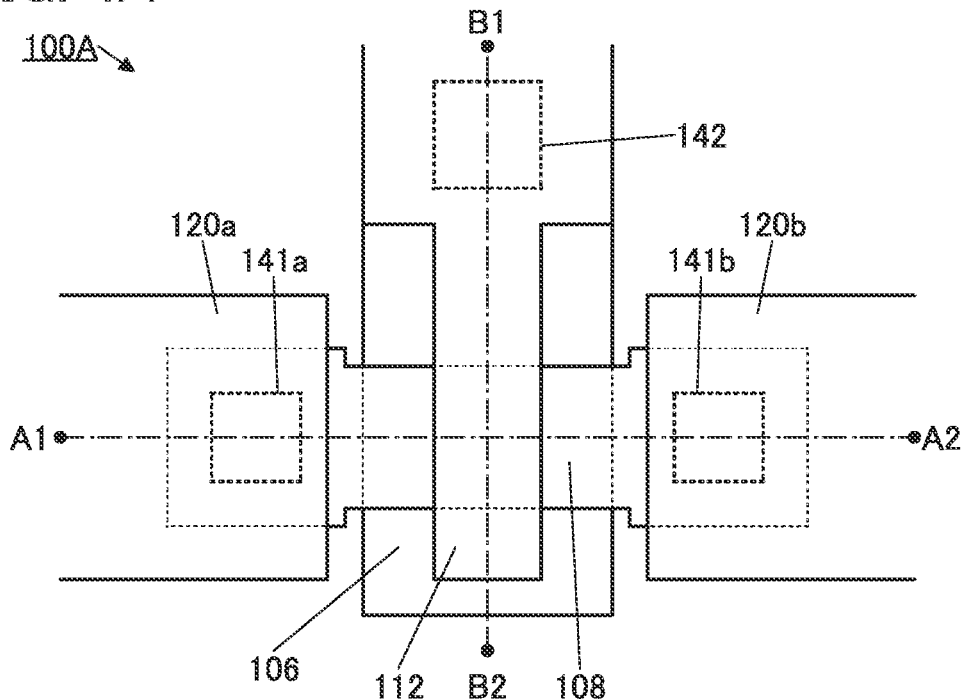
FIGS. 4A to 4C illustrate a structure example of a transistor.
Figure 4B:
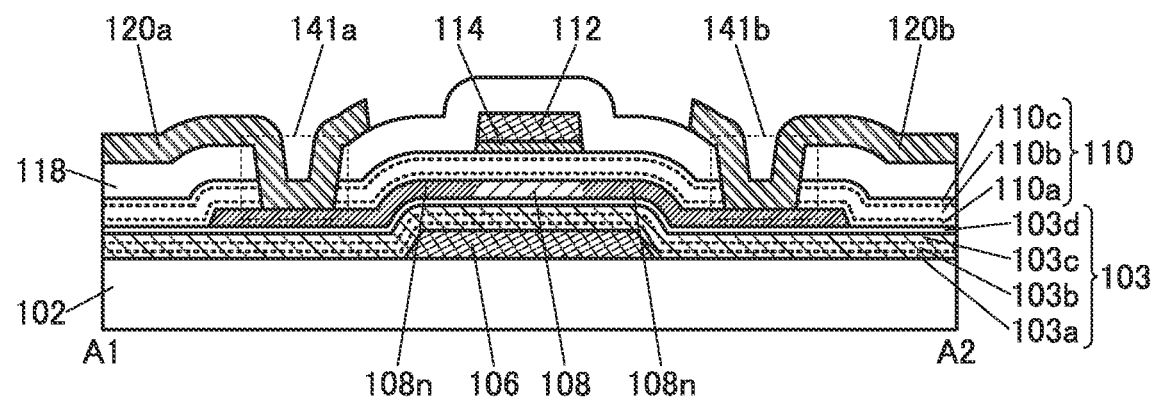
Figure 4C:
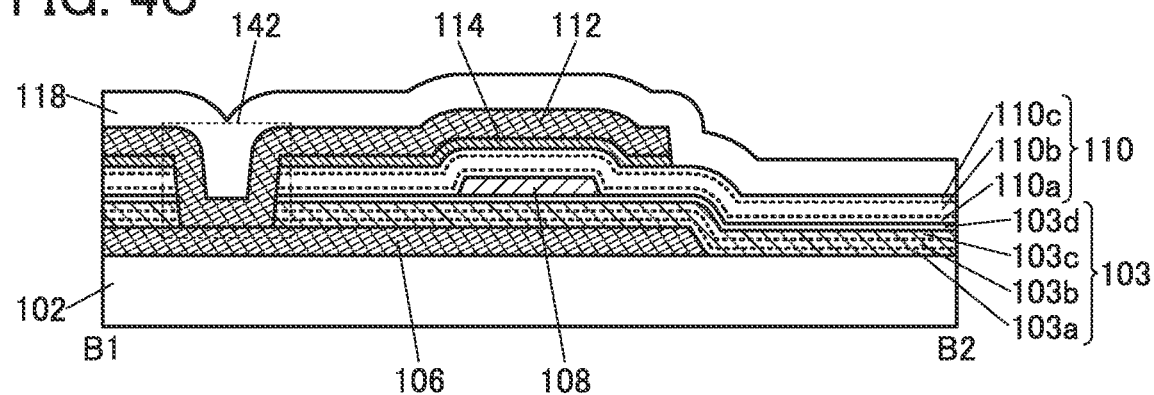

FIG. 4A is a top view of a transistor 100A. FIG. 4B is a cross-sectional view of the transistor 100A in the channel length direction. FIG. 4C is a cross-sectional view of the transistor 100A in the channel width direction.

The transistor 100A is different from the transistor of Structure Example 2-1 mainly in that the conductive layer 106 is provided between the substrate 102 and the insulating layer 103. The conductive layer 106 includes a region overlapping with the semiconductor layer 108 and the conductive layer 112.

In the transistor 100A, the conductive layer 112 functions as a second gate electrode (also referred to as a top gate electrode), and the conductive layer 106 functions as a first gate electrode (also referred to as a bottom gate electrode). Part of the insulating layer 110 functions as a second gate insulating layer, and part of the insulating layer 103 functions as a first gate insulating layer.

In the semiconductor layer 108, a portion overlapping with at least one of the conductive layer 112 and the conductive layer 106 functions as a channel formation region. For simplicity, a portion of the semiconductor layer 108 that overlaps with the conductive layer 112 is hereinafter referred to as a channel formation region in some cases; in fact, a channel may also be formed in a portion of the semiconductor layer 108 that does not overlap with the conductive layer 112 but overlaps with the conductive layer 106 (a portion including the low-resistance region 108n).

As illustrated in FIG. 4C, the conductive layer 106 may be electrically connected to the conductive layer 112 through an opening 142 formed in the metal oxide layer 114, the insulating layer 110, and the insulating layer 103. In that case, the conductive layer 106 and the conductive layer 112 can be supplied with the same potential.

The conductive layer 106 can be formed using a material similar to that used for the conductive layer 112, the conductive layer 120a, or the conductive layer 120b. It is particularly preferable to use a material containing copper for the conductive layer 106 because wiring resistance can be reduced.

As illustrated in FIGS. 4A and 4C, the conductive layer 112 and the conductive layer 106 preferably extend beyond an end portion of the semiconductor layer 108 in the channel width direction. In that case, as shown in FIG. 4C, the semiconductor layer 108 in the channel width direction is wholly covered with the conductive layer 112 and the conductive layer 106 with the insulating layer 110 between the semiconductor layer 108 and the conductive layer 112 and with the insulating layer 103 between the semiconductor layer 108 and the conductive layer 106.

In such a structure, the semiconductor layer 108 can be electrically surrounded by electric fields generated by the pair of gate electrodes. At this time, it is particularly preferable to supply the same potential to the conductive layer 106 and the conductive layer 112. In that case, electric fields for inducing a channel can be effectively applied to the semiconductor layer 108, whereby the on-state current of the transistor 100A can be increased. Thus, the transistor 100A can be miniaturized.

Note that the conductive layer 112 is not necessarily connected to the conductive layer 106. In that case, a constant potential may be supplied to one of the pair of gate electrodes, and a signal for driving the transistor 100A may be supplied to the other. At this time, the potential supplied to the one of the gate electrodes can control the threshold voltage at the time of driving the transistor 100A with the other gate electrode.

Structure Example 2-3

Figure 5A:
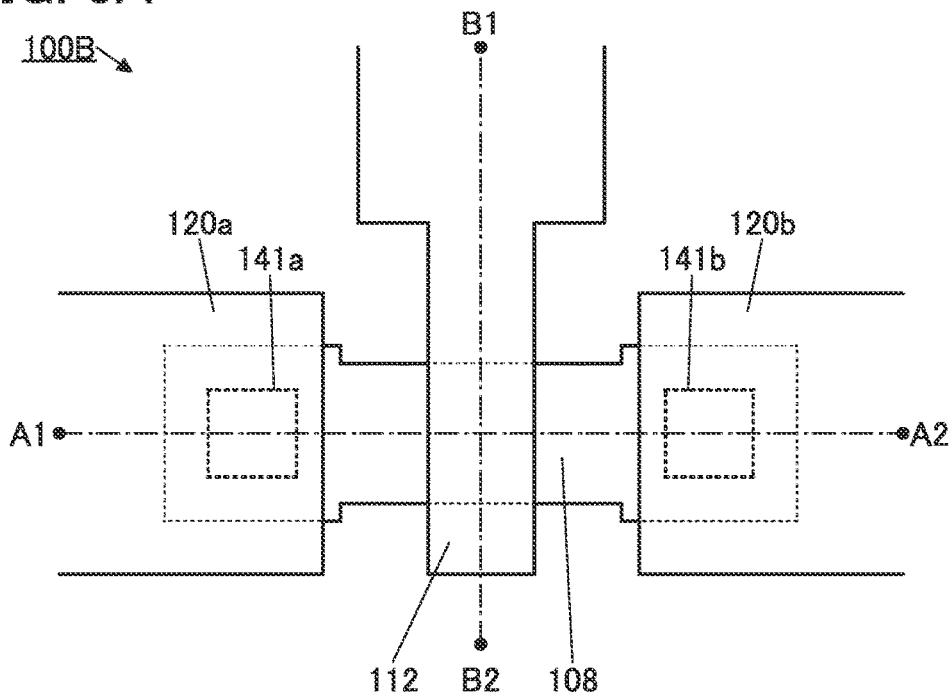
FIGS. 5A to 5C illustrate a structure example of a transistor.
Figure 5B:
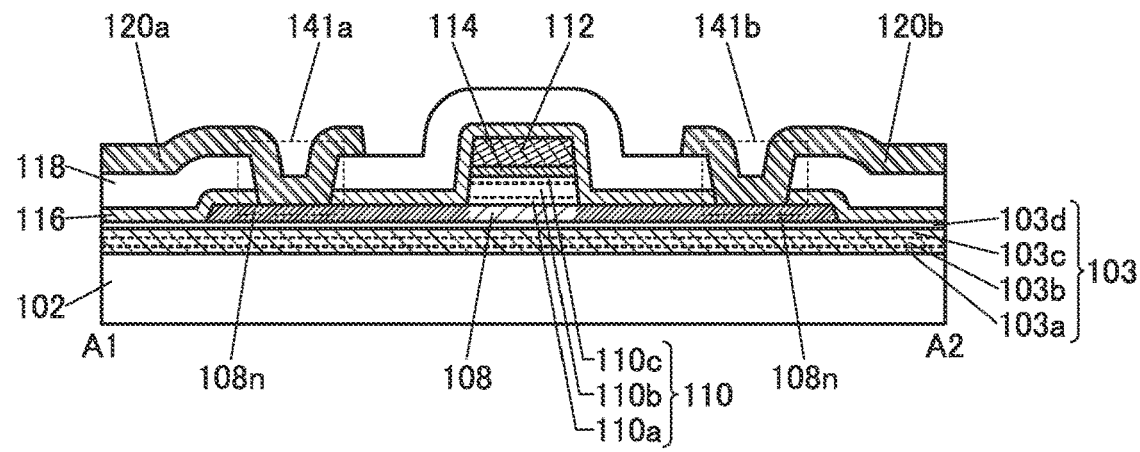
Figure 5C:
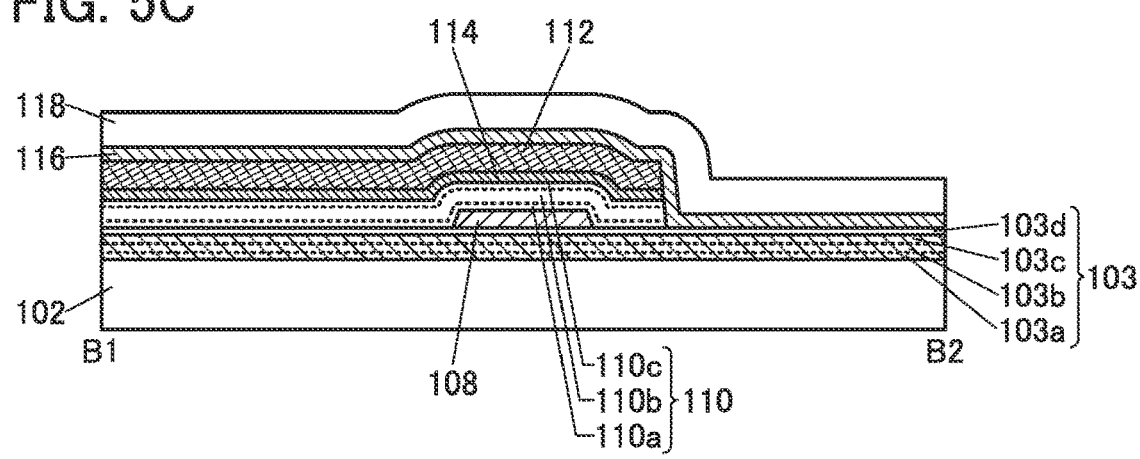

FIG. 5A is a top view of a transistor 100B. FIG. 5B is a cross-sectional view of the transistor 100B in the channel length direction. FIG. 5C is a cross-sectional view of the transistor 100B in the channel width direction.

The transistor 100B is different from the transistor 100 described in Structure Example 2-1 mainly in the structure of the insulating layer 110 and the existence of an insulating layer 116.

The insulating layer 110 is processed so as to have substantially the same top surface shape as the top surface shapes of the conductive layer 112 and the metal oxide layer 114. The insulating layer 110 can be formed with the use of a resist mask for processing the conductive layer 112 and the metal oxide layer 114, for example.

The insulating layer 116 is provided in contact with a top surface and a side surface of the semiconductor layer 108 which are not covered with the conductive layer 112, the metal oxide layer 114, and the insulating layer 110. The insulating layer 116 is provided to cover a top surface of the insulating layer 103, a side surface of the insulating layer 110, a side surface of the metal oxide layer 114, and a top surface and a side surface of the conductive layer 112.

The insulating layer 116 has a function of reducing the resistance of the low-resistance regions 108n. The insulating layer 116 can be formed using an insulating film that can supply an impurity to the low-resistance regions 108n by heating at the time of or after formation of the insulating layer 116. Alternatively, the insulating layer 116 can be formed using an insulating film that can cause generation of oxygen vacancies in the low-resistance regions 108n by heating at the time of or after formation of the insulating layer 116.

For example, an insulating film functioning as a source for supplying the impurity to the low-resistance regions 108n can be used as the insulating layer 116. In this case, the insulating layer 116 is preferably a film from which hydrogen is released by heating. When such an insulating layer 116 is formed in contact with the semiconductor layer 108, an impurity such as hydrogen can be supplied to the low-resistance regions 108n, so that the resistance of the low-resistance regions 108n can be reduced.

The insulating layer 116 is preferably formed using a formation gas containing an impurity element such as a hydrogen element. In addition, by increasing the deposition temperature of the insulating layer 116, a large amount of impurity elements can be effectively supplied to the semiconductor layer 108. The deposition temperature of the insulating layer 116 can range from 200° C. to 500° C., preferably from 220° C. to 450° C., further preferably from 250° C. to 400° C., for example.

When the insulating layer 116 is formed under a reduced pressure while heating is performed, release of oxygen from regions to be the low-resistance regions 108n of the semiconductor layer 108 can be promoted. When an impurity such as hydrogen is supplied to the semiconductor layer 108 where many oxygen vacancies are formed, the carrier density of the low-resistance regions 108n is increased, and the resistance of the low-resistance regions 108n can be reduced more effectively.

As the insulating layer 116, for example, an insulating film containing nitride such as silicon nitride, silicon nitride oxide, silicon oxynitride, aluminum nitride, or aluminum nitride oxide can be favorably used. In particular, silicon nitride has a blocking property against hydrogen and oxygen; thus, both diffusion of hydrogen from the outside to a semiconductor layer and release of oxygen from the semiconductor layer to the outside can be prevented, which leads to a highly reliable transistor.

The insulating layer 116 may be an insulating film having a function of absorbing oxygen in the semiconductor layer 108 and generating oxygen vacancies. It is particularly preferable to use a metal nitride such as aluminum nitride for the insulating layer 116.

In the case of using a metal nitride, it is preferable to use a nitride of aluminum, titanium, tantalum, tungsten, chromium, or ruthenium. In particular, aluminum or titanium is preferably contained. For example, an aluminum nitride film formed by a reactive sputtering method using a sputtering target of aluminum and a formation gas containing a nitrogen gas can have both an extremely high insulating property and an extremely high blocking property against hydrogen and oxygen when formed under proper control of a flow rate of the nitrogen gas with respect to the total flow rate of the formation gas. Therefore, when such an insulating film containing a metal nitride is provided in contact with a semiconductor layer, the resistance of the semiconductor layer can be reduced, and release of oxygen from the semiconductor layer and diffusion of hydrogen into the semiconductor layer can be favorably prevented.

In the case where aluminum nitride is used as the metal nitride, the thickness of the insulating layer containing aluminum nitride is preferably 5 nm or more. A film with such a small thickness can also have both a high blocking property against hydrogen and oxygen and a function of reducing the resistance of the semiconductor layer. Note that there is no upper limit of the thickness of the insulating layer; however, the thickness is preferably 500 nm or less, further preferably 200 nm or less, still further preferably 50 nm or less in consideration of productivity.

In the case of using an aluminum nitride film as the insulating layer 116, it is preferable to use a film that satisfies the composition formula AlN$_x$ (x is a real number greater than 0 and less than or equal to 2, preferably greater than or equal to 0.5 and less than or equal to 1.5). In that case, a film having an excellent insulating property and high thermal conductivity can be obtained, and thus dissipation of heat generated in driving the transistor 100B can be increased.

Alternatively, an aluminum titanium nitride film, a titanium nitride film, or the like can be used as the insulating layer 116.

Such an insulating layer 116 is provided in contact with the low-resistance regions 108n, whereby the insulating layer 116 absorbs oxygen in the low-resistance regions 108n and oxygen vacancies can be formed in the low-resistance regions 108n. Furthermore, when heat treatment is performed after the insulating layer 116 is formed, a larger number of oxygen vacancies can be formed in the low-resistance regions 108n, and the resistance can be further reduced. In the case where a film containing a metal oxide is used as the insulating layer 116, the insulating layer 116 absorbs oxygen in the semiconductor layer 108, whereby, in some cases, a layer containing an oxide of a metal element (e.g., aluminum) contained in the insulating layer 116 is formed between the insulating layer 116 and the low-resistance regions 108n.

Here, in the case where a metal oxide film containing indium is used as the semiconductor layer 108, a region where indium oxide is deposited or a region having a high indium concentration is sometimes formed in the vicinity of the interface of the low-resistance regions 108n on the insulating layer 116 side. Hence, the low-resistance regions 108n with an extremely low resistance can be formed. Such regions can be observed by an analysis method such as XPS in some cases, for example.

Structure Example 2-4

Figure 6A:
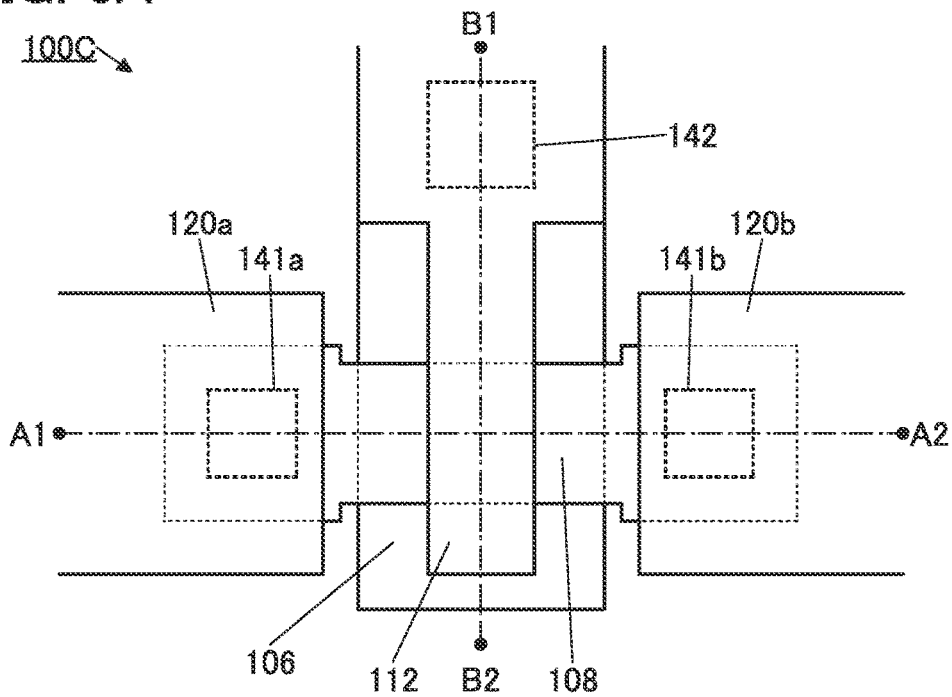
FIGS. 6A to 6C illustrate a structure example of a transistor.
Figure 6B:
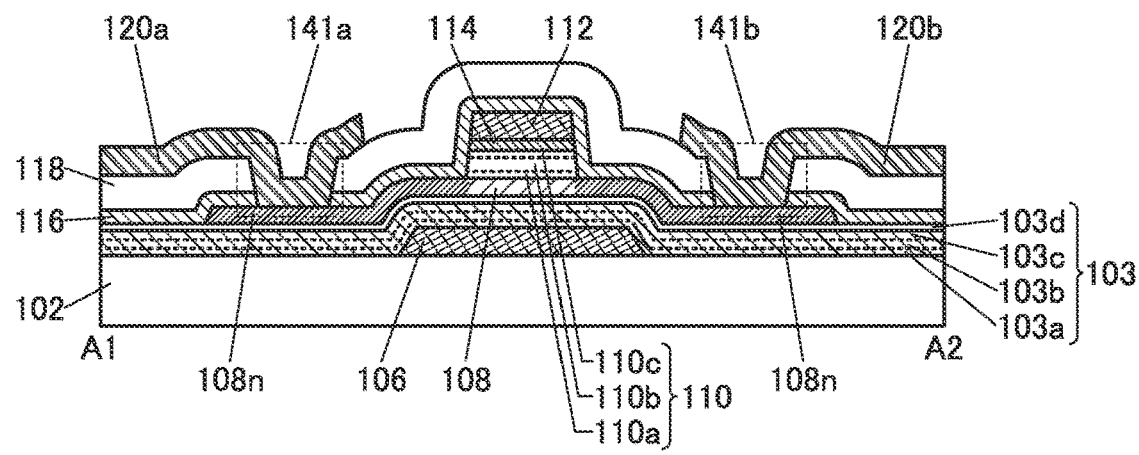
Figure 6C:
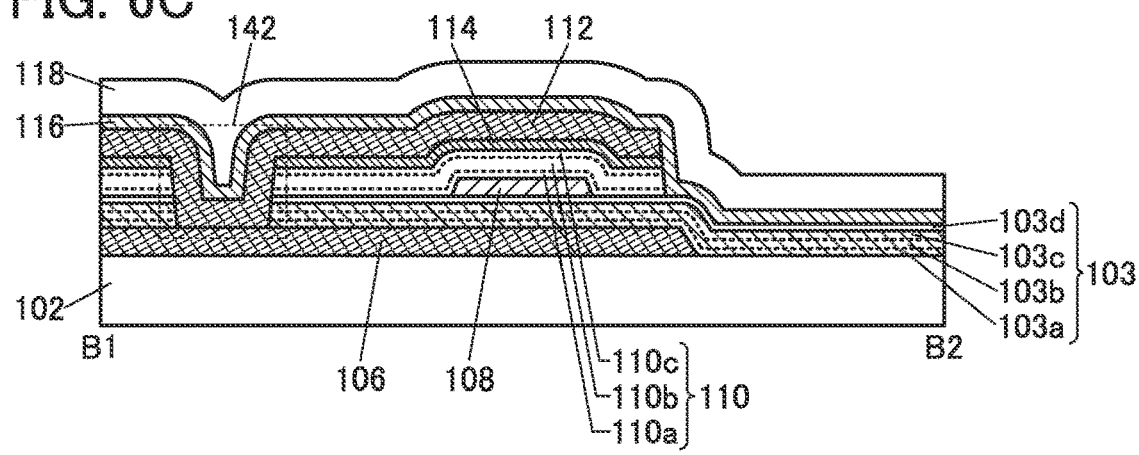

FIG. 6A is a top view of a transistor 100C. FIG. 6B is a cross-sectional view of the transistor 100C in the channel length direction. FIG. 6C is a cross-sectional view of the transistor 100C in the channel width direction.

The transistor 100C is an example in which the transistor 100B described in Structure Example 2-3 is provided with the conductive layer 106 described in Structure Example 2-2 as functioning as the first gate electrode.

Such a structure enables a transistor to have high on-state current. Alternatively, a transistor whose threshold voltage is controllable can be provided.

Modification Example 1 of Structure Example 2

Although the semiconductor layer 108 is a single layer in Structure Examples 2-1 to 2-4, the semiconductor layer 108 preferably has the stacked-layer structure in which the semiconductor layer 108a and the semiconductor layer 108b are stacked.

Figure 7A:
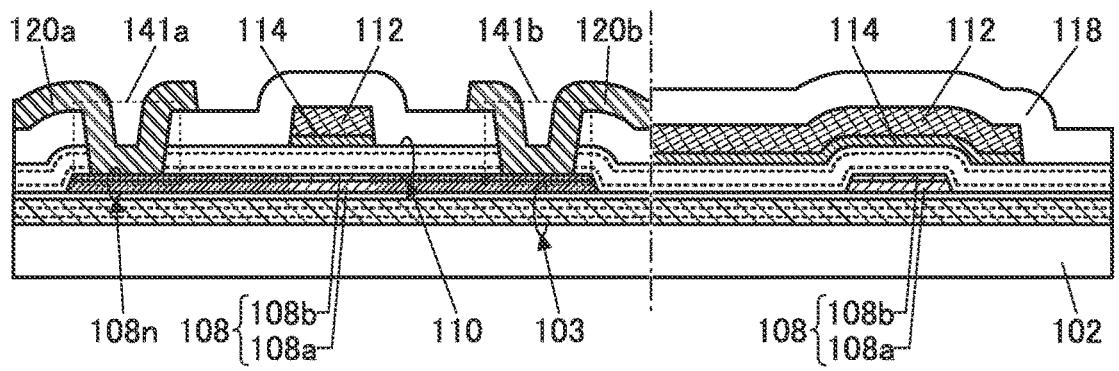
FIGS. 7A to 7D each illustrate a structure example of a transistor.

A transistor 100_a illustrated in FIG. 7A is an example in which the semiconductor layer 108 of the transistor 100 described in Structure Example 2-1 has the stacked-layer structure. In FIG. 7A, a cross section in the channel length direction is shown at the left of a dashed-dotted line, and a cross section in the channel width direction is shown at the right of the dashed-dotted line.

Figure 7B:
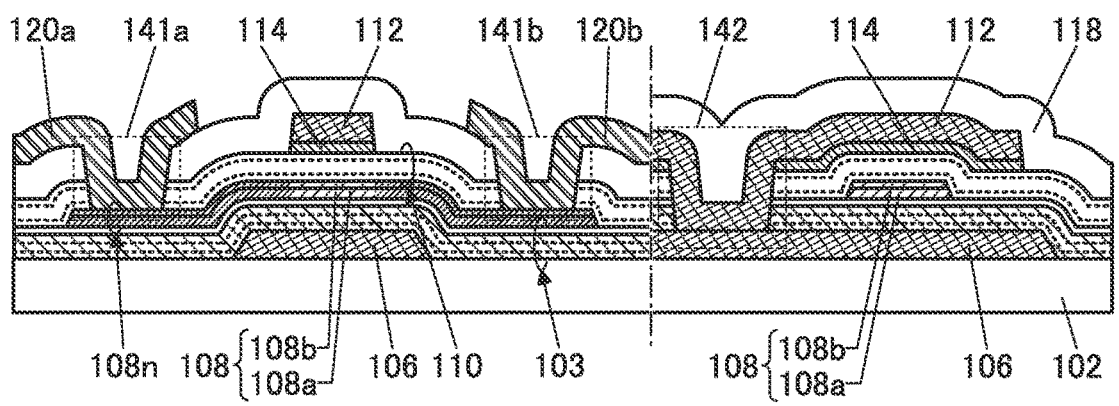
Figure 7C:
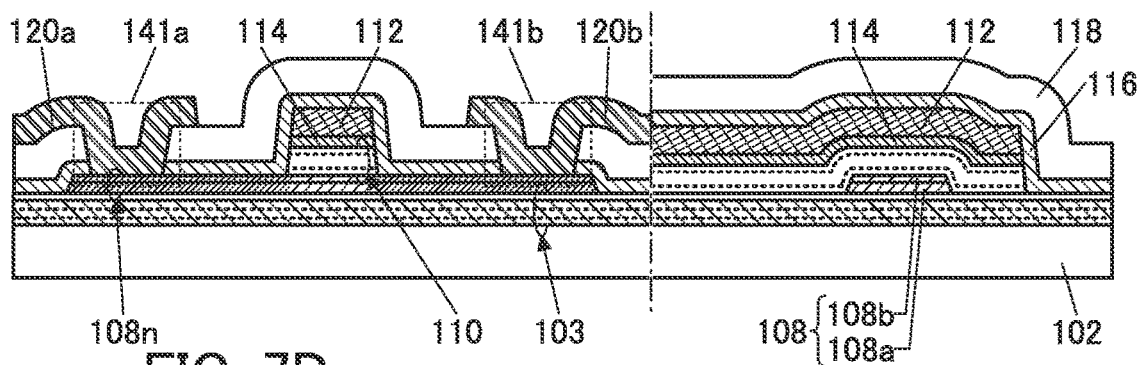
Figure 7D:
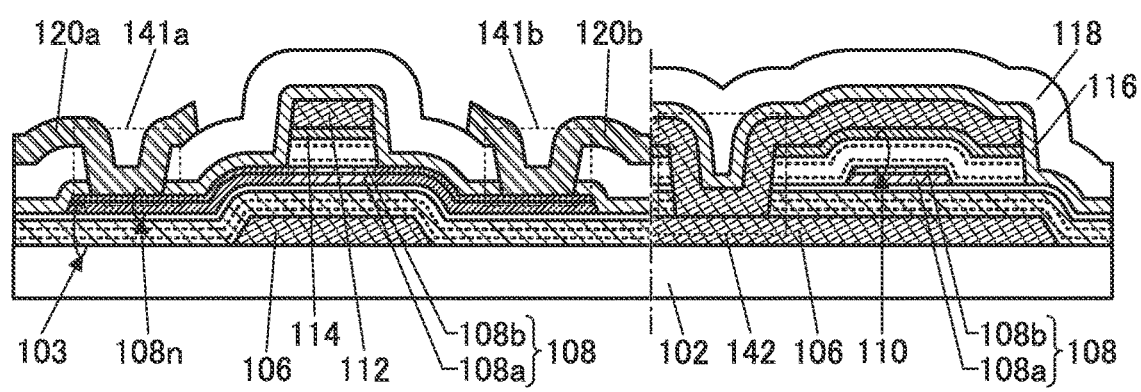

Similarly, a transistor 100A_a in FIG. 7B, a transistor 100B_a in FIG. 7C, and a transistor 100C_a in FIG. 7D are examples in which the semiconductor layers 108 of the transistor 100A, the transistor 100B, and the transistor 100C each have the stacked-layer structure.

Modification Example 2 of Structure Example 2

As described above, the metal oxide layer 114 positioned between the insulating layer 110 and the conductive layer 112 can be removed after oxygen is supplied to the insulating layer 110.

Figure 8A:
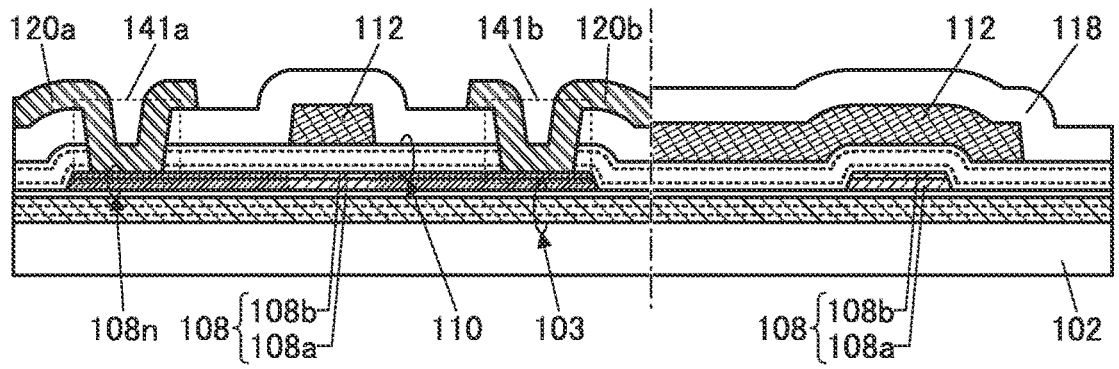
FIGS. 8A to 8D each illustrate a structure example of a transistor.

A transistor 100_b illustrated in FIG. 8A is an example in which the metal oxide layer 114 of the transistor 100_a in FIG. 7A is removed.

Figure 8B:
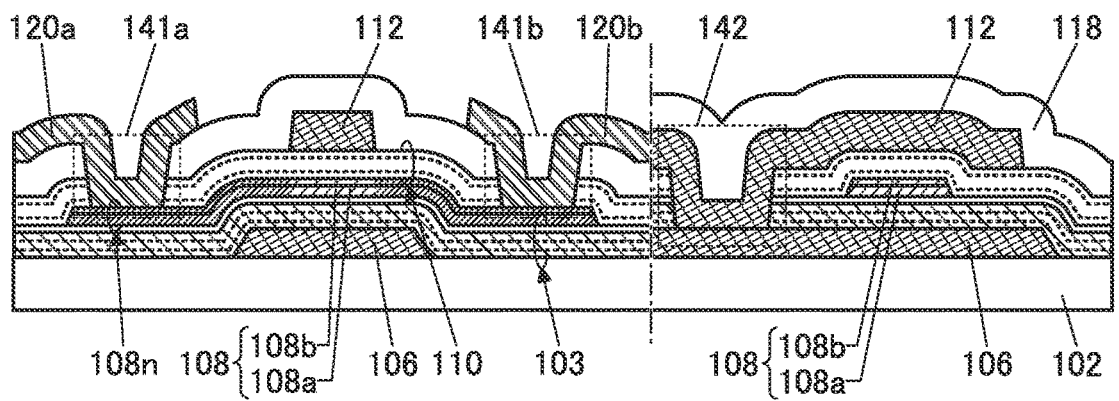
Figure 8C:
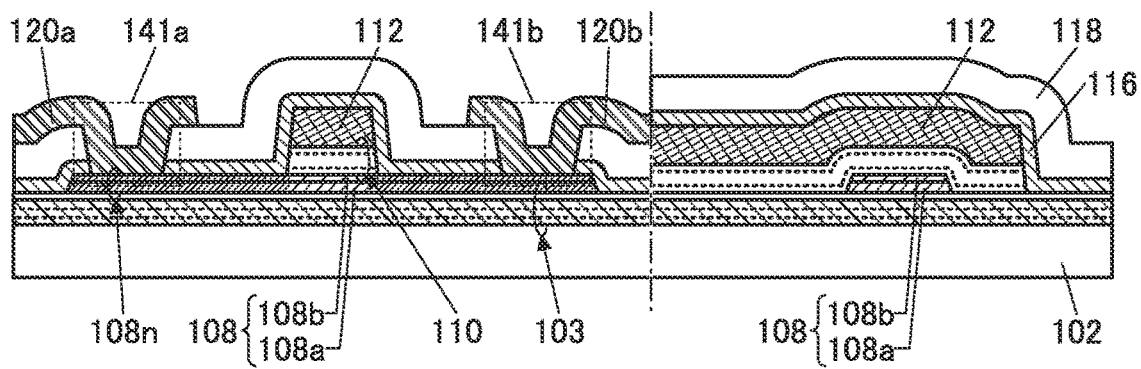
Figure 8D:
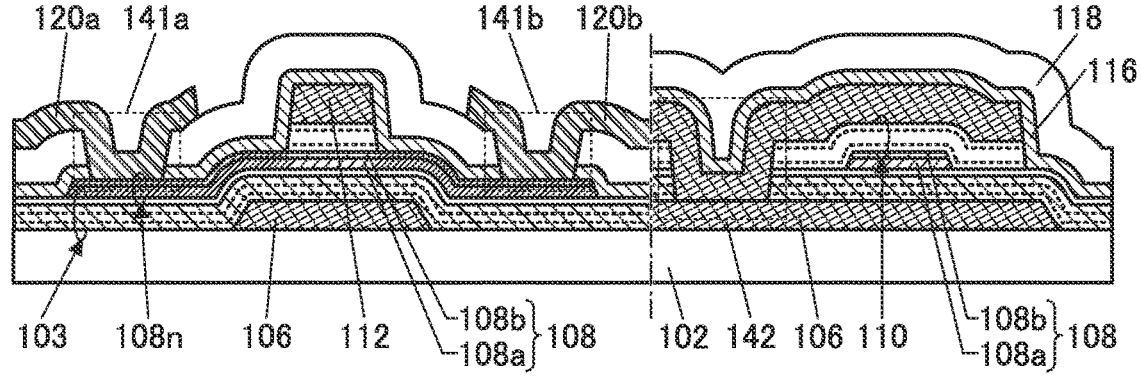

Similarly, a transistor 100A_b in FIG. 8B, a transistor 100B_b in FIG. 8C, and a transistor 100C_b in FIG. 8D are examples in which the metal oxide layers 114 of the transistor 100A_a, the transistor 100B_a, and the transistor 100C_a are removed.

Manufacturing Method Example 1

An example of a manufacturing method of a transistor of one embodiment of the present invention will be described below. Here, description will be made using the transistor 100A in Structure Example 2-2 as an example.

Note that thin films (e.g., an insulating film, a semiconductor film, and a conductive film) included in a semiconductor device can be formed by any of a sputtering method, a chemical vapor deposition (CVD) method, a vacuum evaporation method, a pulsed laser deposition (PLD) method, an atomic layer deposition (ALD) method, and the like. As a CVD method, a plasma-enhanced chemical vapor deposition (PECVD) method or a thermal CVD method can be used. An example of a thermal CVD method includes a metal organic CVD (MOCVD) method.

Alternatively, the thin films (e.g., the insulating film, the semiconductor film, and the conductive film) included in the semiconductor device can be formed by a method such as spin coating, dipping, spray coating, inkjet printing, dispensing, screen printing, or offset printing or with a doctor knife, a slit coater, a roll coater, a curtain coater, or a knife coater.

To process thin films included in the semiconductor device, a photolithography method or the like can be used. Besides, a nanoimprinting method, a sandblasting method, a lift-off method, or the like may be used to process thin films. Alternatively, island-shaped thin films may be formed by a film formation method using a shielding mask such as a metal mask.

There are two typical examples of photolithography methods. In one of the methods, a resist mask is formed over a thin film that is to be processed, the thin film is processed by etching or the like, and then the resist mask is removed. In the other method, a photosensitive thin film is formed and then processed into a desired shape by light exposure and development.

As light for exposure in a photolithography method, it is possible to use light with the i-line (wavelength: 365 nm), light with the g-line (wavelength: 436 nm), light with the h-line (wavelength: 405 nm), or light in which the i-line, the g-line, and the h-line are mixed. Alternatively, ultraviolet light, KrF laser light, ArF laser light, or the like can be used. Exposure may be performed by liquid immersion exposure technique. As the light for exposure, extreme ultraviolet (EUV) light or X-rays may also be used. Instead of the light for exposure, an electron beam can be used. It is preferable to use EUV, X-rays, or an electron beam because extremely minute processing can be performed. Note that a photomask is not needed when exposure is performed by scanning with a beam such as an electron beam.

For etching of thin films, a dry etching method, a wet etching method, a sandblast method, or the like can be used.

FIGS. 9A to 9E, FIGS. 10A to 10D, and FIGS. 11A and 11B each show, side by side, a cross section in the channel length direction and a cross section in the channel width direction at each step in the manufacturing process of the transistor 100A.

<Formation of Conductive Layer 106>

Figure 9A:
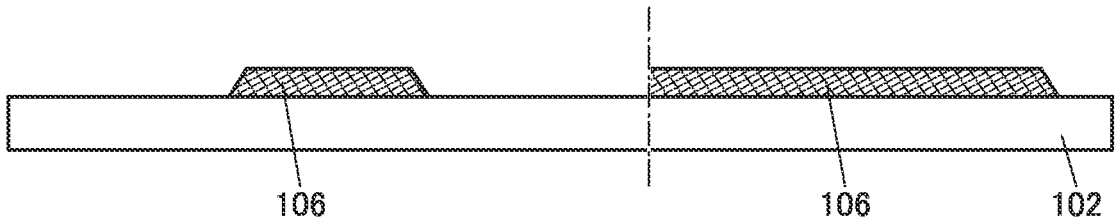
FIGS. 9A to 9E illustrate a method for manufacturing a transistor.

A conductive film is formed over the substrate 102 and processed by etching, whereby the conductive layer 106 functioning as a gate electrode is formed (FIG. 9A).

At this time, as illustrated in FIG. 9A, the conductive layer 106 is preferably processed so as to have an end portion with a tapered shape. This can improve step coverage with the insulating layer 103 to be formed in the next step.

When a conductive film containing copper is used as the conductive film to be the conductive layer 106, wiring resistance can be reduced. For example, a conductive film containing copper is preferably used in the case of a large display device or a display device with a high resolution. Even in the case where a conductive film containing copper is used as the conductive layer 106, diffusion of copper to the semiconductor layer 108 side can be suppressed by the insulating layer 103, whereby a highly reliable transistor can be obtained.

<Formation of Insulating Layer 103>

Figure 9B:
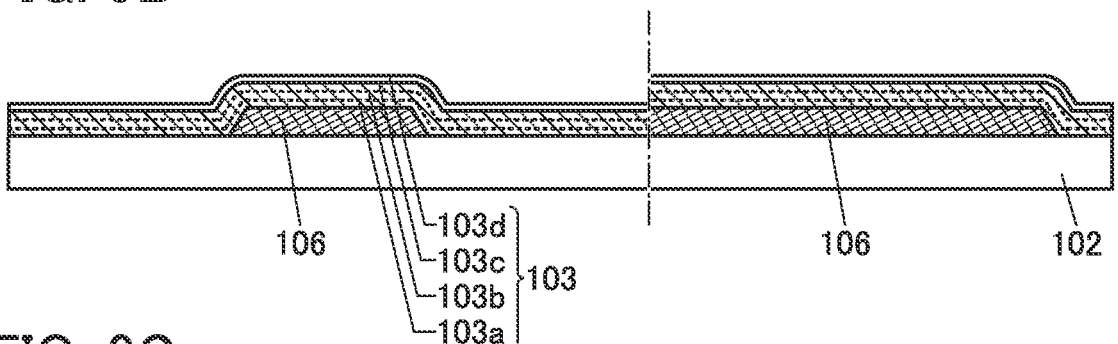

Then, the insulating layer 103 is formed to cover the substrate 102 and the conductive layer 106 (FIG. 9B). The insulating layer 103 can be formed by a PECVD method, an ALD method, a sputtering method, or the like.

Here, the insulating layer 103 is formed by stacking the insulating film 103a, the insulating film 103b, the insulating film 103c, and the insulating film 103d.

In particular, each of the insulating films included in the insulating layer 103 is preferably formed by a PECVD method. For the method for forming the insulating layer 103, the description in Structure Example 1 can be referred to.

After the insulating layer 103 is formed, treatment for supplying oxygen to the insulating layer 103 may be performed. For example, plasma treatment, heat treatment, or the like in an oxygen atmosphere can be performed. Alternatively, oxygen may be supplied to the insulating layer 103 by a plasma ion doping method or an ion implantation method.

<Formation of Semiconductor Layer 108>

Figure 9C:
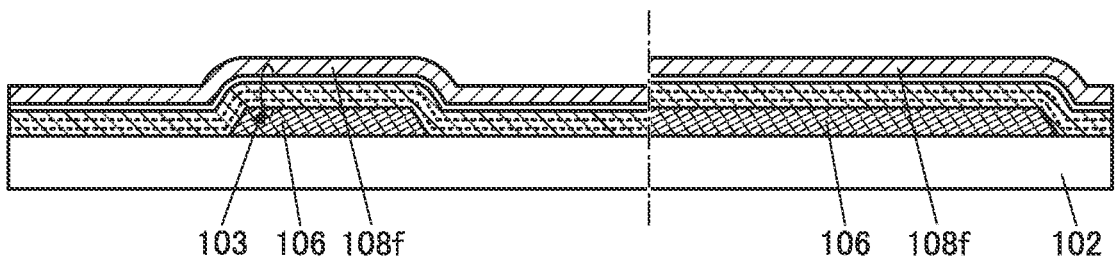

Then, a metal oxide film 108f is formed over the insulating layer 103 (FIG. 9C).

The metal oxide film 108f is preferably formed by a sputtering method using a metal oxide target.

The metal oxide film 108f is preferably a dense film with as few defects as possible. The metal oxide film 108f is preferably a highly purified film in which impurities such as hydrogen and water are reduced as much as possible. It is particularly preferable to use a metal oxide film having crystallinity as the metal oxide film 108f.

In forming the metal oxide film, an oxygen gas and an inert gas (such as a helium gas, an argon gas, or a xenon gas) may be mixed. Note that the higher the proportion of the oxygen gas in the whole formation gas (hereinafter also referred to as oxygen flow rate ratio) is in forming the metal oxide film, the higher the crystallinity of the metal oxide film can be, enabling the transistor to have high reliability. In contrast, the lower the oxygen flow rate ratio is, the lower the crystallinity of the metal oxide film is, enabling the transistor to have increased on-state current.

In forming the metal oxide film, as the substrate temperature becomes higher, a denser metal oxide film having higher crystallinity can be formed. On the other hand, as the substrate temperature becomes lower, a metal oxide film having lower crystallinity and higher electric conductivity can be formed.

The metal oxide film is formed at a substrate temperature higher than or equal to room temperature and lower than or equal to 250° C., preferably higher than or equal to room temperature and lower than or equal to 200° C., further preferably higher than or equal to room temperature and lower than or equal to 140° C. For example, the substrate temperature is preferably set to be higher than or equal to room temperature and lower than 140° C. because the productivity is increased. When the metal oxide film is formed at a substrate temperature of room temperature or without intentional heating, the metal oxide film can have low crystallinity.

Before the formation of the metal oxide film 108f, it is preferable to perform at least one of treatment for releasing water, hydrogen, an organic substance, and the like adsorbed on the surface of the insulating layer 103, and treatment for supplying oxygen to the insulating layer 103. For example, heat treatment can be performed at a temperature of 70° C. to 200° C. in a reduced-pressure atmosphere. Alternatively, plasma treatment in an atmosphere containing oxygen may be performed. Alternatively, oxygen may be supplied to the insulating layer 103 by plasma treatment in an atmosphere containing an oxidizing gas such as dinitrogen monoxide ($N_2O$). When plasma treatment using a dinitrogen monoxide gas is performed, an organic substance on the surface of the insulating layer 103 can be favorably removed and oxygen can be supplied to the insulating layer 103. The metal oxide film 108f is preferably formed successively after such treatment without exposure of the surface of the insulating layer 103 to the air.

Note that in the case where the semiconductor layer 108 has a stacked-layer structure in which a plurality of semiconductor layers are stacked, an upper metal oxide film is preferably formed successively after formation of a lower metal oxide film without exposure of the surface of the lower metal oxide layer to the air.

Figure 9D:
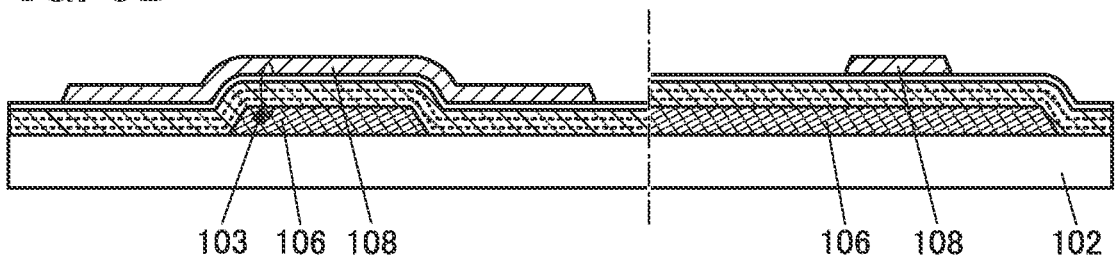

Next, the metal oxide film 108f is partly etched, so that the island-shaped semiconductor layer 108 is formed (FIG. 9D).

The metal oxide film 108f is processed by a wet etching method and/or a dry etching method. At this time, part of the insulating layer 103 that does not overlap with the semiconductor layer 108 is etched to be thinned in some cases. For example, in some cases, the insulating film 103d of the insulating layer 103 is removed by etching and the surface of the insulating film 103c is exposed.

Here, it is preferable that heat treatment be performed after the metal oxide film 108f is formed or processed into the semiconductor layer 108. By the heat treatment, hydrogen or water contained in the metal oxide film 108f or the semiconductor layer 108 or adsorbed on the surface of the metal oxide film 108f or the semiconductor layer 108 can be removed. Furthermore, the film quality of the metal oxide film 108f or the semiconductor layer 108 is improved (e.g., the number of defects is reduced or crystallinity is increased) by the heat treatment in some cases.

Furthermore, oxygen can be supplied from the insulating layer 103 to the metal oxide film 108f or the semiconductor layer 108 by heat treatment. At this time, it is further preferable that the heat treatment be performed before the semiconductor film 108f is processed into the semiconductor layer 108.

The heat treatment can be performed typically at a temperature higher than or equal to 150° C. and lower than the strain point of the substrate, higher than or equal to 200° C. and lower than or equal to 500° C., higher than or equal to 250° C. and lower than or equal to 450° C., or higher than or equal to 300° C. and lower than or equal to 450° C.

The heat treatment can be performed in an atmosphere containing a rare gas or nitrogen. Alternatively, the heat treatment may be performed in the above atmosphere first, and then performed in an atmosphere containing oxygen. Alternatively, the heat treatment may be performed in a dry air atmosphere. It is preferable that the above atmosphere used for the heat treatment contain hydrogen, water, or the like as little as possible. An electric furnace, a rapid thermal annealing (RTA) apparatus, or the like can be used for the heat treatment. With the RTA apparatus, the heat treatment time can be shortened.

Note that the heat treatment is not necessarily performed. The heat treatment is not necessarily performed in this step, and heat treatment performed in a later step may also serve as the heat treatment in this step. In some cases, treatment at a high temperature (e.g., film formation step) or the like in a later step can serve as the heat treatment in this step.

<Formation of Insulating Layer 110>

Figure 9E:
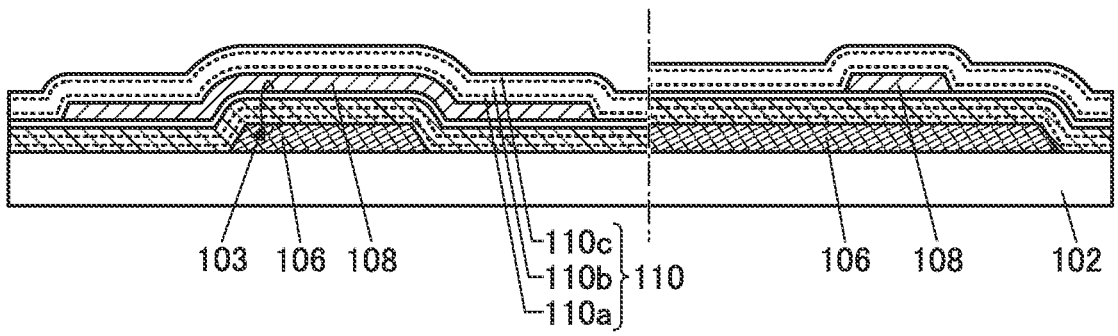

Next, the insulating layer 110 is formed to cover the insulating layer 103 and the semiconductor layer 108 (FIG. 9E).

Here, the insulating layer 110 is formed by stacking the insulating film 110a, the insulating film 110b, and the insulating film 110c.

In particular, each of the insulating films included in the insulating layer 110 is preferably formed by a PECVD method. For the method for forming each of the insulating films included in the insulating layer 110, the description in Structure Example 1 can be referred to.

It is preferable to perform plasma treatment on the surface of the semiconductor layer 108 before the insulating layer 110 is formed. By the plasma treatment, impurities such as water adsorbed on the surface of the semiconductor layer 108 can be reduced. Therefore, impurities at the interface between the semiconductor layer 108 and the insulating layer 110 can be reduced, enabling the transistor to have high reliability. The plasma treatment is particularly preferable in the case where the surface of the semiconductor layer 108 is exposed to the air in the process from formation of the semiconductor layer 108 to formation of the insulating layer 110. The plasma treatment can be performed in an atmosphere such as oxygen, ozone, nitrogen, dinitrogen monoxide, or argon, for example. The plasma treatment and the formation of the insulating layer 110 are preferably performed successively without exposure to the air.

After the insulating layer 110 is formed, heat treatment is preferably performed. By the heat treatment, hydrogen or water contained in the insulating layer 110 or adsorbed on its surface can be removed. At the same time, the number of defects in the insulating layer 110 can be reduced.

The above description can be referred to for the conditions of the heat treatment.

Note that the heat treatment is not necessarily performed. The heat treatment is not necessarily performed in this step, and heat treatment performed in a later step may also serve as the heat treatment in this step. In some cases, treatment at a high temperature (e.g., film formation step) or the like in a later step can serve as the heat treatment in this step.

<Formation of Metal Oxide Film 114*f*>

Figure 10A:
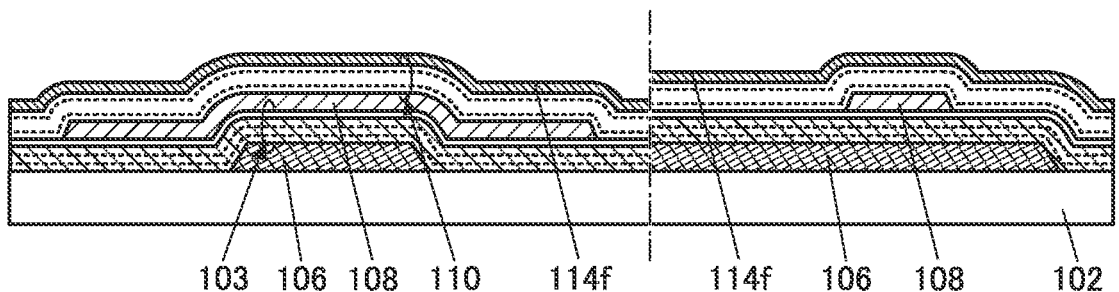
FIGS. 10A to 10D illustrate a method for manufacturing the transistor.

Then, a metal oxide film 114*f* is formed over the insulating layer 110 (FIG. 10A).

For example, the metal oxide film 114*f* is preferably formed in an atmosphere containing oxygen. In particular, the metal oxide film 114*f* is preferably formed by a sputtering method in an atmosphere containing oxygen. Thus, oxygen can be supplied to the insulating layer 110 at the time of forming the metal oxide film 114*f*.

The above description can be referred to for the case where the metal oxide film 114*f* is formed by a method similar to that of the semiconductor layer 108, i.e., by a sputtering method using an oxide target containing a metal oxide.

For example, the metal oxide film 114*f* may be formed by a reactive sputtering method using a metal target and oxygen as a formation gas. When aluminum is used for the metal target, for instance, an aluminum oxide film can be formed.

At the time of forming the metal oxide film 114*f*, a larger amount of oxygen can be supplied to the insulating layer 110 with a higher proportion of the oxygen flow rate to the total flow rate of the formation gas introduced into a deposition chamber of a deposition apparatus (i.e., with a higher oxygen flow rate ratio), or with a higher oxygen partial pressure in the deposition chamber. The oxygen flow rate ratio or the oxygen partial pressure is, for example, higher than or equal to 50% and lower than or equal to 100%, preferably higher than or equal to 65% and lower than or equal to 100%, further preferably higher than or equal to 80% and lower than or equal to 100%, still further preferably higher than or equal to 90% and lower than or equal to 100%. It is particularly preferred that the oxygen flow rate ratio be 100% and the oxygen partial pressure in the deposition chamber be as close to 100% as possible.

When the metal oxide film 114*f* is formed by a sputtering method in an atmosphere containing oxygen in the above manner, oxygen can be supplied to the insulating film 110 and release of oxygen from the insulating layer 110 can be prevented during the formation of the metal oxide film 114*f*. As a result, an extremely large amount of oxygen can be enclosed in the insulating layer 110.

After the metal oxide film 114*f* is formed, heat treatment is preferably performed. By the heat treatment, oxygen contained in the insulating layer 110 can be supplied to the semiconductor layer 108. When the heat treatment is performed while the metal oxide film 114*f* covers the insulating layer 110, oxygen can be prevented from being released from the insulating layer 110 to the outside, and a large amount of oxygen can be supplied to the semiconductor layer 108. Thus, the oxygen vacancies in the semiconductor layer 108 can be reduced, leading to a highly reliable transistor.

The above description can be referred to for the conditions of the heat treatment.

Note that the heat treatment is not necessarily performed. The heat treatment is not necessarily performed in this step, and heat treatment performed in a later step may also serve as the heat treatment in this step. In some cases, treatment at a high temperature (e.g., film formation step) or the like in a later step can serve as the heat treatment in this step.

After formation of the metal oxide film 114*f* or the heat treatment, the metal oxide film 114*f* may be removed.

<Formation of Opening 142>

Figure 10B:
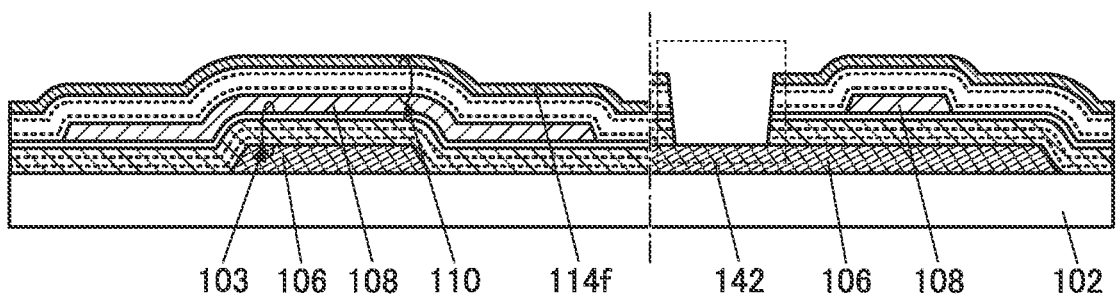

Next, the metal oxide film 114*f*, the insulating layer 110, and the insulating layer 103 are partly etched, whereby the opening 142 reaching the conductive layer 106 is formed (FIG. 10B). Accordingly, the conductive layer 112 that is to be formed later can be electrically connected to the conductive layer 106 through the opening 142.

<Formation of Conductive Layer 112 and Metal Oxide Layer 114>

Figure 10C:
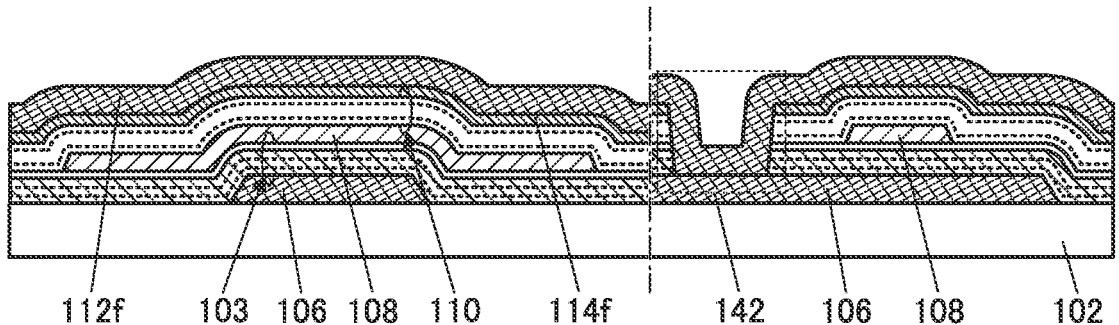

Subsequently, a conductive film 112*f* to be the conductive layer 112 is formed over the metal oxide film 114*f* (FIG. 10C).

For the conductive film 112*f*, a low-resistance metal or a low-resistance alloy material is preferably used. It is preferable that the conductive film 112*f* be formed using a material from which hydrogen is less likely to be released and in which hydrogen is less likely to be diffused. Furthermore, a material that is less likely to be oxidized is preferably used for the conductive film 112*f*.

For example, the conductive film 112*f* is preferably formed by a sputtering method using a sputtering target containing a metal or an alloy.

For example, the conductive film 112*f* is preferably a stacked-layer film including a low-resistance conductive film and a conductive film which is less likely to be oxidized and in which hydrogen is less likely to be diffused.

Next, the conductive film 112*f* and the metal oxide film 114*f* are partly etched, whereby the conductive layer 112 and the metal oxide layer 114 are formed. The conductive film 112*f* and the metal oxide film 114*f* are preferably processed using the same resist mask. Alternatively, the conductive layer 112 obtained by etching may be used as a hard mask for etching the metal oxide film 114*f*.

In particular, a wet etching method is preferably employed for etching the conductive film 112*f* and the metal oxide film 114*f*.

In such a manner, the conductive layer 112 and the metal oxide layer 114 that have substantially the same top surface shapes can be formed.

As described above, when the top surface and the side surface of the semiconductor layer 108 and the insulating layer 103 are covered with the insulating layer 110 without etching, the semiconductor layer 108 and the insulating layer 103 can be prevented from partly being etched and thinned in etching the conductive film 112*f* or the like.

<Treatment for Supplying Impurity Element>

Figure 10D:
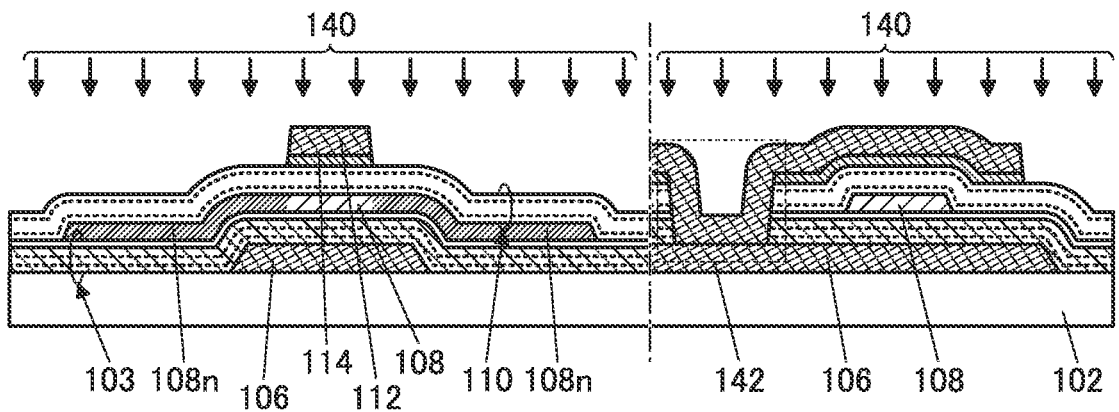

Next, treatment for supplying (adding or injecting) an impurity element 140 to the semiconductor layer 108 through the insulating layer 110 is performed with the use of the conductive layer 112 as a mask (FIG. 10D). Thus, the low-resistance regions 108n can be formed in regions of the semiconductor layer 108 that are not covered with the conductive layer 112. At this time, in a region of the semiconductor layer 108 that overlaps with the conductive layer 112, the conductive layer 112 serves as a mask and the impurity element 140 is not supplied.

A plasma ion doping method or an ion implantation method can be favorably used for supplying the impurity element 140. In the above methods, the concentration profile in the depth direction can be controlled with high accuracy by the acceleration voltage and the dose of ions, for example. The use of a plasma ion doping method can increase productivity. The use of an ion implantation method with mass separation can increase the purity of an impurity element to be supplied.

It is preferable to control the conditions of the treatment for supplying the impurity element 140 so that the interface between the semiconductor layer 108 and the insulating layer 110, a portion of the semiconductor layer 108 that is close to the interface, or a portion of the insulating layer 110 that is close to the interface has the highest concentration. Thus, the impurity element 140 can be supplied at optimal concentrations to both the semiconductor layer 108 and the insulating layer 110 in one treatment.

Examples of the impurity element 140 include hydrogen, boron, carbon, nitrogen, fluorine, phosphorus, sulfur, arsenic, aluminum, magnesium, silicon, and a rare gas. Typical examples of the rare gas include helium, neon, argon, krypton, and xenon. It is particularly preferable to use boron, phosphorus, aluminum, magnesium, or silicon.

A gas containing the above impurity element can be used as a source gas of the impurity element 140. In the case where boron is supplied, a $B_2H_6$ gas, a $BF_3$ gas, or the like can be typically used. In the case where phosphorus is supplied, a PH3 gas can be typically used. A mixed gas in which the above source gas is diluted with a rare gas may be used.

Alternatively, as the source gas, $CH_4$, $N_2$, $NH_3$, $AlH_3$, $AlCl_3$, $SiH_4$, $Si_2H_6$, $F_2$, HF, $H_2$, $(C_5H_5)_2Mg$, a rare gas, or the like can be used. An ion source is not necessarily in the form of gas; a solid or a liquid may be heated to be vaporized and used.

The addition of the impurity element 140 can be controlled by setting the conditions such as the acceleration voltage and the dose in consideration of the compositions, the densities, the thicknesses, and the like of the insulating layer 110 and the semiconductor layer 108.

In the case where boron is added by an ion implantation method or a plasma ion doping method, the acceleration voltage can be, for example, higher than or equal to 5 kV and lower than or equal to 100 kV, preferably higher than or equal to 7 kV and lower than or equal to 70 kV, further preferably higher than or equal to 10 kV and lower than or equal to 50 kV. The dose can be, for example, greater than or equal to $1 \times 10^{13}$ ions/cm$^2$ and less than or equal to $1 \times 10^{17}$ ions/cm$^2$, preferably greater than or equal to $1 \times 10^{14}$ ions/cm$^2$ and less than or equal to $5 \times 10^{16}$ ions/cm$^2$, further preferably greater than or equal to $1 \times 10^{15}$ ions/cm$^2$ and less than or equal to $3 \times 10^{16}$ ions/cm$^2$.

In the case where a phosphorus ion is added by an ion implantation method or a plasma ion doping method, the acceleration voltage can be, for example, higher than or equal to 10 kV and lower than or equal to 100 kV, preferably higher than or equal to 30 kV and lower than or equal to 90 kV, further preferably higher than or equal to 40 kV and lower than or equal to 80 kV. The dose can be, for example, greater than or equal to $1 \times 10^{13}$ ions/cm$^2$ and less than or equal to $1 \times 10^{17}$ ions/cm$^2$, preferably greater than or equal to $1 \times 10^{14}$ ions/cm$^2$ and less than or equal to $5 \times 10^{16}$ ions/cm$^2$, further preferably greater than or equal to $1 \times 10^{15}$ ions/cm$^2$ and less than or equal to $3 \times 10^{16}$ ions/cm$^2$.

Note that the method for supplying the impurity element 140 is not limited to the above methods; plasma treatment, treatment employing thermal diffusion by heating, or the like may be performed, for example. In the case of plasma treatment, an impurity element can be added using plasma generated in a gas atmosphere containing the impurity element to be added. A dry etching apparatus, an ashing apparatus, a plasma CVD apparatus, a high-density plasma CVD apparatus, or the like can be used to generate the plasma.

In one embodiment of the present invention, the impurity element 140 can be supplied to the semiconductor layer 108 through the insulating layer 110. Thus, even in the case where the semiconductor layer 108 has crystallinity, damage to the semiconductor layer 108 at the time of supplying the impurity element 140 can be reduced, so that the degradation of crystallinity can be suppressed. Therefore, this is preferable in the case where the electric resistance is increased due to a reduction in crystallinity.

<Formation of Insulating Layer 118>

Figure 11A:
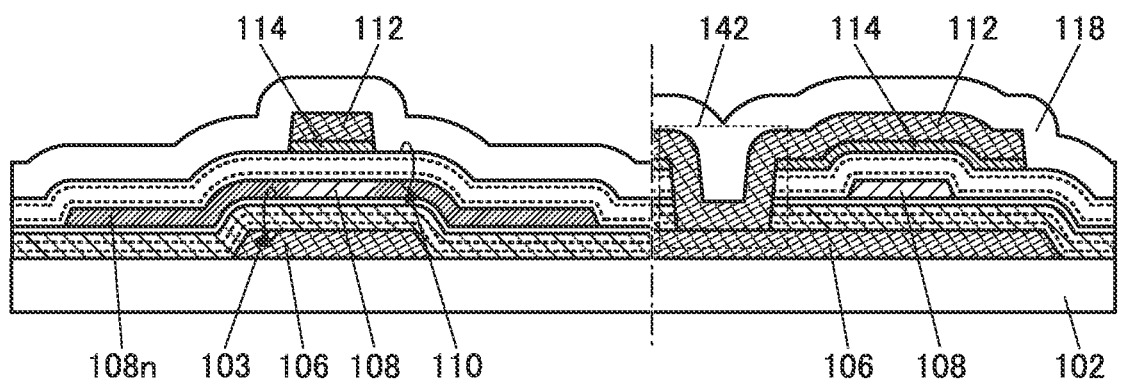
FIGS. 11A and 11B illustrate a method for manufacturing the transistor.

Next, the insulating layer 118 is formed to cover the insulating layer 110, the metal oxide layer 114, and the conductive layer 112 (FIG. 11A).

In the case where the insulating layer 118 is formed by a PECVD method at a deposition temperature too high, impurities contained in the low-resistance regions 108n and the like might be diffused into a peripheral portion including the channel formation region of the semiconductor layer 108 or the electric resistance of the low-resistance regions 108n might be increased.

Therefore, the deposition temperature of the insulating layer 118 is determined in consideration of these.

For example, the insulating layer 118 is preferably formed at a deposition temperature higher than or equal to 150° C. and lower than or equal to 400° C., further preferably higher than or equal to 180° C. and lower than or equal to 360° C., still further preferably higher than or equal to 200° C. and lower than or equal to 250° C. By forming the insulating layer 118 at a low temperature, even a transistor with a short channel length can have favorable electrical characteristics.

Heat treatment may be performed after the formation of the insulating layer 118. By the heat treatment, the low-resistance regions 108n can have low resistance more stably in some cases. For example, by heat treatment, the impurity element 140 is diffused moderately and the concentration is homogenized locally, so that the low-resistance regions 108n having an ideal concentration gradient of the impurity element can be formed. Note that when the temperature of the heat treatment is too high (e.g., higher than or equal to 500° C.), the impurity element 140 is diffused also into the channel formation region, so that electrical characteristics or reliability of the transistor might be degraded.

The above description can be referred to for the conditions of the heat treatment.

Note that the heat treatment is not necessarily performed. The heat treatment is not necessarily performed in this step, and heat treatment performed in a later step may also serve as the heat treatment in this step. In the case where treatment at a high temperature is performed in a later step (e.g., film formation step), such treatment can serve as the heat treatment in this step in some cases.

<Formation of Opening 141a and Opening 141b>

Next, the insulating layer 118 and the insulating layer 110 are partly etched, so that the opening 141a and the opening 141b reaching the low-resistance regions 108n are formed.

<Formation of Conductive Layer 120a and Conductive Layer 120b>

Figure 11B:
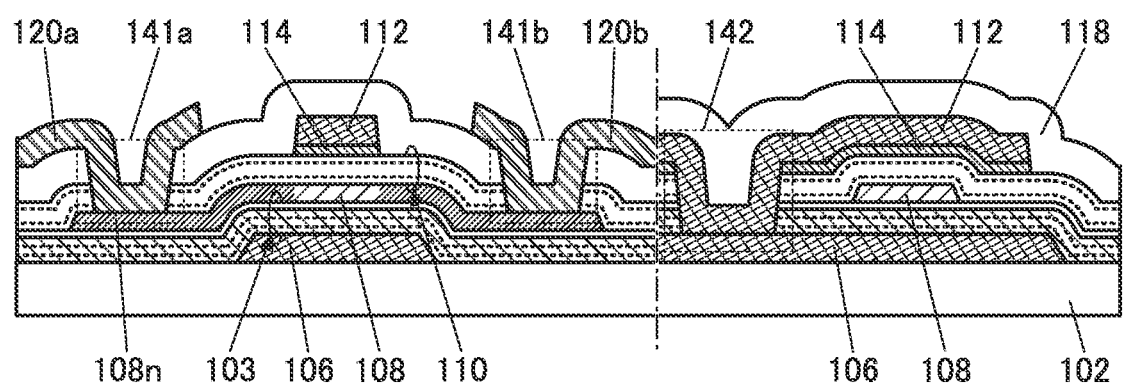

Then, a conductive film is formed over the insulating layer 118 so as to fill the openings 141a and 141b, and the conductive film is processed into desired shapes, so that the conductive layer 120a and the conductive layer 120b are formed (FIG. 11B).

Through the above steps, the transistor 100A can be manufactured. For example, in the case where the transistor 100A is used for a pixel of a display device, a step of forming at least one of a protective insulating layer, a planarization layer, a pixel electrode, and a wiring is performed after the transistor 100A is formed.

The above is the description of Manufacturing Method Example 1.

Note that in the case of manufacturing the transistor 100 described in Structure Example 2-1, the step of forming the conductive layer 106 and the step of forming the opening 142 in Manufacturing Method Example 1 are omitted. The transistor 100 and the transistor 100A can be formed over one substrate through the same process.

Manufacturing Method Example 2

A manufacturing method example that is partly different from Manufacturing Method Example 1 will be described below. Here, description will be made using the transistor 100C in Structure Example 2-4 as an example.

Note that description of the same steps as that in Manufacturing Method Example 1 is omitted and different steps are described in detail below.

Figure 12A:
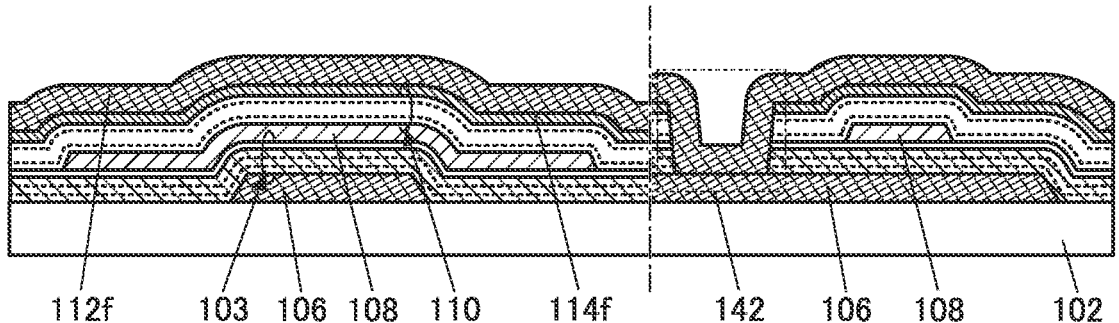
FIGS. 12A to 12D illustrate a method for manufacturing a transistor.

First, as in Manufacturing Method Example 1, the conductive layer 106, the insulating layer 103, the semiconductor layer 108, the insulating layer 110, the metal oxide film 114f, and the conductive film 112f are sequentially formed. FIG. 12A is a cross-sectional view at this stage.

Figure 12B:
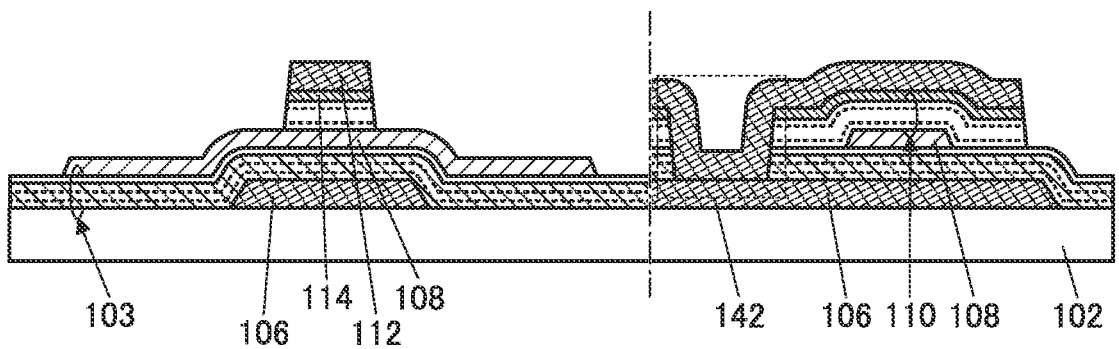

Next, the conductive film 112f and the metal oxide film 114f are partly etched to form the conductive layer 112 and the metal oxide layer 114, and the insulating layer 110 is partly etched so that part of the semiconductor layer 108 is exposed (FIG. 12B). Thus, the conductive layer 112, the metal oxide layer 114, and the insulating layer 110 that have substantially the same top surface shapes can be formed.

The insulating layer 110 is preferably etched using a resist mask for etching the conductive film 112f. The insulating layer 110 may be etched in the same step as the conductive film 112f and the metal oxide film 114f, or may be etched by a different etching method after the conductive film 112f and the metal oxide film 114f are etched.

For example, the conductive film 112f and the metal oxide film 114f are etched by a wet etching method using the same etchant, and then the insulating layer 110 can be etched by a dry etching method. In particular, when the conductive film 112f and the metal oxide film 114f are processed by a dry etching method, a generated reaction product containing a metal might lead to the contamination of the semiconductor layer 108 and the insulating layer 110. Therefore, before the insulating layer 110 is etched, the conductive film 112f and the metal oxide film 114f are preferably processed by a wet etching method.

Depending on the etching conditions, end portions of the conductive layer 112, the metal oxide layer 114, and the insulating layer 110 are not aligned with each other in some cases. For example, the end portion of at least one of the conductive layer 112 and the metal oxide layer 114 is positioned inside or outside the end portion of the insulating layer 110 in some cases.

In etching the insulating layer 110, part of the exposed semiconductor layer 108 is etched and thus thinned in some cases. In that case, the semiconductor layer 108 has a shape in which the low-resistance regions 108n are thinner than the channel formation region.

In addition, in etching the insulating layer 110, part of the insulating layer 103 that is not covered with the semiconductor layer 108 is etched and thus thinned in some cases. For example, the insulating film 103d of the insulating layer 103 might be removed.

Figure 12C:
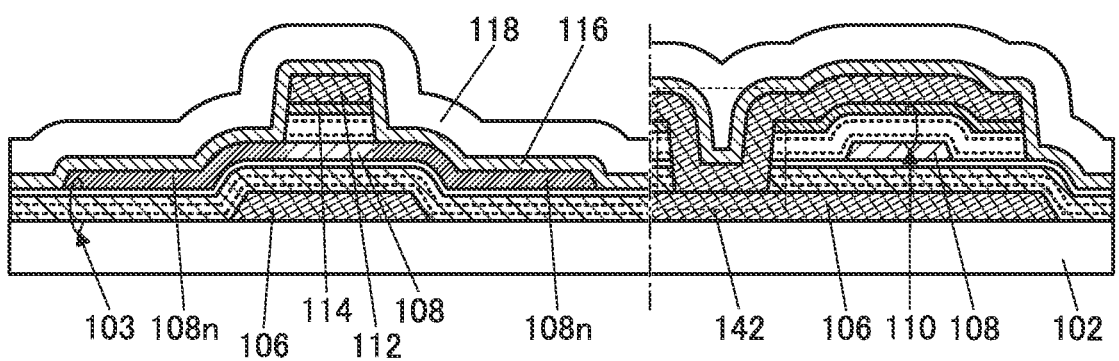

Next, the insulating layer 116 is formed in contact with the exposed part of the semiconductor layer 108, and the insulating layer 118 is successively formed (FIG. 12C). By the formation of the insulating layer 116, the resistance of the exposed part of the semiconductor layer 108 is reduced, so that the low-resistance regions 108n are formed.

As the insulating layer 116, an insulating film that releases an impurity element having a function of reducing the resistance of the semiconductor layer 108 can be used. In particular, an inorganic insulating film that can release hydrogen, such as a silicon nitride film, a silicon nitride oxide film, or a silicon oxynitride film, is preferably used. Here, a PECVD method using a formation gas containing hydrogen is preferably used because hydrogen can be supplied to the semiconductor layer 108 also in the formation of the insulating layer 116.

For example, in the case where silicon nitride is used for the insulating layer 116, it is preferable to employ a PECVD method using a mixed gas of a gas containing silicon, such as silane, and a gas containing nitrogen, such as ammonia or dinitrogen monoxide, as a formation gas. In this case, it is preferable that the formed silicon nitride film contain hydrogen. Thus, hydrogen in the insulating layer 116 is diffused into the semiconductor layer 108, whereby the resistance of part of the semiconductor layer 108 can be easily reduced.

Alternatively, an insulating film having a function of generating oxygen vacancies in the semiconductor layer 108 can be used. It is particularly preferable to use an insulating film containing a metal nitride. For example, it is preferable to employ a reactive sputtering method using a sputtering target containing a metal and, as a formation gas, a mixed gas of a nitrogen gas and a rare gas or the like that is a dilution gas. Thus, the film quality of the insulating layer 116 can be easily controlled by controlling the flow rate ratio of the formation gas.

For example, in the case where an aluminum nitride film formed by a reactive sputtering method using an aluminum target is used as the insulating layer 116, the flow rate of a nitrogen gas to the total flow rate of the formation gas is preferably higher than or equal to 30% and lower than or equal to 100%, further preferably higher than or equal to 40% and lower than or equal to 100%, still further preferably higher than or equal to 50% and lower than or equal to 100%.

Here, the insulating layer 116 and the insulating layer 118 are preferably formed successively without exposure to the air.

Heat treatment may be performed after the formation of the insulating layer 116 or the formation of the insulating layer 118. By the heat treatment, the reduction in the resistance of the low-resistance regions 108n can be promoted.

The above description can be referred to for the conditions of the heat treatment.

Note that the heat treatment is not necessarily performed. The heat treatment is not necessarily performed in this step, and heat treatment performed in a later step may also serve as the heat treatment in this step. In some cases, treatment at a high temperature (e.g., film formation step) or the like in a later step can serve as the heat treatment in this step.

Next, the opening 141a and the opening 141b reaching the low-resistance regions 108n are formed in the insulating layer 118 and the insulating layer 116.

Figure 12D:
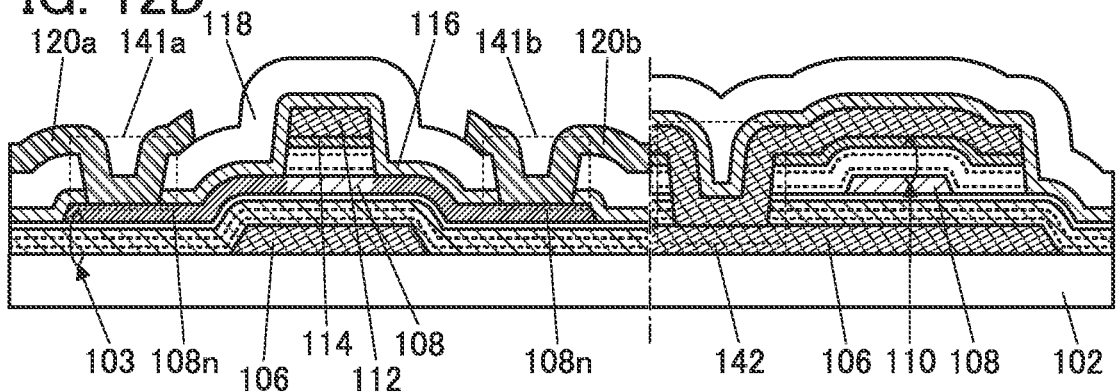

Next, as in Manufacturing Method Example 1, the conductive layer 120a and the conductive layer 120b are formed over the insulating layer 118 (FIG. 12D).

Through the above steps, the transistor 100C can be manufactured.

Note that in the case of manufacturing the transistor 100B described in Structure Example 2-3, the step of forming the conductive layer 106 and the step of forming the opening 142 in Manufacturing Method Example 2 are omitted. The transistor 100B and the transistor 100C can be formed over one substrate through the same process.

[Components of Semiconductor Device]

Components of the semiconductor device of this embodiment will be described below.

<Substrate>

There is no particular limitation on the properties of a material and the like of the substrate 102 as long as the material has heat resistance enough to withstand at least heat treatment to be performed later. For example, a single crystal semiconductor substrate or a polycrystalline semiconductor substrate of silicon or silicon carbide, a compound semiconductor substrate of silicon germanium or the like, an SOI substrate, a glass substrate, a ceramic substrate, a quartz substrate, or a sapphire substrate may be used as the substrate 102. Alternatively, any of these substrates provided with a semiconductor element may be used as the substrate 102.

A flexible substrate may be used as the substrate 102, and a semiconductor device may be provided directly on the flexible substrate. A separation layer may be provided between the substrate 102 and the semiconductor device. The separation layer can be used when part or the whole of a semiconductor device formed over the separation layer is separated from the substrate 102 and transferred onto another substrate. In such a case, the semiconductor device can be transferred onto a substrate having low heat resistance or a flexible substrate as well.

<Conductive Film>

The conductive layer 112 and the conductive layer 106 serving as gate electrodes, the conductive layer 120a serving as one of a source electrode and a drain electrode, and the conductive layer 120b serving as the other of the source electrode and the drain electrode can each be formed using a metal element selected from chromium, copper, aluminum, gold, silver, zinc, molybdenum, tantalum, titanium, tungsten, manganese, nickel, iron, and cobalt; an alloy including any of these metal elements as its component; an alloy including a combination of any of these metal elements; or the like.

The conductive layers 112, 106, 120a, and 120b can each be formed using an oxide conductor or a metal oxide film, such as an In—Sn oxide, an In—W oxide, an In—W—Zn oxide, an In—Ti oxide, an In—Ti—Sn oxide, an In—Zn oxide, an In—Sn—Si oxide, or an In—Ga—Zn oxide.

Here, an oxide conductor (OC) is described. For example, when oxygen vacancies are formed in a metal oxide having semiconductor characteristics and hydrogen is added to the oxygen vacancies, a donor level is formed in the vicinity of the conduction band. As a result, the conductivity of the metal oxide is increased, and thus, the metal oxide becomes a conductor. The metal oxide having become a conductor can be referred to as an oxide conductor.

The conductive layer 112 or the like may have a stacked-layer structure of a conductive film containing the above-described oxide conductor (metal oxide) and a conductive film containing a metal or an alloy. The use of the conductive film containing a metal or an alloy can reduce the wiring resistance. At this time, the conductive film in contact with the insulating layer serving as a gate insulating film is preferably a conductive film containing an oxide conductor.

Among the above-mentioned metal elements, any one or more elements selected from titanium, tungsten, tantalum, and molybdenum are particularly preferably contained in the conductive layers 112, 106, 120a, and 120b. It is especially preferable to use a tantalum nitride film. The tantalum nitride film has a conductivity and a high barrier property against copper, oxygen, or hydrogen, and releases a small amount of hydrogen, and thus can be favorably used as a conductive film in contact with the semiconductor layer 108 or a conductive film near the semiconductor layer 108.

<Semiconductor Layer>

When the semiconductor layer 108 is an In-M-Zn oxide, as the atomic ratio of metal elements in a sputtering target used for formation of the In-M-Zn oxide, In:M:Zn=1:1:1, In:M:Zn =1:1:1.2, In:M:Zn=1:3:2, In:M:Zn=1:3:4, In:M:Zn=1:3:6, In:M:Zn=2:2:1, In:M:Zn=2:1:3, In:M:Zn=3:1:2, In:M:Zn=4:2:3, In:M:Zn=4:2:4.1, In:M:Zn=5:1:6, In:M:Zn=5:1:7, In:M:Zn =5:1:8, In:M:Zn=6:1:6, In:M:Zn=5:2:5, or the like is given.

The sputtering target preferably contains a polycrystalline oxide, in which case the semiconductor layer 108 having crystallinity is easily formed. Note that the atomic ratio of the metal elements in the formed semiconductor layer 108 varies in the range of ±40% from any of the above atomic ratios of the metal elements of the sputtering target. For example, when a sputtering target with an atomic ratio of In:Ga:Zn=4:2:4.1 is used to form the semiconductor layer 108, the atomic ratio of the formed semiconductor layer 108 may sometimes be 4:2:3 or in the neighborhood thereof.

Note that the atomic ratio of In:Ga:Zn=4:2:3 or in the neighborhood thereof includes the case where, when In is 4, Ga is greater than or equal to 1 and less than or equal to 3 and Zn is greater than or equal to 2 and less than or equal to 4. The atomic ratio of In:Ga:Zn=5:1:6 or in the neighborhood thereof includes the case where, when In is 5, Ga is greater than 0.1 and less than or equal to 2 and Zn is greater than or equal to 5 and less than or equal to 7. The atomic ratio of In:Ga:Zn=1:1:1 or in the neighborhood thereof includes the case where, when In is 1, Ga is greater than 0.1 and less than or equal to 2 and Zn is greater than 0.1 and less than or equal to 2.

The energy gap of the semiconductor layer 108 is 2 eV or more, preferably 2.5 eV or more. Thus, with the use of a metal oxide having a wider energy gap than silicon, the off-state current of the transistor can be reduced.

The semiconductor layer 108 preferably has a non-single-crystal structure. The non-single-crystal structure includes, for example, a CAAC structure which is described later, a polycrystalline structure, a microcrystalline structure, and an amorphous structure. Among the non-single-crystal structures, the amorphous structure has the highest density of defect states, whereas the CAAC structure has the lowest density of defect states.

A c-axis aligned crystal (CAAC) will be described below. A CAAC refers to an example of a crystal structure.

Note that the CAAC structure is a crystal structure of a thin film or the like that has a plurality of nanocrystals (crystal regions each of which has a maximum diameter of less than 10 nm). The nanocrystals each have c-axis alignment in a particular direction. The nanocrystals each have neither a-axis alignment nor b-axis alignment, and have continuous crystal connection without a grain boundary in the a-axis and b-axis directions. In particular, in a thin film having the CAAC structure, the c-axes of nanocrystals are likely to be aligned in the film thickness direction, the normal direction of the surface where the thin film is formed, or the normal direction of the surface of the thin film.

A c-axis aligned crystal oxide semiconductor (CAAC-OS) is an oxide semiconductor with high crystallinity. On the other hand, in the CAAC-OS, a clear grain boundary cannot be observed; thus, a reduction in electron mobility due to the grain boundary is less likely to occur. Entry of impurities, formation of defects, or the like might decrease the crystallinity of an oxide semiconductor. This means that the CAAC-OS can be referred to as an oxide semiconductor having small amounts of impurities and defects (e.g., oxygen vacancies). Thus, an oxide semiconductor including a CAAC-OS is physically stable. Therefore, the oxide semiconductor including a CAAC-OS is resistant to heat and has high reliability.

Here, in crystallography, a general way of choosing a unit cell formed with three axes (crystal axes) of the a-axis, the b-axis, and the c-axis is to choose a unit cell in which a unique axis is used as the c-axis. In particular, in the case of a crystal having a layered structure, a general way of choosing a unit cell is to choose a unit cell in which two axes parallel to the plane direction of a layer are used as the a-axis and the b-axis and an axis intersecting with the layer is used as the c-axis. Typical examples of such a crystal having a layered structure include graphite, which is classified as a hexagonal system. In a unit cell of graphite, the a-axis and the b-axis are parallel to the cleavage plane and the c-axis is orthogonal to the cleavage plane. For example, an $InGaZnO_4$ crystal having a $YbFe_2O_4$ type crystal structure, which is a layered structure, can be classified as a hexagonal system, and, in a unit cell thereof, the a-axis and the b-axis are parallel to the plane direction of the layer and the c-axis is orthogonal to the layer (i.e., orthogonal to the a-axis and the b-axis).

In an image obtained with a TEM, crystal parts cannot be found clearly in an oxide semiconductor film having a microcrystalline structure (a microcrystalline oxide semiconductor film) in some cases. In most cases, a crystal part in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or greater than or equal to 1 nm and less than or equal to 3 nm is specifically referred to as a nanocrystal (nc). An oxide semiconductor film including a nanocrystal is referred to as a nanocrystalline oxide semiconductor (nc-OS) film. In an image obtained with a TEM, a grain boundary cannot be found clearly in the nc-OS film in some cases.

In the nc-OS film, a microscopic region (e.g., a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different crystal parts in the nc-OS film. Thus, the orientation in the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than the diameter of a crystal part, a peak indicating a crystal plane does not appear. Furthermore, a halo pattern is shown in a selected-area electron diffraction pattern of the nc-OS film obtained by using an electron beam having a probe diameter larger than the diameter of a crystal part (e.g., larger than or equal to 50 nm). Meanwhile, in some cases, a circular (ring-like) region with high luminance is observed in an electron diffraction pattern (also referred to as nanobeam electron diffraction pattern) of the nc-OS film, which is obtained using an electron beam with a probe diameter close to or smaller than the diameter of a crystal part (e.g., 1 nm or larger and 30 nm or smaller), and spots are observed in the ring-like region.

The nc-OS film has a lower density of defect states than an amorphous oxide semiconductor film. Note that there is no regularity of crystal orientation between different crystal parts in the nc-OS film. Hence, the nc-OS film has a higher density of defect states than the CAAC-OS film. Thus, the nc-OS film has a higher carrier density and higher electron mobility than the CAAC-OS film in some cases. Accordingly, a transistor including the nc-OS film may have high field-effect mobility.

The nc-OS film can be formed at a smaller oxygen flow rate ratio in formation than the CAAC-OS film. The nc-OS film can also be formed at a lower substrate temperature in formation than the CAAC-OS film. For example, the nc-OS film can be formed at a relatively low substrate temperature (e.g., 130° C. or lower) or without heating of the substrate; thus, the nc-OS film is suitable for the case of using a large glass substrate, a resin substrate, or the like, and productivity can be increased.

An example of a crystal structure of a metal oxide is described. A metal oxide that is formed by a sputtering method using an In—Ga—Zn oxide target (atomic ratio of In:Ga:Zn=4:2:4.1) at a substrate temperature higher than or equal to 100° C. and lower than or equal to 130° C. is likely to have either the nc structure or the CAAC structure, or a structure in which both structures are mixed. In contrast, a metal oxide formed at a substrate temperature set at room temperature (R.T.) is likely to have the nc structure. Note that room temperature (R.T.) herein also refers to a temperature of the time when a substrate is not heated intentionally.

[Composition of Metal Oxide]

The composition of a cloud-aligned composite oxide semiconductor (CAC-OS) applicable to a transistor disclosed in one embodiment of the present invention will be described below.

Note that a CAAC refers to an example of a crystal structure, and a CAC refers to an example of a function or a material composition.

A CAC-OS or a CAC metal oxide has a conducting function in part of the material and has an insulating function in another part of the material; as a whole, the CAC-OS or the CAC metal oxide has a function of a semiconductor. In the case where the CAC-OS or the CAC metal oxide is used for an active layer of a transistor, the conducting function is to allow electrons (or holes) serving as carriers to flow, and the insulating function is to not allow electrons serving as carriers to flow. By the complementary action of the conducting function and the insulating function, the CAC-OS or the CAC metal oxide can have a switching function (on/off function).

In the CAC-OS or the CAC metal oxide, separation of the functions can maximize each function.

The CAC-OS or the CAC metal oxide includes conductive regions and insulating regions. The conductive regions have the aforementioned conducting function and the insulating regions have the aforementioned insulating function. In some cases, the conductive regions and the insulating regions in the material are separated at the nanoparticle level. In some cases, the conductive regions and the insulating regions are unevenly distributed in the material. The conductive regions are sometimes observed to be coupled in a cloud-like manner with their boundaries blurred.

In the CAC-OS or the CAC metal oxide, the conductive regions and the insulating regions each have a size greater than or equal to 0.5 nm and less than or equal to 10 nm, preferably greater than or equal to 0.5 nm and less than or equal to 3 nm and are dispersed in the material, in some cases.

The CAC-OS or the CAC metal oxide includes components having different bandgaps. For example, the CAC-OS or the CAC metal oxide includes a component having a wide gap due to the insulating region and a component having a narrow gap due to the conductive region. In the case of such a composition, carriers mainly flow in the component having a narrow gap. The component having a narrow gap complements the component having a wide gap, and carriers also flow in the component having a wide gap in conjunction with the component having a narrow gap. Therefore, in the case where the above-described CAC-OS or CAC metal oxide is used for a channel formation region of a transistor, high current drive capability in the on state of the transistor, that is, high on-state current and high field-effect mobility, can be obtained.

In other words, the CAC-OS or the CAC metal oxide can also be referred to as a matrix composite or a metal matrix composite.

The above is the description of the structure of the metal oxide.

At least part of any of the structure examples, the drawings corresponding thereto, and the like described in this embodiment can be implemented in combination with any of the other structure examples, the other drawings corresponding thereto, and the like as appropriate.

At least part of this embodiment can be implemented in combination with any of the other embodiments described in this specification as appropriate.

Embodiment 2

In this embodiment, examples of a display device that includes any of the transistors described in the above embodiment will be described.

Structure Example

FIG. 13A is a top view of a display device 700. The display device 700 includes a first substrate 701 and a second substrate 705 that are attached to each other with a sealant 712. In a region sealed with the first substrate 701, the second substrate 705, and the sealant 712, a pixel portion 702, a source driver circuit portion 704, and a gate driver circuit portion 706 are formed over the first substrate 701. In the pixel portion 702, a plurality of display elements are provided.

A flexible printed circuit (FPC) terminal portion 708 to which an FPC 716 is connected is provided in a portion of the first substrate 701 that does not overlap with the second substrate 705. The pixel portion 702, the source driver circuit portion 704, and the gate driver circuit portion 706 are supplied with a variety of signals and the like from the FPC 716 through the FPC terminal portion 708 and a signal line 710.

A plurality of gate driver circuit portions 706 may be provided. The gate driver circuit portion 706 and the source driver circuit portion 704 may be formed separately on semiconductor substrates or the like to obtain packaged IC chips. The IC chips can each be mounted on the first substrate 701 or the FPC 716.

Any of the transistors that are the semiconductor devices of embodiments of the present invention can be used as transistors included in the pixel portion 702, the source driver circuit portion 704, and the gate driver circuit portion 706.

Examples of the display element in the pixel portion 702 include a liquid crystal element and a light-emitting element. As the liquid crystal element, a transmissive liquid crystal element, a reflective liquid crystal element, a transflective liquid crystal element, or the like can be used. As the light-emitting element, a self-luminous light-emitting element such as a light-emitting diode (LED), an organic LED (OLED), a quantum-dot LED (QLED), or a semiconductor laser can be used. Alternatively, a micro electro mechanical systems (MEMS) shutter element, an optical interference type MEMS element, or a display element using a microcapsule method, an electrophoretic method, an electrowetting method, an Electronic Liquid Powder (registered trademark) method, or the like can be used as the display element.

A display device 700A illustrated in FIG. 13B is an example of a display device which includes a flexible resin layer 743 instead of the first substrate 701 and can be used as a flexible display.

In the display device 700A, the pixel portion 702 has not a rectangular shape but a shape with rounded corners. The display device 700A includes a notch portion in which part of the pixel portion 702 and part of the resin layer 743 are cut as shown in a region P1 in FIG. 13B. A pair of gate driver circuit portions 706 is provided on the opposite sides with the pixel portion 702 therebetween. The gate driver circuit portions 706 are provided along a curved outline at the corners of the pixel portion 702.

The resin layer 743 has a protrusion where the FPC terminal portion 708 is provided. Furthermore, part of the resin layer 743 that includes the FPC terminal portion 708 can be bent backward in a region P2 in FIG. 13B. When part of the resin layer 743 is bent backward, the display device 700A can be mounted on an electronic device while the FPC 716 overlaps with the back side of the pixel portion 702; thus, the electronic device can be downsized.

An IC 717 is mounted on the FPC 716 connected to the display device 700A. The IC 717 functions as a source driver circuit, for example. In this case, the source driver circuit portion 704 in the display device 700A can include at least one of a protective circuit, a buffer circuit, a demultiplexer circuit, and the like.

A display device 700B illustrated in FIG. 13C is a display device that can be favorably used for an electronic device with a large screen. For example, the display device 700B can be favorably used for a television device, a monitor device, a personal computer (including a laptop computer and a desktop computer), a tablet terminal, digital signage, or the like. [0313]

The display device 700B includes a plurality of source driver ICs 721 and a pair of gate driver circuit portions 722.

The plurality of source driver ICs 721 are attached to respective FPCs 723. In each of the plurality of FPCs 723, one of terminals is connected to the first substrate 701, and the other terminal is connected to a printed circuit board 724. By bending the FPCs 723, the printed circuit board 724 can be placed on the back side of the pixel portion 702 so that the display device 700B can be mounted on an electronic device; thus, the electronic device can be downsized.

In contrast, the gate driver circuit portions 722 are provided over the first substrate 701. Thus, an electronic device with a narrow bezel can be fabricated.

With such a structure, a large-size and high-resolution display device can be provided. For example, a display device with a screen diagonal of 30 inches or more, 40 inches or more, 50 inches or more, or 60 inches or more can be fabricated. Furthermore, a display device with extremely high resolution such as 4K2K or 8K4K can be fabricated.

[Cross-sectional Structure Example]

Figure 14:
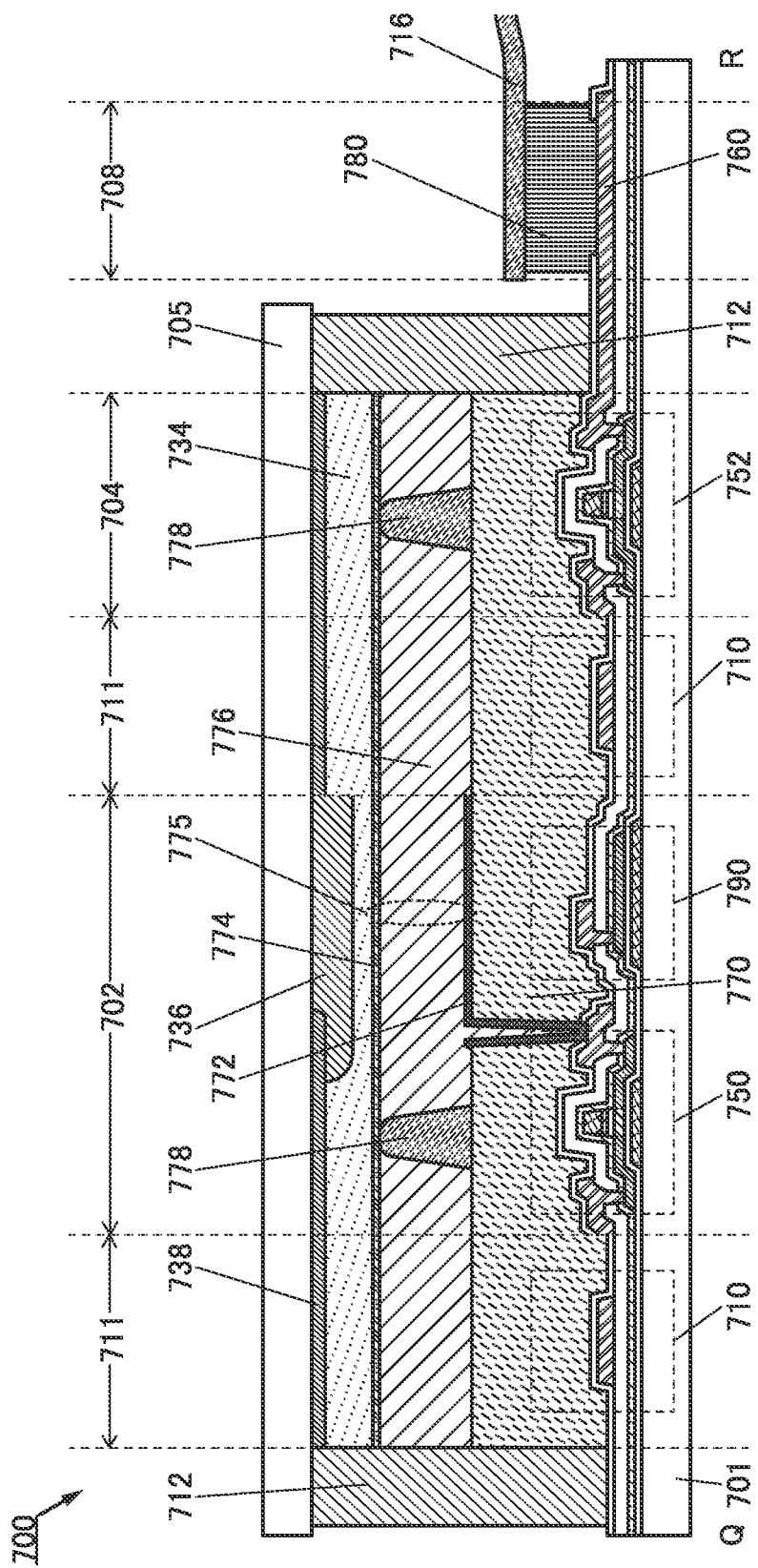
FIG. 14 is a cross-sectional view of a display device.
Figure 15:
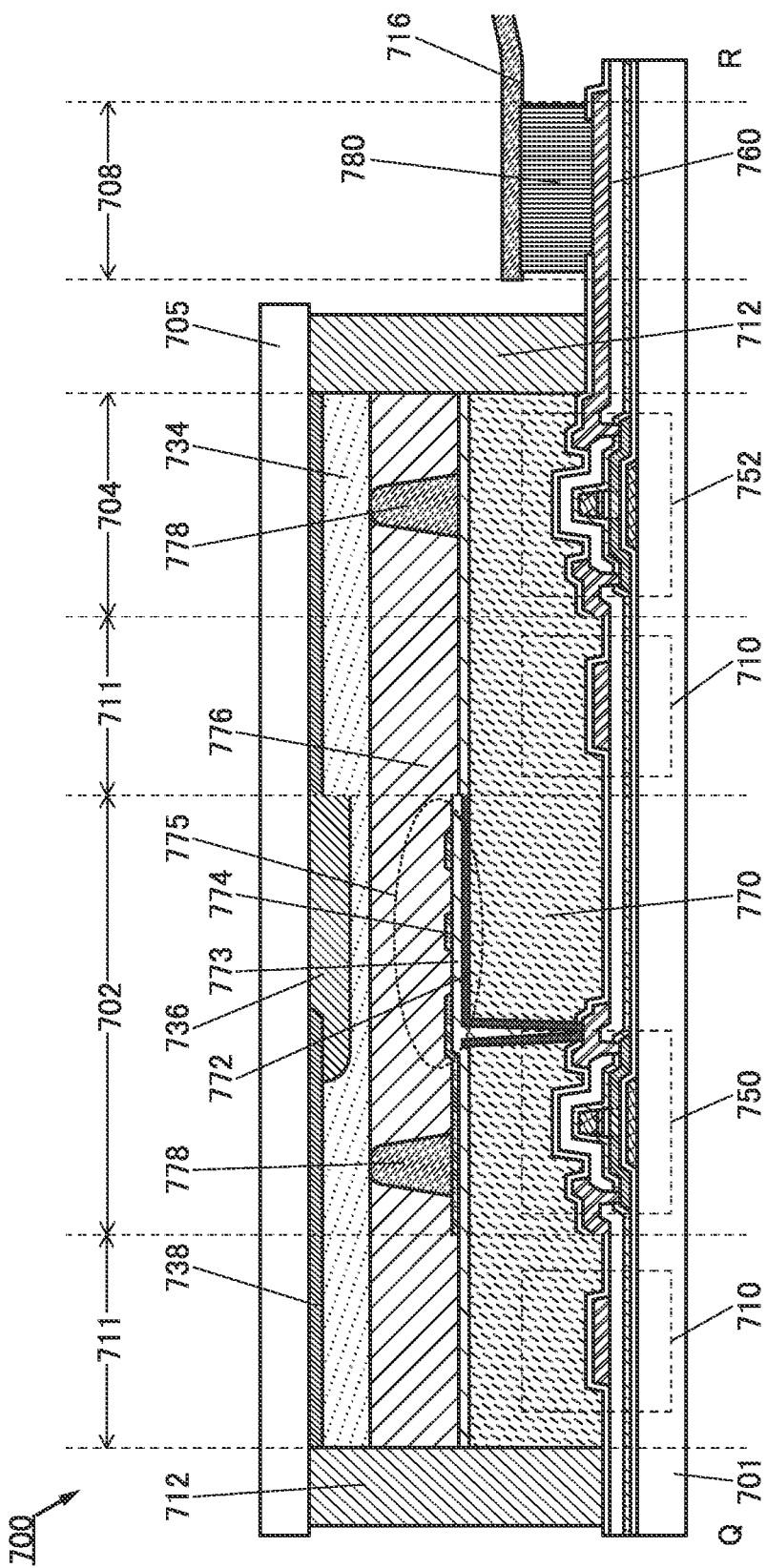
FIG. 15 is a cross-sectional view of a display device.
Figure 16:
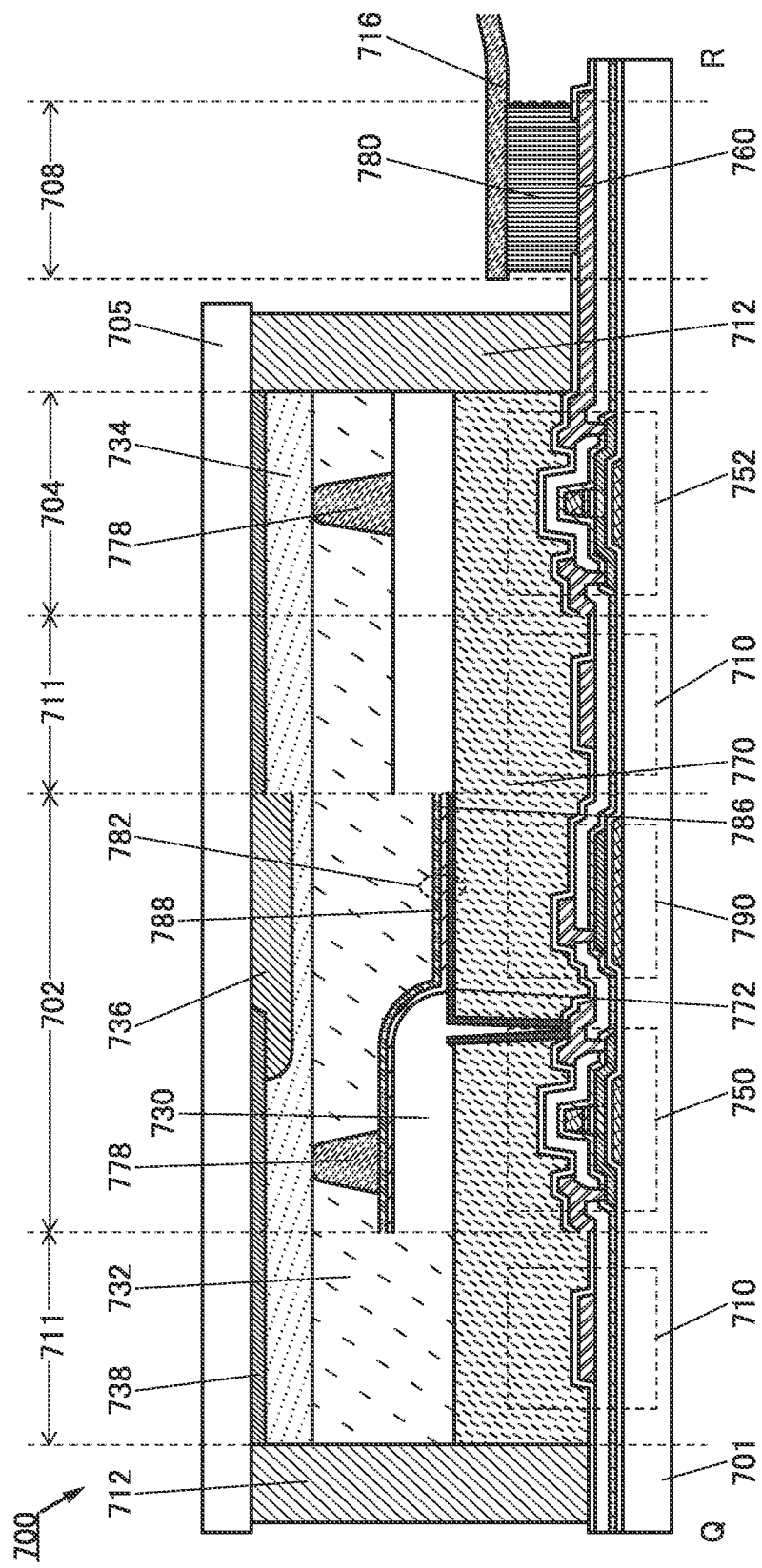
FIG. 16 is a cross-sectional view of a display device.
Figure 17:
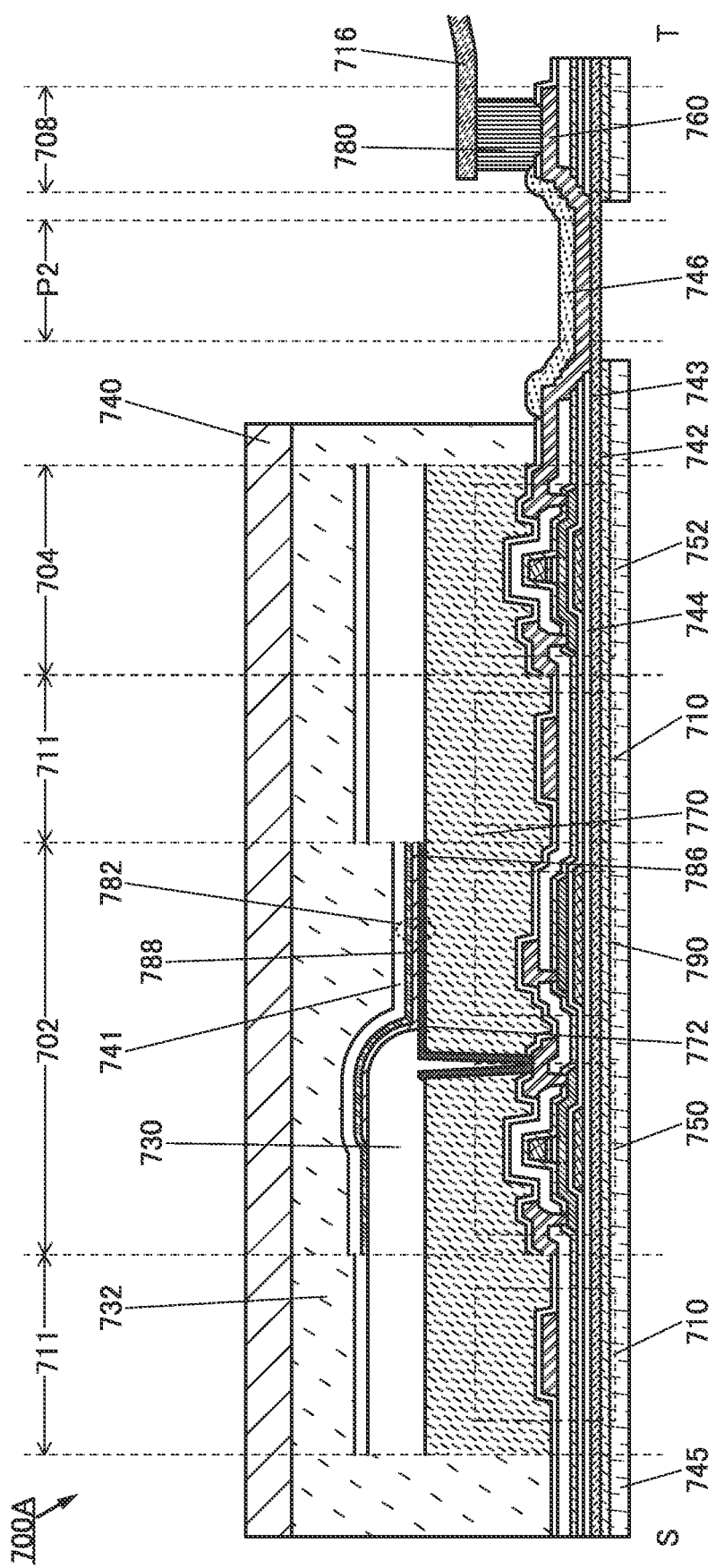
FIG. 17 is a cross-sectional view of a display device.

Structures including a liquid crystal element or an EL element as a display element will be described below with reference to FIG. 14, FIG. 15, FIG. 16, and FIG. 17. Note that FIG. 14, FIG. 15, and FIG. 16 are cross-sectional views taken along dashed-dotted line Q-R in FIG. 13A. FIG. 17 is a cross-sectional view taken along dashed-dotted line S-T in the display device 700A in FIG. 13B. FIG. 14 and FIG. 15 each illustrate a structure including a liquid crystal element as a display element, and FIG. 16 and FIG. 17 each illustrate a structure including an EL element as a display element.

<Common Components in Display Devices>

Display devices in FIG. 14, FIG. 15, FIG. 16, and FIG. 17 each include a lead wiring portion 711, the pixel portion 702, the source driver circuit portion 704, and the FPC terminal portion 708. The lead wiring portion 711 includes the signal line 710. The pixel portion 702 includes a transistor 750 and a capacitor 790. The source driver circuit portion 704 includes a transistor 752. In FIG. 15, the capacitor 790 is not provided.

As the transistors 750 and 752, any of the transistors described in Embodiment 1 can be used.

The transistor used in this embodiment includes a highly purified oxide semiconductor film in which formation of oxygen vacancies is suppressed. The transistor can have low off-state current. Accordingly, an electrical signal such as an image signal can be held for a longer period, and the interval between operations of writing an image signal or the like can be set longer. Thus, frequency of refresh operation can be reduced, which leads to lower power consumption.

In addition, the transistor used in this embodiment can have relatively high field-effect mobility and thus is capable of high-speed operation. For example, with such a high-speed transistor used for a display device, a switching transistor in a pixel portion and a driver transistor in a driver circuit portion can be formed over one substrate. That is, a driver circuit formed using a silicon wafer or the like does not need to be used, in which case the number of components of the display device can be reduced. Moreover, the use of the high-speed transistor also in the pixel portion can provide a high-quality image.

The capacitor 790 in each of FIG. 14, FIG. 16, and FIG. 17 includes a lower electrode formed by processing the same film as a film used for the first gate electrode of the transistor 750 and an upper electrode formed by processing the same metal oxide film as a film used for the semiconductor layer. The resistance of the upper electrode is reduced as well as those of a source region and a drain region of the transistor 750. Part of an insulating film functioning as a first gate insulating layer of the transistor 750 is provided between the lower electrode and the upper electrode. That is, the capacitor 790 has a stacked-layer structure in which an insulating film functioning as a dielectric film is positioned between a pair of electrodes. A wiring obtained by processing the same film as a film used for a source electrode and a drain electrode of the transistor is connected to the upper electrode.

A planarization insulating film 770 is provided over the transistor 750, the transistor 752, and the capacitor 790.

The transistor 750 in the pixel portion 702 and the transistor 752 in the source driver circuit portion 704 may have different structures. For example, a top-gate transistor may be used as one of the transistors 750 and 752, and a bottom-gate transistor may be used as the other. Note that like in the source driver circuit portion 704, a transistor having the same structure as or a different structure from the transistor 750 may be used in the gate driver circuit portion 706.

The signal line 710 is formed using the same conductive film as the source electrodes, the drain electrodes, and the like of the transistor 750 and the transistor 752. In this case, a low-resistance material such as a material containing a copper element is preferably used because signal delay or the like due to the wiring resistance can be reduced and display on a large screen is possible.

The FPC terminal portion 708 includes a wiring 760 part of which functions as a connection electrode, an anisotropic conductive film 780, and the FPC 716. The wiring 760 is electrically connected to a terminal included in the FPC 716 through the anisotropic conductive film 780. The wiring 760 is formed using the same conductive film as the source electrodes, the drain electrodes, and the like of the transistor 750 and the transistor 752.

As the first substrate 701 and the second substrate 705, a glass substrate or a flexible substrate such as a plastic substrate can be used, for example. In the case where a flexible substrate is used as the first substrate 701, an insulating layer having a barrier property against water or hydrogen is preferably provided between the first substrate 701 and the transistor 750, for example.

A light-blocking film 738, a coloring film 736, and an insulating film 734 in contact with these films are provided on the second substrate 705 side.

<Structure Exampleof Display Device Including Liquid Crystal Element>

The display device 700 illustrated in FIG. 14 includes a liquid crystal element 775. The liquid crystal element 775 includes a conductive layer 772, a conductive layer 774, and a liquid crystal layer 776 therebetween. The conductive layer 774 is provided on the second substrate 705 side and functions as a common electrode. The conductive layer 772 is electrically connected to the source electrode or the drain electrode of the transistor 750. The conductive layer 772 is formed over the planarization insulating film 770 and functions as a pixel electrode.

A material that transmits visible light or a material that reflects visible light can be used for the conductive layer 772. As a light-transmitting material, for example, an oxide material including indium, zinc, tin, or the like is preferably used. As a reflective material, for example, a material including aluminum, silver, or the like is preferably used.

When a reflective material is used for the conductive layer 772, the display device 700 is a reflective liquid crystal display device. When a light-transmitting material is used for the conductive layer 772, the display device 700 is a transmissive liquid crystal display device. For a reflective liquid crystal display device, a polarizing plate is provided on the viewer side. On the other hand, for a transmissive liquid crystal display device, a pair of polarizing plates is provided so that the liquid crystal element is placed therebetween.

The display device 700 in FIG. 15 is an example of employing the liquid crystal element 775 of a horizontal electric field mode (e.g., an FFS mode). The conductive layer 774 functioning as a common electrode is provided over the conductive layer 772 with an insulating layer 773 therebetween. An electric field generated between the conductive layer 772 and the conductive layer 774 can control the alignment state in the liquid crystal layer 776.

In FIG. 15, a storage capacitor can be formed with a stack of the conductive layer 774, the insulating layer 773, and the conductive layer 772. Therefore, another capacitor is not necessarily provided, and thus the aperture ratio can be increased.

Although not illustrated in FIG. 14 and FIG. 15, an alignment film in contact with the liquid crystal layer 776 may be provided. Furthermore, an optical member (an optical substrate) such as a polarizing member, a retardation member, or an anti-reflection member, and a light source such as a backlight or a sidelight can be provided as appropriate.

For the liquid crystal layer 776, a thermotropic liquid crystal, a low-molecular liquid crystal, a high-molecular liquid crystal, a polymer dispersed liquid crystal (PDLC), a polymer network liquid crystal (PNLC), a ferroelectric liquid crystal, an anti-ferroelectric liquid crystal, or the like can be used. In the case of employing a horizontal electric field mode, a liquid crystal exhibiting a blue phase for which an alignment film is unnecessary may be used.

The following can be used as a mode of the liquid crystal element: a twisted nematic (TN) mode, a vertical alignment (VA) mode, an in-plane-switching (IPS) mode, a fringe field switching (FFS) mode, an axially symmetric aligned microcell (ASM) mode, an optically compensated birefringence (OCB) mode, an electrically controlled birefringence (ECB) mode, a guest-host mode, or the like.

In addition, a scattering liquid crystal employing a polymer dispersed liquid crystal, a polymer network liquid crystal, or the like can be used for the liquid crystal layer 776. At this time, monochrome image display may be performed without the coloring film 736, or color display may be performed using the coloring film 736.

As a method for driving the liquid crystal element, a time-division display method (also referred to as a field sequential driving method) in which color display is performed on the basis of a successive additive color mixing method may be employed. In that case, the coloring film 736 can be omitted. In the case of employing the time-division display method, the aperture ratio of each pixel or the resolution can be increased because subpixels that emit light of, for example, red (R), green (G), and blue (B), are not necessarily provided.

<Display Device Including Light-Emitting Element>

The display device 700 illustrated in FIG. 16 includes a light-emitting element 782. The light-emitting element 782 includes the conductive layer 772, an EL layer 786, and a conductive film 788. The EL layer 786 contains a light-emitting material such as an organic compound or an inorganic compound.

As the light-emitting material, a fluorescent material, a phosphorescent material, a thermally activated delayed fluorescent (TADF) material, an inorganic compound (e.g., a quantum dot material), or the like can be used.

In the display device 700 in FIG. 16, an insulating film 730 covering part of the conductive layer 772 is provided over the planarization insulating film 770. The light-emitting element 782 is a top-emission light-emitting element, which includes the light-transmitting conductive film 788. Note that the light-emitting element 782 may have a bottom-emission structure in which light is emitted to the conductive layer 772 side, or a dual-emission structure in which light is emitted to both the conductive layer 772 side and the conductive film 788 side.

The coloring film 736 is provided to overlap with the light-emitting element 782. The light-blocking film 738 is provided in the lead wiring portion 711, the source driver circuit portion 704, and a position overlapping with the insulating film 730. The coloring film 736 and the light-blocking film 738 are covered with the insulating film 734. A space between the light-emitting element 782 and the insulating film 734 is filled with a sealing film 732. Note that the coloring film 736 is not necessarily provided when the EL layer 786 is formed into an island shape for each pixel or into a stripe shape for each pixel column, i.e., the EL layer 786 is formed by separate coloring.

FIG. 17 illustrates a structure of a display device favorably applicable to a flexible display. FIG. 17 is a cross-sectional view taken along the dashed-dotted line S-T in the display device 700A in FIG. 13B.

The display device 700A in FIG. 17 has a structure in which a support substrate 745, a bonding layer 742, the resin layer 743, and an insulating layer 744 are stacked instead of the first substrate 701 in FIG. 16. The transistor 750, the capacitor 790, and the like are provided over the insulating layer 744 over the resin layer 743.

The support substrate 745 includes an organic resin, glass, or the like and is thin enough to have flexibility. The resin layer 743 is a layer containing an organic resin such as polyimide or acrylic. The insulating layer 744 includes an inorganic insulating film of silicon oxide, silicon oxynitride, silicon nitride, or the like. The resin layer 743 and the support substrate 745 are attached to each other with the bonding layer 742. The resin layer 743 is preferably thinner than the support substrate 745.

The display device 700A in FIG. 17 includes a protective layer 740 instead of the second substrate 705 in FIG. 16. The protective layer 740 is attached to the sealing film 732. A glass substrate, a resin film, or the like can be used as the protective layer 740. Alternatively, as the protective layer 740, an optical member such as a polarizing plate or a scattering plate, an input device such as a touch sensor panel, or a structure in which two or more of the optical members and the input devices are stacked may be employed.

The EL layer 786 included in the light-emitting element 782 is provided over the insulating film 730 and the conductive layer 772 in an island shape. The EL layers 786 are formed separately so that respective subpixels emit light of different colors, whereby color display can be performed without the coloring film 736. A protective layer 741 is provided to cover the light-emitting element 782. The protective layer 741 has a function of preventing diffusion of impurities such as water into the light-emitting element 782.

The protective layer 741 is preferably formed using an inorganic insulating film. The protective layer 741 further preferably has a stacked-layer structure including one or more inorganic insulating films and one or more organic insulating films.

FIG. 17 shows the region P2 that can be bent. The region P2 includes a portion where the support substrate 745, the bonding layer 742, and the inorganic insulating film such as the insulating layer 744 are not provided. In the region P2, a resin layer 746 is provided to cover the wiring 760. When an inorganic insulating film is not provided if possible in the region P2 that can be bent and only a conductive layer containing a metal or an alloy and a layer containing an organic material are stacked, generation of cracks caused at bending can be prevented. When the support substrate 745 is not provided in the region P2, part of the display device 700A can be bent with an extremely small radius of curvature.

<Structure Exampleof Display Device Provided with Input Device>

An input device may be provided in the display device 700 or the display device 700A illustrated in FIG. 14, FIG. 15, FIG. 16, or FIG. 17. An example of the input device includes a touch sensor.

For example, a variety of types such as a capacitive type, a resistive type, a surface acoustic wave type, an infrared type, an optical type, and a pressure-sensitive type can be used for the sensor. Alternatively, two or more of these types may be combined.

Examples of the touch panel include an in-cell touch panel in which an input device is provided between a pair of substrates, an on-cell touch panel in which an input device is formed over the display device 700, and an out-cell touch panel in which an input device is attached to the display device 700.

At least part of any of the structure examples, the drawings corresponding thereto, and the like described in this embodiment can be implemented in combination with any of the other structure examples, the other drawings corresponding thereto, and the like as appropriate.

At least part of this embodiment can be implemented in combination with any of the other embodiments described in this specification as appropriate.

Embodiment 3

In this embodiment, a display device that includes a semiconductor device of one embodiment of the present invention will be described with reference to FIGS. 18A to 18C.

Figure 18A:
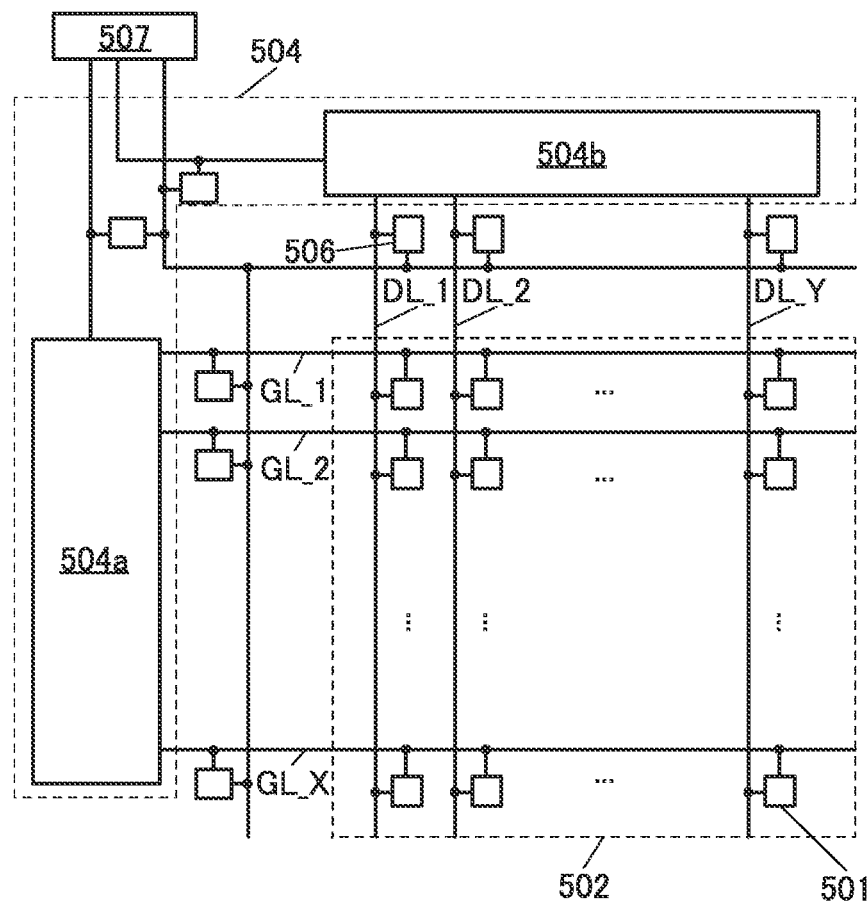
FIG. 18A is a block diagram of a display device.

A display device in FIG. 18A includes a pixel portion 502, a driver circuit portion 504, a protective circuit 506, and a terminal portion 507. Note that the protective circuit 506 is not necessarily provided.

The transistor of one embodiment of the present invention can be used as a transistor included in the pixel portion 502 or the driver circuit portion 504. The transistor of one embodiment of the present invention may also be used in the protective circuit 506.

The pixel portion 502 includes a plurality of pixel circuits 501 that drives a plurality of display elements arranged in X rows and Y columns (X and Y independently represent a natural number of 2 or more).

The driver circuit portion 504 includes driver circuits such as a gate driver 504a that outputs a scan signal to gate lines GL_1 to GL_X and a source driver 504b that supplies a data signal to data lines DL_1 to DL Y. The gate driver 504a includes at least a shift register. The source driver 504b is formed using a plurality of analog switches, for example. The source driver 504b may include a shift register or the like.

The terminal portion 507 is a portion having terminals for inputting power, control signals, image signals, and the like to the display device from external circuits.

The protective circuit 506 is a circuit that electrically connects a wiring connected to the protective circuit to another wiring when a potential out of a certain range is applied to the wiring connected to the protective circuit. The protective circuit 506 in FIG. 18A is connected to wirings such as the gate line GL between the gate driver 504a and the pixel circuit 501 and the data line DL between the source driver 504b and the pixel circuit 501, for example.

The gate driver 504a and the source driver 504b may each be provided over a substrate over which the pixel portion 502 is provided, or a substrate over which a gate driver circuit or a source driver circuit is formed (e.g., a driver circuit board formed using a single crystal semiconductor film or a polycrystalline semiconductor film) may be mounted on the substrate over which the pixel portion 502 is provided, by COG or tape automated bonding (TAB).

Figure 18B:
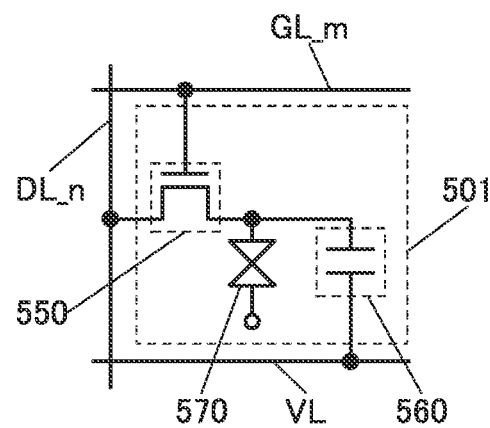
FIGS. 18B and 18C are circuit diagrams of the display devices.
Figure 18C:
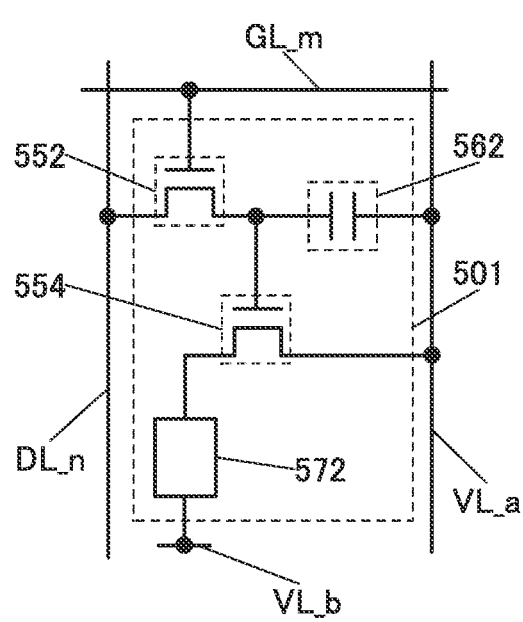

Each of the plurality of pixel circuits 501 in FIG. 18A can have a structure illustrated in FIG. 18B or 18C, for example.

The pixel circuit 501 illustrated in FIG. 18B includes a liquid crystal element 570, a transistor 550, and a capacitor 560. The pixel circuit 501 is connected to the data line DL_n, the gate line GL_m, a potential supply line VL, and the like.

The potential of one of a pair of electrodes of the liquid crystal element 570 is set in accordance with the specifications of the pixel circuit 501 as appropriate. The alignment state of the liquid crystal element 570 depends on written data. A common potential may be supplied to one of the pair of electrodes of the liquid crystal element 570 included in each of the plurality of pixel circuits 501. The potential supplied to the one of the pair of electrodes of the liquid crystal element 570 in the pixel circuit 501 may differ between rows.

The pixel circuit 501 illustrated in FIG. 18C includes a transistor 552, a transistor 554, a capacitor 562, and a light-emitting element 572. The pixel circuit 501 is connected to the data line DL_n, the gate line GL_m, a potential supply line VL_a, a potential supply line VL_b, and the like.

Note that a high power supply potential VDD is supplied to one of the potential supply line VL_a and the potential supply line VL_b, and a low power supply potential VSS is supplied to the other. The current flowing through the light-emitting element 572 is controlled in accordance with a potential supplied to a gate of the transistor 554, whereby the luminance of light emitted from the light-emitting element 572 is controlled.

At least part of any of the structure examples, the drawings corresponding thereto, and the like described in this embodiment can be implemented in combination with any of the other structure examples, the other drawings corresponding thereto, and the like as appropriate.

At least part of this embodiment can be implemented in combination with any of the other embodiments described in this specification as appropriate.

Embodiment 4

A pixel circuit including a memory for correcting gray levels displayed by pixels and a display device including the pixel circuit will be described below. Any of the transistors described in Embodiment 1 can be used as a transistor used in the pixel circuit described below.

[Circuit Configuration]

Figure 19A:
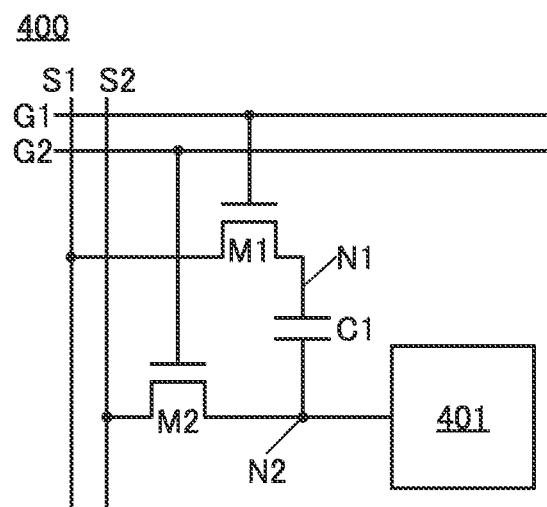
FIGS. 19A, 19C, and 19D are circuit diagrams of display devices.

FIG. 19A is a circuit diagram of a pixel circuit 400. The pixel circuit 400 includes a transistor M1, a transistor M2, a capacitor C1, and a circuit 401. The pixel circuit 400 is connected to a wiring S1, a wiring S2, a wiring G1, and a wiring G2.

A gate of the transistor M1 is connected to the wiring G1, one of a source and a drain of the transistor M1 is connected to the wiring S1, and the other of the source and the drain of the transistor M1 is connected to one electrode of the capacitor C1. A gate of the transistor M2 is connected to the wiring G2, one of a source and a drain of the transistor M2 is connected to the wiring S2, and the other of the source and the drain of the transistor M2 is connected to the other electrode of the capacitor C1 and the circuit 401.

The circuit 401 includes at least one display element. A variety of display elements can be used, and a light-emitting element such as an organic EL element or an LED element, a liquid crystal element, or an MEMS element can be typically used.

Anode where the transistor M1 and the capacitor C1 are connected is referred to as a node N1, and a node where the transistor M2 and the circuit 401 are connected is referred to as a node N2.

In the pixel circuit 400, when the transistor M1 is turned off, the potential of the node N1 can be held. Furthermore, when the transistor M2 is turned off, the potential of the node N2 can be held. A predetermined potential is written to the node N1 through the transistor M1 while the transistor M2 is off, whereby the potential of the node N2 can be changed in accordance with a change in the potential of the node N1 by capacitive coupling through the capacitor C1.

Here, the transistor using an oxide semiconductor in Embodiment 1 can be used as one or both of the transistor M1 and the transistor M2. Accordingly, the potential of the node N1 or the node N2 can be held for a long time owing to an extremely low off-state current. Note that a transistor using a semiconductor such as silicon may be used in the case where the potential of each node is held for a short time (specifically, in the case where the frame frequency is 30 Hz or more, for example).

[Driving Method Example]

Figure 19B:
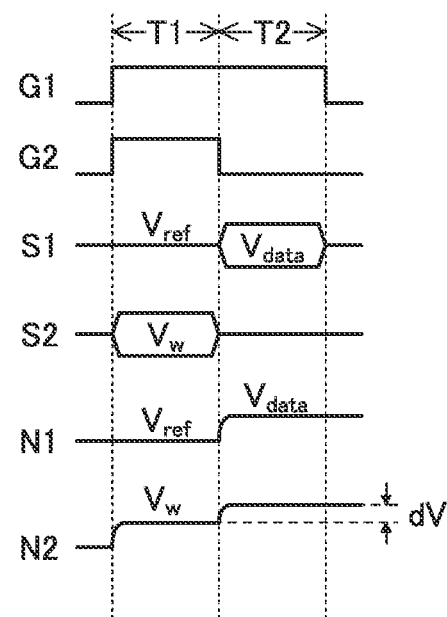
FIG. 19B is a timing chart.

Next, an example of a method for operating the pixel circuit 400 is described with reference to FIG. 19B. FIG. 19B is a timing chart showing operation of the pixel circuit 400. Note that, for easy description, the influences of various kinds of resistance such as wiring resistance, parasitic capacitance of a transistor, a wiring, and the like, the threshold voltage of a transistor, and the like are not taken into consideration.

In the operation shown in FIG. 19B, one frame period is divided into a period T1 and a period T2. The period T1 is a period in which a potential is written to the node N2, and the period T2 is a period in which a potential is written to the node N1.

<Period T1>

In the period T1, potentials for turning on the transistors are supplied to the wiring G1 and the wiring G2. A potential Vref that is a fixed potential is supplied to the wiring S1 and a first data potential $V_w$ is supplied to the wiring S2.

The potential $V_{ref}$ is supplied to the node N1 from the wiring S1 through the transistor M1. The first data potential $V_w$ is supplied to the node N2 through the transistor M2. Thus, a potential difference $V_w$-$V_{ref}$ is held in the capacitor C1.

<Period T2>

Then, in the period T2, the potential for turning on the transistor M1 is supplied to the wiring G1, and a potential for turning off the transistor M2 is supplied to the wiring G2. A second data potential $V_{data}$ is supplied to the wiring S1. The wiring S2 may be supplied with a predetermined constant potential or brought into a floating state.

The second data potential $V_{data}$ is supplied to the node N1 through the transistor M1. At this time, the potential of the node N2 changes only by a potential dV in accordance with the second data potential $V_{data}$ due to capacitive coupling by the capacitor C1. That is, a potential of the sum of the first data potential $V_w$ and the potential dV is input to the circuit 401. Although the potential dV is a positive value in FIG. 19B, the potential dV may be a negative value. In other words, the second data potential $V_{data}$ may be lower than the potential $V_{ref}$.

Here, the potential dV is mainly determined by the capacitance value of the capacitor C1 and the capacitance value of the circuit 401. When the capacitance value of the capacitor C1 is much higher than the capacitance value of the circuit 401, the potential dV is close to the second data potential $V_{data}$.

As described above, the pixel circuit 400 can generate a potential supplied to the circuit 401 including the display element by combination of two kinds of data signals, so that gray levels can be corrected in the pixel circuit 400.

The pixel circuit 400 can also generate a potential exceeding the maximum potential that the source driver connected to the wiring S1 and the wiring S2 can supply. For example, in the case of using a light-emitting element, high-dynamic-range (HDR) display or the like can be performed. In the case of using a liquid crystal element, overdriving or the like can be performed.

[Application Example]

<Example Using Liquid Crystal Element>

Figure 19C:
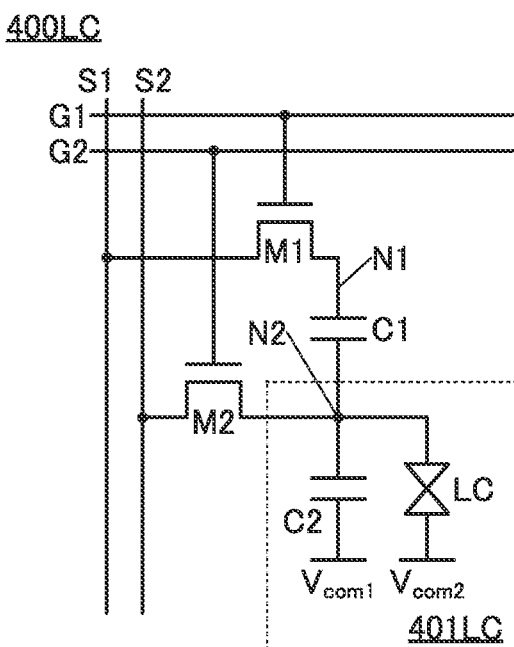

A pixel circuit 400LC illustrated in FIG. 19C includes a circuit 401LC. The circuit 401LC includes a liquid crystal element LC and a capacitor C2.

One electrode of the liquid crystal element LC is connected to the node N2 and one electrode of the capacitor C2, and the other electrode of the liquid crystal element LC is connected to a wiring to which a potential $V_{com2}$ is supplied. The other electrode of the capacitor C2 is connected to a wiring to which a potential $V_{com1}$ is supplied.

The capacitor C2 functions as a storage capacitor. Note that the capacitor C2 is not necessarily provided.

Since a high voltage can be supplied to the liquid crystal element LC in the pixel circuit 400LC, high-speed display by overdriving, use of a liquid crystal material with a high drive voltage, or the like are possible, for example. In addition, a correction signal is supplied to the wiring S1 or the wiring S2, whereby gray levels can be corrected in accordance with an operating temperature, a deterioration level of the liquid crystal element LC, or the like.

<Example Using Light-Emitting Element>

Figure 19D:
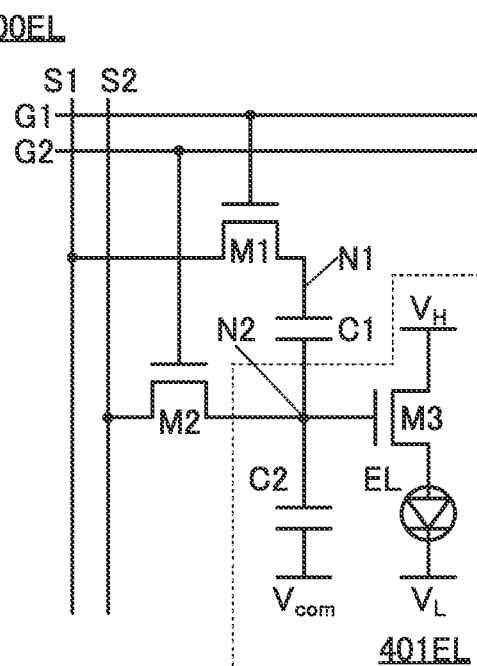

A pixel circuit 400EL illustrated in FIG. 19D includes a circuit 401EL. The circuit 401EL includes a light-emitting element EL, a transistor M3, and the capacitor C2.

A gate of the transistor M3 is connected to the node N2 and the one electrode of the capacitor C2, one of a source and a drain of the transistor M3 is connected to a wiring to which a potential $V_H$ is supplied, and the other of the source and the drain of the transistor M3 is connected to one electrode of the light-emitting element EL. The other electrode of the capacitor C2 is connected to a wiring to which a potential $V_{com}$ is supplied. The other electrode of the light-emitting element EL is connected to a wiring to which a potential Vr, is supplied.

The transistor M3 has a function of controlling current to be supplied to the light-emitting element EL. The capacitor C2 functions as a storage capacitor. The capacitor C2 is not necessarily provided.

Although the transistor M3 is connected to an anode side of the light-emitting element EL here, the transistor M3 may be connected to a cathode side. In that case, values of the potential VII and the potential VL can be changed as appropriate.

A large amount of current can flow in the light-emitting element EL by supplying a high potential to the gate of the transistor M3 in the pixel circuit 400EL, whereby HDR display or the like can be performed. In addition, a correction signal is supplied to the wiring S1 or the wiring S2, whereby variation in electrical characteristics of the transistor M3 or the light-emitting element EL can be corrected.

Note that without limitation to the circuits illustrated in FIGS. 19C and 19D, a transistor, a capacitor, or the like may be added.

At least part of this embodiment can be implemented in combination with any of the other embodiments described in this specification as appropriate.

Embodiment 5

In this embodiment, a display module that can be fabricated using one embodiment of the present invention is described.

Figure 20A:
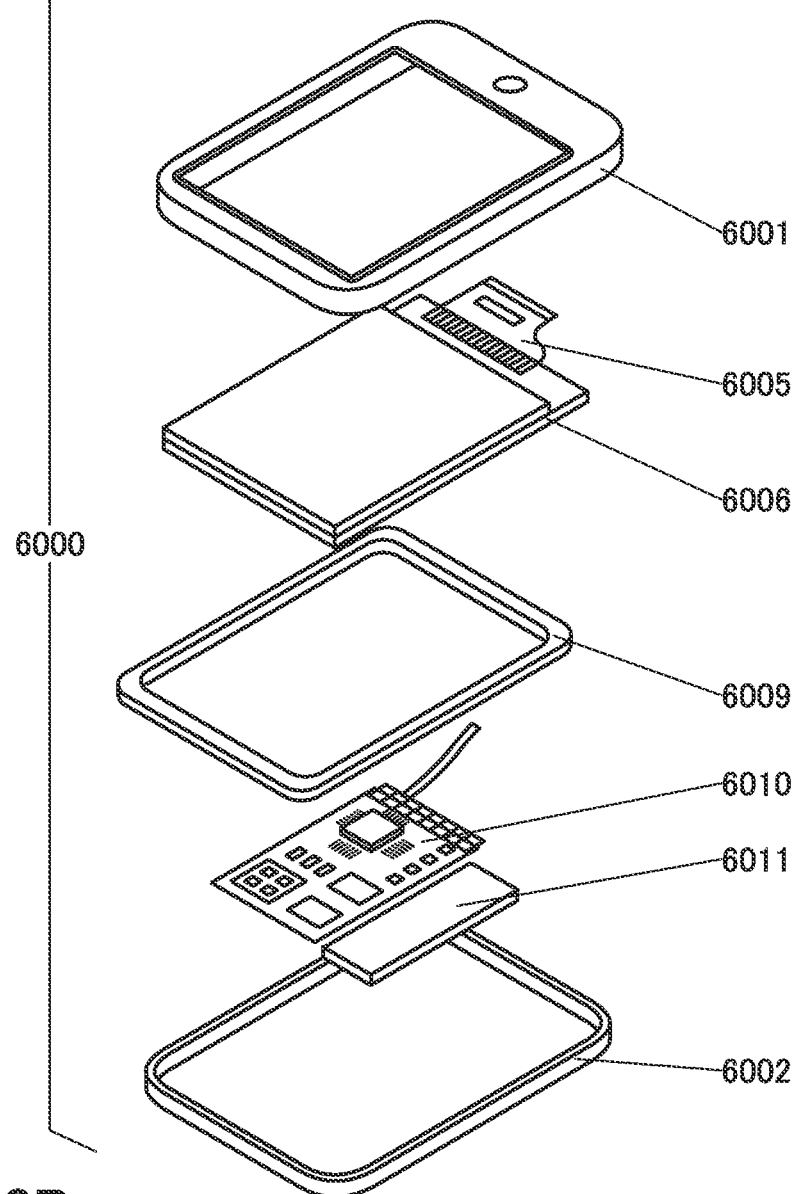
FIGS. 20A and 20B illustrate a structure example of a display module.

In a display module 6000 in FIG. 20A, a display device 6006 connected to an FPC 6005, a frame 6009, a printed circuit board 6010, and a battery 6011 are provided between an upper cover 6001 and a lower cover 6002.

For example, the display device fabricated using one embodiment of the present invention can be used as the display device 6006. With the display device 6006, a display module with extremely low power consumption can be fabricated.

The shapes and sizes of the upper cover 6001 and the lower cover 6002 can be changed as appropriate in accordance with the size of the display device 6006.

The display device 6006 may function as a touch panel.

The frame 6009 may have a function of protecting the display device 6006 or blocking electromagnetic waves generated by the operation of the printed circuit board 6010, or function as a radiator plate, for example.

The printed circuit board 6010 includes a power supply circuit, a signal processing circuit for outputting a video signal and a clock signal, a battery control circuit, and the like.

Figure 20B:
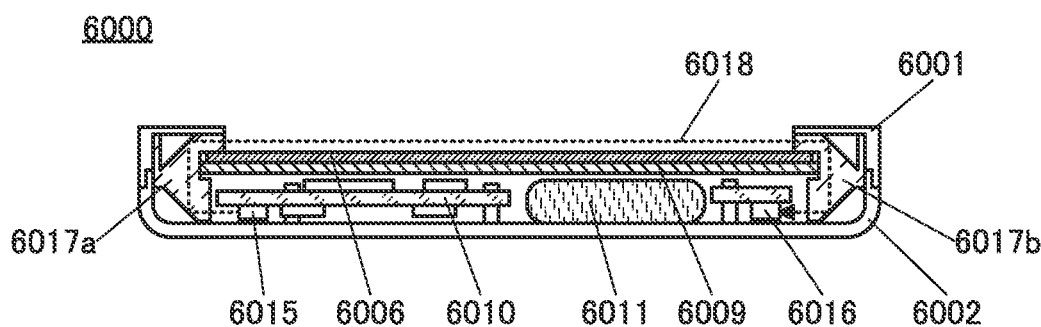

FIG. 20B is a schematic cross-sectional view of the display module 6000 with an optical touch sensor.

The display module 6000 includes a light-emitting portion 6015 and a light-receiving portion 6016 which are provided on the printed circuit board 6010. A pair of light guide portions (a light guide portion 6017a and a light guide portion 6017b) is provided in a region surrounded by the upper cover 6001 and the lower cover 6002.

The display device 6006 overlaps with the printed circuit board 6010 and the battery 6011 with the frame 6009 located therebetween. The display device 6006 and the frame 6009 are fixed to the light guide portion 6017a and the light guide portion 6017b.

Light 6018 emitted from the light-emitting portion 6015 travels over the display device 6006 through the light guide portion 6017a and reaches the light-receiving portion 6016 through the light guide portion 6017b. For example, blocking of the light 6018 by a sensing target such as a finger or a stylus can be detected as touch operation.

A plurality of light-emitting portions 6015 are provided along two adjacent sides of the display device 6006, for example. A plurality of light-receiving portions 6016 are provided so as to face the light-emitting portions 6015. Accordingly, information about the position of touch operation can be obtained.

As the light-emitting portion 6015, a light source such as an LED element can be used. It is particularly preferable to use a light source that emits infrared light. As the light-receiving portion 6016, a photoelectric element that receives light emitted by the light-emitting portion 6015 and converts it into an electrical signal can be used. A photodiode that can receive infrared light can be favorably used.

With the use of the light guide portions 6017a and 6017b transmitting the light 6018, the light-emitting portion 6015 and the light-receiving portion 6016 can be placed under the display device 6006, and a malfunction of the touch sensor due to external light reaching the light-receiving portion 6016 can be prevented. It is particularly preferable to use a resin which absorbs visible light and transmits infrared light. This is more effective in suppressing the malfunction of the touch sensor.

At least part of this embodiment can be implemented in combination with any of the other embodiments described in this specification as appropriate.

Embodiment 6

In this embodiment, examples of an electronic device for which the display device of one embodiment of the present invention can be used will be described.

Figure 21A:
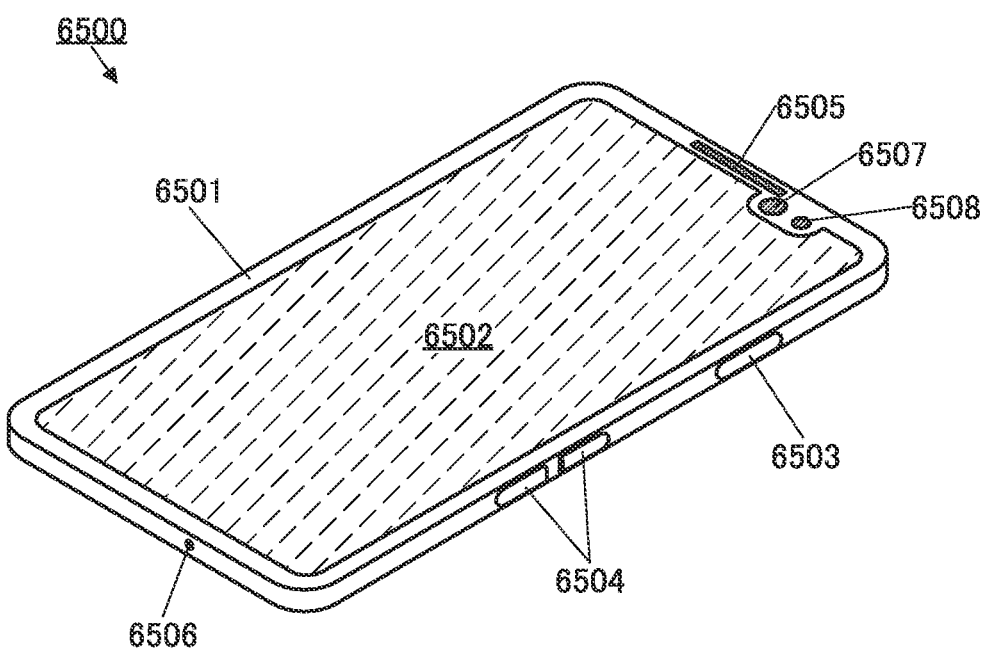
FIGS. 21A and 21B illustrate a structure example of an electronic device.

An electronic device 6500 in FIG. 21A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display device of one embodiment of the present invention can be used in the display portion 6502.

Figure 21B:
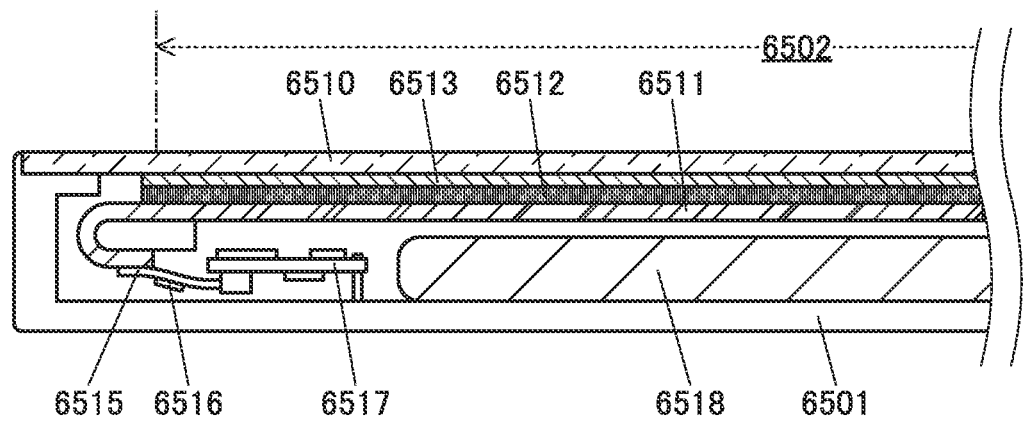

FIG. 21B is a schematic cross-sectional view including an end portion of the housing 6501 on the microphone 6506 side.

A protective member 6510 having a light-transmitting property is provided on the display surface side of the housing 6501, and a display panel 6511, an optical member 6512, a touch sensor panel 6513, a printed circuit board 6517, a battery 6518, and the like are provided in a space surrounded by the housing 6501 and the protective member 6510.

The display panel 6511, the optical member 6512, and the touch sensor panel 6513 are fixed to the protective member 6510 with a bonding layer not illustrated.

Part of the display panel 6511 is bent in a region outside the display portion 6502. An FPC 6515 is connected to the bent part. An IC 6516 is mounted on the FPC 6515. The FPC 6515 is connected to a terminal provided for the printed circuit board 6517.

A flexible display panel of one embodiment of the present invention can be used as the display panel 6511. Thus, an extremely lightweight electronic device can be achieved.

Furthermore, since the display panel 6511 is extremely thin, the battery 6518 with a high capacity can be provided without an increase in the thickness of the electronic device. Moreover, part of the display panel 6511 is bent to provide a connection portion with the FPC 6515 on the back side of the pixel portion, whereby an electronic device with a narrow bezel can be obtained.

At least part of this embodiment can be implemented in combination with any of the other embodiments described in this specification as appropriate.

Embodiment 7

In this embodiment, electronic devices each including a display device fabricated using one embodiment of the present invention are described.

Electronic devices described below are each provided with a display device of one embodiment of the present invention in a display portion. Thus, the electronic devices achieve high resolution. In addition, the electronic devices can achieve both high resolution and a large screen.

The display portion of the electronic device of one embodiment of the present invention can display, for example, an image with a resolution of full high definition, 4K2K, 8K4K, 16K8K, or more.

Examples of electronic devices include electronic devices having relatively large screens, such as a television device, a laptop personal computer, a monitor, digital signage, a pachinko machine, and a game machine; a digital camera; a digital video camera; a digital photo frame; a mobile phone; a portable game console; a portable information terminal; an audio reproducing device; and the like.

The electronic device using one embodiment of the present invention can be incorporated along a flat surface or a curved surface of an inside or outside wall surface of a house or a building, an interior or exterior surface of a car, or the like.

Figure 22A:
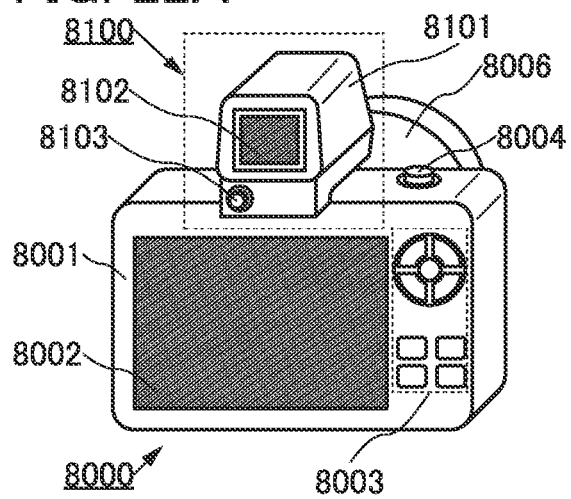
FIGS. 22A to 22E illustrate structure examples of electronic devices.

FIG. 22A is an external view of a camera 8000 to which a finder 8100 is attached.

The camera 8000 includes a housing 8001, a display portion 8002, operation buttons 8003, a shutter button 8004, and the like. Furthermore, a detachable lens 8006 is attached to the camera 8000.

Note that the lens 8006 may be included in the housing of the camera 8000.

Images can be taken with the camera 8000 at the press of the shutter button 8004 or the touch of the display portion 8002 serving as a touch panel.

The housing 8001 includes a mount including an electrode, so that the finder 8100, a stroboscope, or the like can be connected.

The finder 8100 includes a housing 8101, a display portion 8102, a button 8103, and the like.

The housing 8101 is attached to the camera 8000 by a mount for engagement with the mount of the camera 8000. In the finder 8100, an image or the like received from the camera 8000 can be displayed on the display portion 8102.

The button 8103 functions as a power supply button or the like.

A display device of one embodiment of the present invention can be used in the display portion 8002 of the camera 8000 and the display portion 8102 of the finder 8100. Note that a finder may be incorporated in the camera 8000.

Figure 22B:
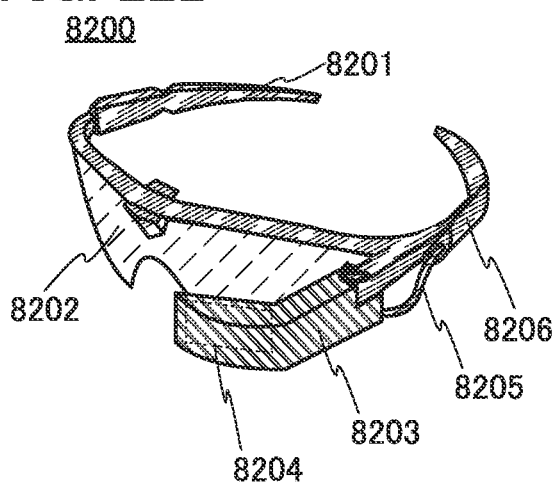

FIG. 22B is an external view of a head-mounted display 8200.

The head-mounted display 8200 includes a mounting portion 8201, a lens 8202, a main body 8203, a display portion 8204, a cable 8205, and the like. The mounting portion 8201 includes a battery 8206.

Power is supplied from the battery 8206 to the main body 8203 through the cable 8205. The main body 8203 includes a wireless receiver or the like to receive image data and display it on the display portion 8204. The main body 8203 includes a camera, and the movement of the eyeballs or the eyelids of the user can be used as an input means.

The mounting portion 8201 may include a plurality of electrodes capable of sensing current flowing with the movement of the user's eyeball at a position in contact with the user to recognize the user's sight line. The mounting portion 8201 may have a function of monitoring the user's pulse with the use of current flowing in the electrodes. The mounting portion 8201 may include sensors such as a temperature sensor, a pressure sensor, and an acceleration sensor so that the user's biological information can be displayed on the display portion 8204 and an image displayed on the display portion 8204 can be changed in accordance with the movement of the user's head.

A display device of one embodiment of the present invention can be used in the display portion 8204.

Figure 22C:
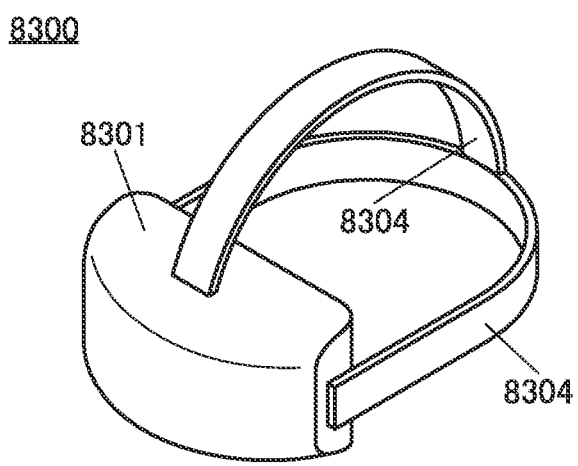
Figure 22D:
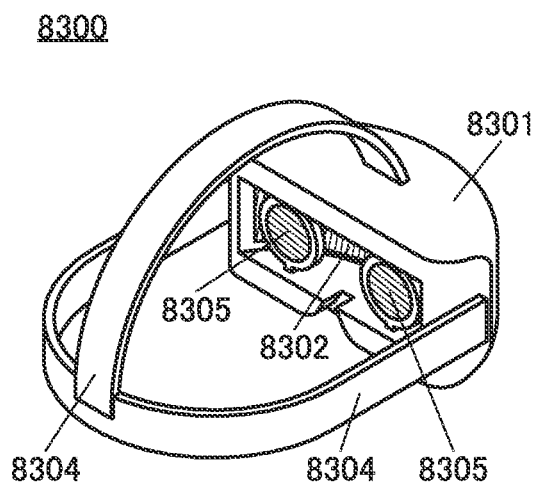
Figure 22E:
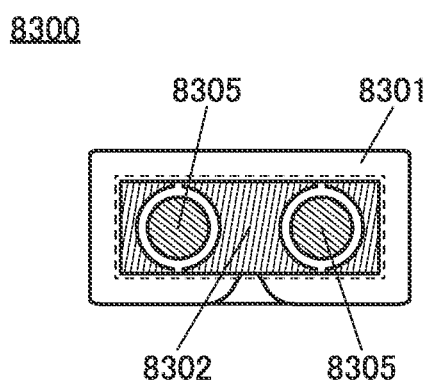

FIGS. 22C to 22E are external views of a head-mounted display 8300. The head-mounted display 8300 includes a housing 8301, a display portion 8302, a fixing band 8304, and a pair of lenses 8305.

A user can see display on the display portion 8302 through the lenses 8305. The display portion 8302 is preferably curved because the user can feel high realistic sensation of images. Another image displayed in another region of the display portion 8302 is viewed through the lenses 8305, so that three-dimensional display using parallax or the like can be performed. Note that the number of the display portions 8302 is not limited to one; two display portions 8302 may be provided for user's respective eyes.

A display device of one embodiment of the present invention can be used in the display portion 8302. A display device including a semiconductor device of one embodiment of the present invention has an extremely high resolution; thus, even when an image is magnified using the lenses 8305 as illustrated in FIG. 22E, the user does not perceive pixels, and thus a more realistic image can be displayed.

Electronic devices illustrated in FIGS. 23A to 23G include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 9008, and the like.

The electronic devices illustrated in FIGS. 23A to 23G have a variety of functions, such as a function of displaying a variety of information (a still image, a moving image, a text image, and the like) on the display portion, a touch panel function, a function of displaying a calendar, the date, the time, and the like, a function of controlling processing with a variety of software (programs), a wireless communication function, a function of reading a program or data stored in a storage medium and processing the program or data, and the like. Note that the electronic devices can have a variety of functions without limitation to the above. The electronic devices may each include a plurality of display portions. The electronic devices may each be provided with a camera or the like and have a function of taking a still image or a moving image, a function of storing the taken image in a storage medium (an external memory medium or a memory medium incorporated in the camera), a function of displaying the taken image on the display portion, or the like.

The electronic devices in FIGS. 23A to 23G are described in detail below.

Figure 23A:
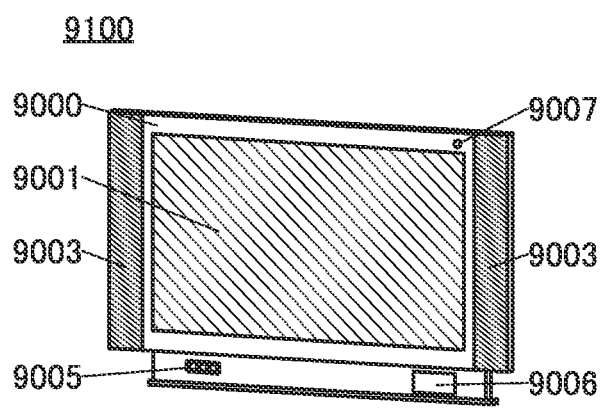
FIGS. 23A to 23G illustrate structure examples of electronic devices.

FIG. 23A is a perspective view illustrating a television device 9100. The television device 9100 can include the display portion 9001 having a large screen size of, for example, 50 inches or more, or 100 inches or more.

Figure 23D:
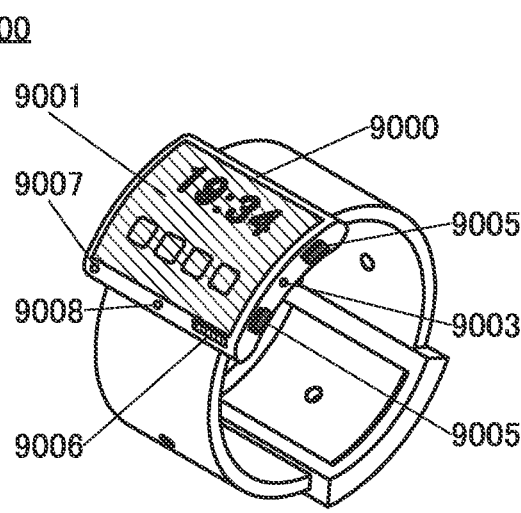
Figure 23B:
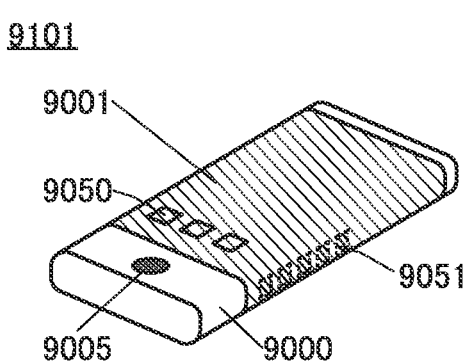

FIG. 23B is a perspective view of a portable information terminal 9101. For example, the portable information terminal 9101 can be used as a smartphone. Note that the portable information terminal 9101 may include the speaker 9003, the connection terminal 9006, the sensor 9007, or the like. The portable information terminal 9101 can display characters and image information on its plurality of surfaces. In FIG. 23B, three icons 9050 are displayed. Furthermore, information 9051 indicated by dashed rectangles can be displayed on another surface of the display portion 9001. Examples of the information 9051 include notification of reception of an e-mail, an SNS message, or an incoming call, the title and sender of an e-mail, an SNS message, or the like, the date, the time, remaining battery, and the reception strength of an antenna. Alternatively, the icon 9050 or the like may be displayed at the position where the information 9051 is displayed.

Figure 23E:
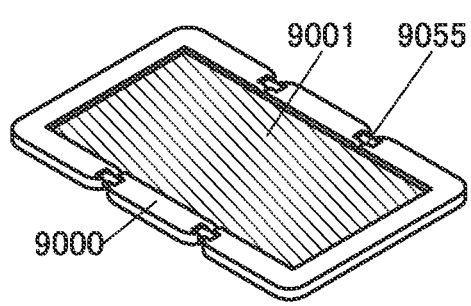
Figure 23C:
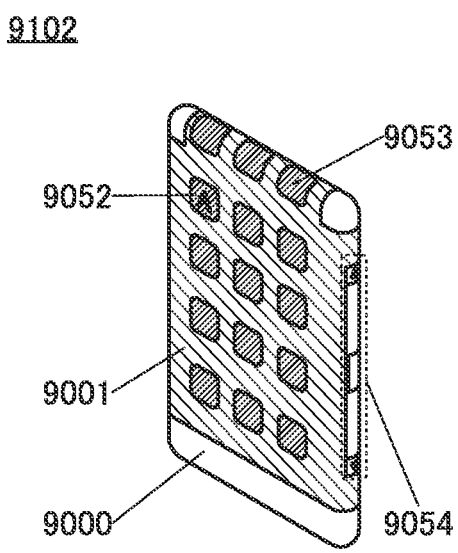

FIG. 23C is a perspective view of a portable information terminal 9102. The portable information terminal 9102 has a function of displaying information on three or more surfaces of the display portion 9001. Here, information 9052, information 9053, and information 9054 are displayed on different surfaces. For example, a user of the portable information terminal 9102 can check the information 9053 displayed such that it can be seen from above the portable information terminal 9102, with the portable information terminal 9102 put in a breast pocket of his/her clothes. Thus, the user can see the display without taking out the portable information terminal 9102 from the pocket and decide whether to answer the call, for example.

FIG. 23D is a perspective view of a watch-type portable information terminal 9200. For example, the portable information terminal 9200 can be used as a smart watch. The display surface of the display portion 9001 is bent, and an image can be displayed on the bent display surface. Furthermore, for example, mutual communication between the portable information terminal 9200 and a headset capable of wireless communication can be performed, and thus hands-free calling is possible. The connection terminal 9006 of the portable information terminal 9200 allows mutual data transmission with another information terminal and charging. Note that the charging operation may be performed by wireless power feeding.

Figure 23F:
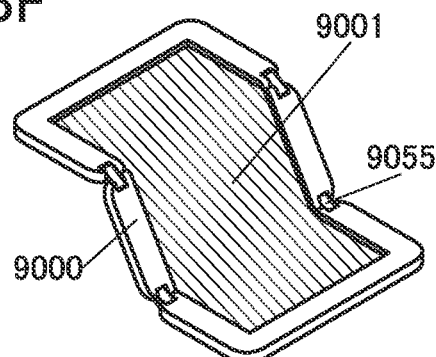
Figure 23G:
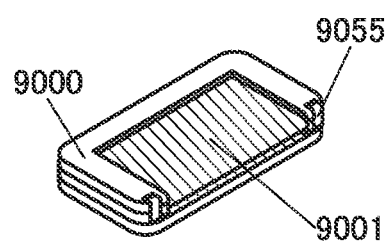

FIGS. 23E, 23F, and 23G are perspective views of a foldable portable information terminal 9201. FIG. 23E is a perspective view illustrating the portable information terminal 9201 that is opened. FIG. 23G is a perspective view illustrating the portable information terminal 9201 that is folded. FIG. 23F is a perspective view illustrating the portable information terminal 9201 that is shifted from one of the states in FIGS. 23E and 23G to the other. The portable information terminal 9201 is highly portable when folded. When the portable information terminal 9201 is opened, a seamless large display region is highly browsable. The display portion 9001 of the portable information terminal 9201 is supported by three housings 9000 joined together by hinges 9055. For example, the display portion 9001 can be bent with a radius of curvature of greater than or equal to 1 mm and less than or equal to 150 mm.

Figure 24A:
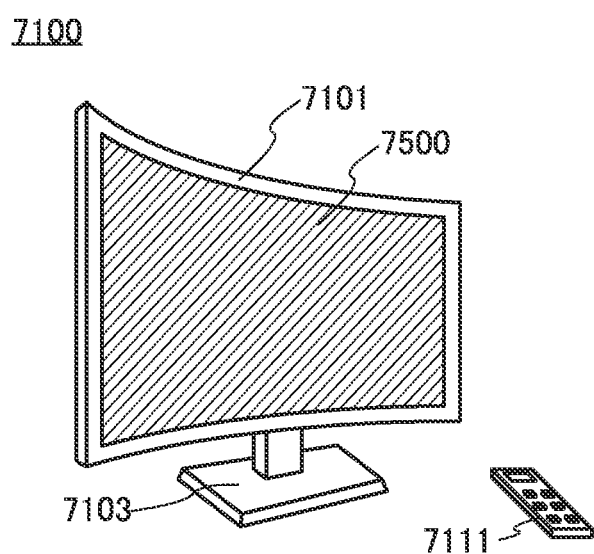
FIGS. 24A to 24D illustrate structure examples of electronic devices.

FIG. 24A illustrates an example of a television device. In a television device 7100, a display portion 7500 is incorporated in a housing 7101. Here, the housing 7101 is supported by a stand 7103.

The television device 7100 illustrated in FIG. 24A can be operated with an operation switch provided in the housing 7101 or a separate remote controller 7111. Alternatively, a touch panel may be used in the display portion 7500 so that the television device 7100 can be operated by touching the touch panel. The remote controller 7111 may be provided with a display portion in addition to operation buttons.

Note that the television device 7100 may include a television receiver and a communication device for a network connection.

Figure 24B:
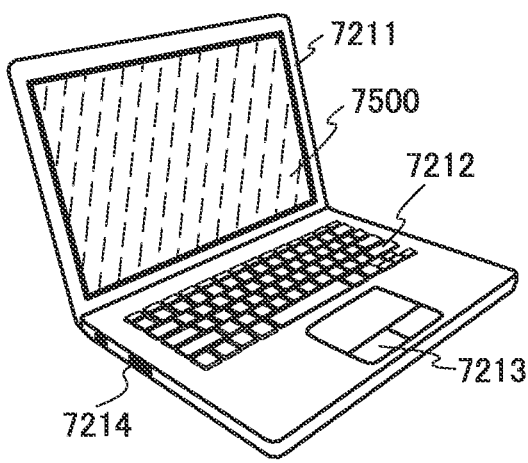

FIG. 24B illustrates a laptop personal computer 7200. The laptop personal computer 7200 includes a housing 7211, a keyboard 7212, a pointing device 7213, an external connection port 7214, and the like. In the housing 7211, the display portion 7500 is incorporated.

Figure 24C:
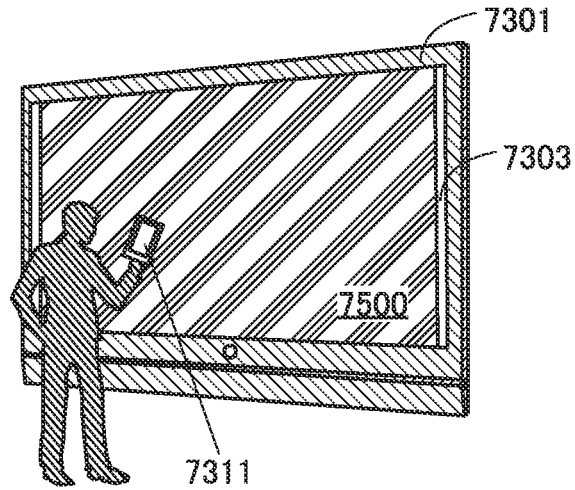
Figure 24D:
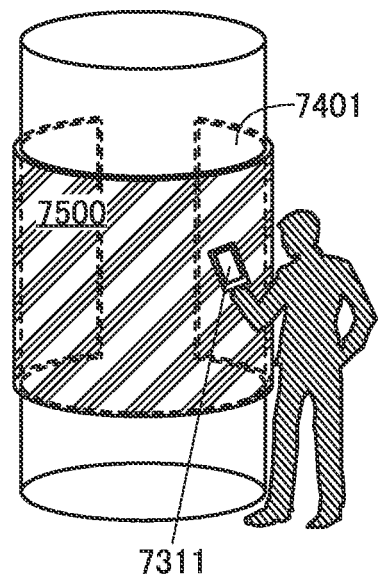

FIGS. 24C and 24D illustrate examples of digital signage.

A digital signage 7300 illustrated in FIG. 24C includes a housing 7301, the display portion 7500, a speaker 7303, and the like. The digital signage 7300 can also include an LED lamp, an operation key (including a power switch or an operation switch), a connection terminal, a variety of sensors, a microphone, and the like.

FIG. 24D illustrates a digital signage 7400 mounted on a cylindrical pillar 7401. The digital signage 7400 includes the display portion 7500 provided along a curved surface of the pillar 7401.

The larger display portion 7500 can provide a larger amount of information at a time and attract more attention, so that the effectiveness of the advertisement can be increased, for example.

A touch panel is preferably used in the display portion 7500 so that the user can operate the digital signage 7300 or the digital signage 7400. Thus, the digital signage 7300 or the digital signage 7400 can be used for not only advertising but also providing information that the user needs, such as route information, traffic information, and an information map of a commercial facility.

Furthermore, as illustrated in FIGS. 24C and 24D, it is preferable that the digital signage 7300 or the digital signage 7400 work with an information terminal 7311 such as a user's smartphone through wireless communication. For example, advertisement displayed on the display portion 7500 can also be displayed on a screen of the information terminal 7311, or display on the display portion 7500 can be switched by operating the information terminal 7311.

Furthermore, it is possible to make the digital signage 7300 or the digital signage 7400 execute a game with the use of the information terminal 7311 as an operation means (controller). Thus, an unspecified number of people can join in and enjoy the game concurrently.

A display device of one embodiment of the present invention can be used in each of the display portions 7500 in FIGS. 24A and 24D.

The electronic devices of this embodiment each include a display portion; however, one embodiment of the present invention can also be used in an electronic device without a display portion.

At least part of this embodiment can be implemented in combination with any of the other embodiments described in this specification as appropriate.

Example 1

In the following, evaluation results of electric characteristics and reliability of fabricated transistors having semiconductor layers with different structures are described.

[Sample Fabrication]

For the structures of the fabricated transistors, the transistor 100 described in Embodiment 1 can be referred to. Note that here, the transistor 100 was fabricated through the same steps as the transistor 100A including a back gate electrode.

First, an approximately 100-nm-thick tungsten film was formed over a glass substrate by a sputtering method, and the tungsten film was processed to form a first gate electrode. Then, as a first gate insulating layer, an approximately 240-nm-thick first silicon nitride film, an approximately 60-nm-thick second silicon nitride film, and an approximately 3-nm-thick silicon oxynitride film were stacked by a PECVD method. The first silicon nitride film was formed under the following conditions: the flow rates of a silane gas, a nitrogen gas, and an ammonia gas were 290 sccm, 2000 sccm, and 2000 sccm, respectively; the pressure was 200 Pa; the deposition power was 3000 W; and the substrate temperature was 350° C.

The second silicon nitride film was formed under the following conditions: the flow rates of a silane gas, a nitrogen gas, and an ammonia gas were 200 sccm, 2000 sccm, and 100 sccm, respectively; the pressure was 100 Pa; the deposition power was 2000 W; and the substrate temperature was 350° C.

The silicon oxynitride film was formed under the following conditions: the flow rates of a silane gas and a dinitrogen monoxide gas were 20 sccm and 3000 sccm, respectively; the pressure was 40 Pa; the deposition power was 3000 W; and the substrate temperature was 350° C.

Next, an approximately 30-nm-thick metal oxide film was formed over the first gate insulating layer, and the metal oxide film was processed to form a semiconductor layer. Here, five samples (samples A1 to A5) including the metal oxide films formed under different deposition conditions were fabricated.

The metal oxide film of the sample A1 was formed by a sputtering method using a metal oxide target to have an atomic ratio of metal elements of In:Ga:Zn=5:1:6. A mixed gas of an argon gas and an oxygen gas was used as a formation gas, and the flow rate ratio of the oxygen gas was set to 2%. The film formation was carried out without heating the substrate.

The metal oxide film of the sample A2 was formed by a sputtering method using a metal oxide target to have an atomic ratio of metal elements of In:Ga:Zn=4:2:3. A mixed gas of an argon gas and an oxygen gas was used as a formation gas, and the flow rate ratio of the oxygen gas was set to 10%. The film formation was carried out without heating the substrate.

The metal oxide film of the sample A3 was formed by a sputtering method using a metal oxide target to have an atomic ratio of metal elements of In:Ga:Zn=1:1:1. A mixed gas of an argon gas and an oxygen gas was used as a formation gas, and the flow rate ratio of the oxygen gas was set to 30%. The film formation was carried out without heating the substrate.

The metal oxide film of the sample A4 was formed by a sputtering method using a metal oxide target to have an atomic ratio of metal elements of In:Ga:Zn=1:3:4. A mixed gas of an argon gas and an oxygen gas was used as a formation gas, and the flow rate ratio of the oxygen gas was set to 10%. The film formation was carried out without heating the substrate.

The sample A5 included a stack of a first metal oxide film and a second metal oxide film. First, the first metal oxide film was formed by a sputtering method using a metal oxide target to have an atomic ratio of metal elements of In:Ga:Zn=1:1:1 and a thickness of approximately 25 nm. Then, the second metal oxide film was formed by a sputtering method using a metal oxide target to have an atomic ratio of metal elements of In:Ga:Zn=5:1:6 and a thickness of approximately 5 nm. A mixed gas of an argon gas and an oxygen gas was used as a formation gas; the flow rate ratio of the oxygen gas was set to 30% in forming the first metal oxide film, and set to 2% in forming the second metal oxide film. The first metal oxide film and the second metal oxide film were formed without heating the substrate.

After the semiconductor layer was formed, heat treatment was performed at 350° C. for one hour in a nitrogen gas atmosphere, and then another heat treatment was performed at 350° C. for one hour in a mixed atmosphere of a nitrogen gas and an oxygen gas.

Next, as a second gate insulating layer, an approximately 5-nm-thick first silicon oxynitride film, an approximately 140-nm-thick second silicon oxynitride film, and an approximately 5-nm-thick third silicon oxynitride film were formed by a PECVD method.

The first silicon oxynitride film was formed under the following conditions: the flow rates of a silane gas and a dinitrogen monoxide gas were 24 sccm and 18000 sccm, respectively; the pressure was 200 Pa; the deposition power was 130 W; and the substrate temperature was 350° C.

The second silicon oxynitride film was formed under the following conditions: the flow rates of a silane gas and a dinitrogen monoxide gas were 200 sccm and 4000 sccm, respectively; the pressure was 300 Pa; the deposition power was 750 W; and the substrate temperature was 350° C.

The third silicon oxynitride film was formed under the following conditions: the flow rates of a silane gas and a dinitrogen monoxide gas were 20 sccm and 3000 sccm, respectively; the pressure was 40 Pa; the deposition power was 500 W; and the substrate temperature was 350° C.

Next, an approximately 20-nm-thick metal oxide film was formed over the second gate insulating layer by a sputtering method. The metal oxide film was formed in an atmosphere containing oxygen and using a metal oxide target to have an atomic ratio of metal elements of In:Ga:Zn=4:2:3. After that, heat treatment was performed at 350° C. for one hour in an atmosphere containing nitrogen.

Then, an approximately 100-nm-thick molybdenum film was formed over the metal oxide film by a sputtering method. After that, part of the molybdenum film and part of the metal oxide film were removed by etching, so that a second gate electrode and a metal oxide layer were formed.

Then, boron was added as an impurity element with the use of the second gate electrode as a mask. A plasma ion doping apparatus was used for addition of the impurity. A $B_2H_6$ gas was used as a gas for supplying boron.

Next, as a protective insulating layer for covering the transistor, an approximately 300-nm-thick silicon oxynitride film was formed by a PECVD method. After that, openings were formed by partly etching the protective insulating layer and the second gate insulating layer, and a molybdenum film was formed by a sputtering method and processed to form a source electrode and a drain electrode. Then, an approximately 1.5-μm-thick acrylic film was formed as a planarization layer, and heat treatment was performed at 250° C. for one hour in a nitrogen atmosphere.

Through the above steps, the samples A1 to A5 including the transistors formed over the glass substrates were obtained.

[Id-Vg Characteristics of Transistors]

Next, the Id-Vg characteristics of the fabricated transistors were measured.

The Id-Vg characteristics of the transistors were measured under the following conditions. A voltage applied to the gate electrode (hereinafter also referred to as gate voltage (Vg)) was changed from −15 V to +20 V in increments of 0.25 V. A voltage applied to the source electrode (hereinafter also referred to as source voltage (Vs)) was 0 V (comm), and a voltage applied to the drain electrode (hereinafter also referred to as drain voltage (Vd)) was 0.1 V or 10 V.

The measured transistors each had a single-gate structure with a designed channel length of 3 μm and a designed channel width of 50 μm. The number of the evaluated transistors was 20 for each sample.

[Reliability Evaluation]

Next, a GBT test was performed in order to evaluate the reliability of the transistors. In the GBT test, the substrate over which the transistor was formed was held at 60° C., a voltage of 0 V was applied to the source and the drain of the transistor, and a voltage of 20 V or −20 V was applied to the gate; this state was held for one hour. Here, a PBTS test and an NBTIS test are particularly described. Note that in the NBTIS test, the samples were irradiated with white LED light with approximately 10000 lx.

[Result 1]

FIGS. 25A to 25D show the measured Id-Vg characteristics of the transistors. Each graph shows two Id-Vg characteristics at different drain voltages (Vd) and field-effect mobility (μFE) calculated from the Id-Vg characteristics in the case of Vd=10 V.

FIGS. 25A to 25D show the Id-Vg characteristics of the samples A1, A2, A3, and A4. In the drawings and the following description, the composition of the metal oxide film included in each sample is simply expressed as IGZO(516), for example.

As shown in FIGS. 25A to 25D, the amount of on-state current flowing at the same Vg is the largest in the sample A1, followed by in the sample A2, the sample A3, and the sample A4 in this order. This probably relates to the In content percentage. In addition, the variation in electrical characteristics of the sample A4 is larger than those of the other samples.

Figure 25A:
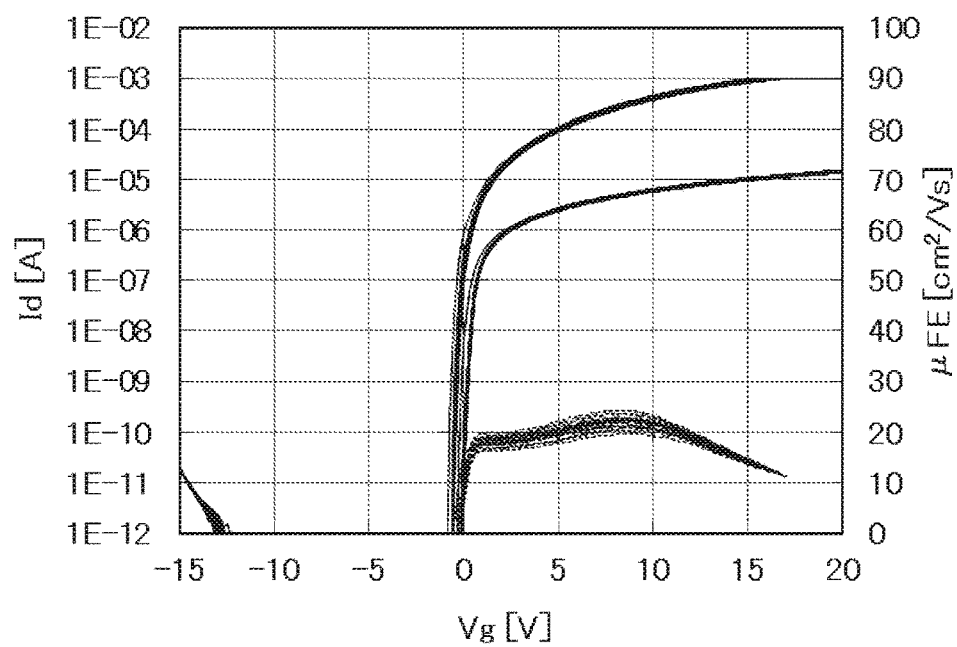
FIGS. 25A to 25D show Id-Vg characteristics of transistors.
Figure 25B:
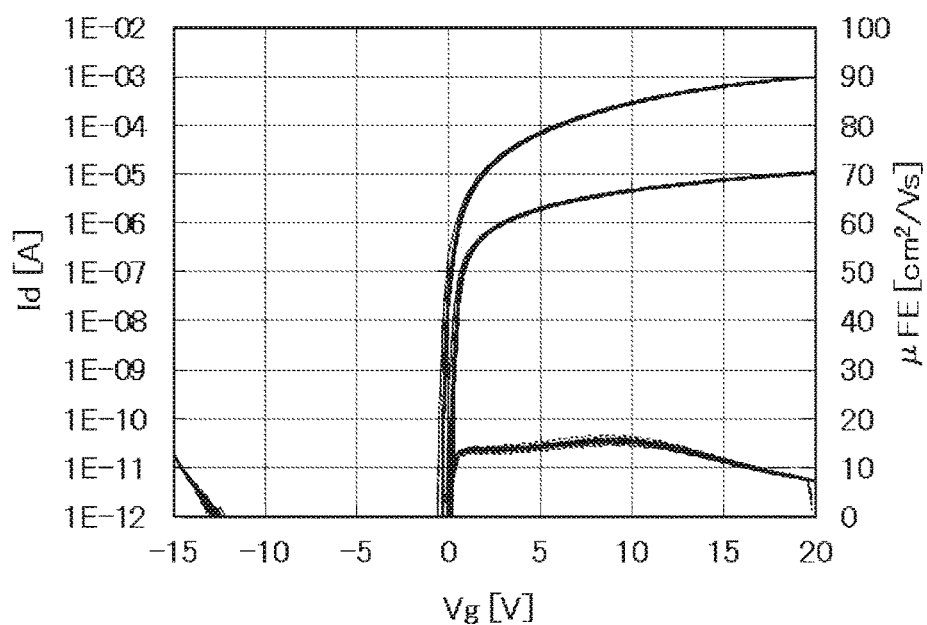
Figure 25C:
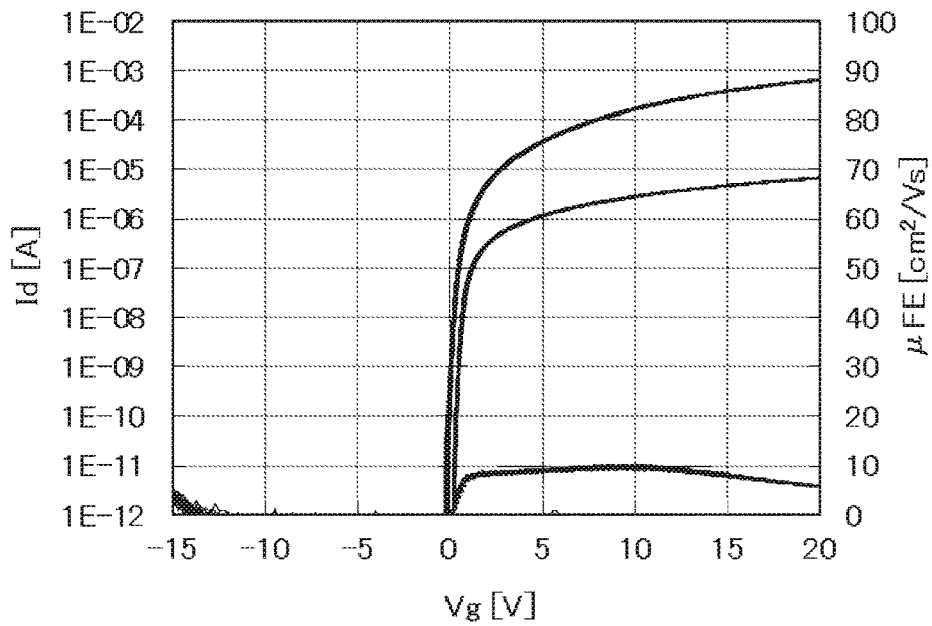
Figure 25D:
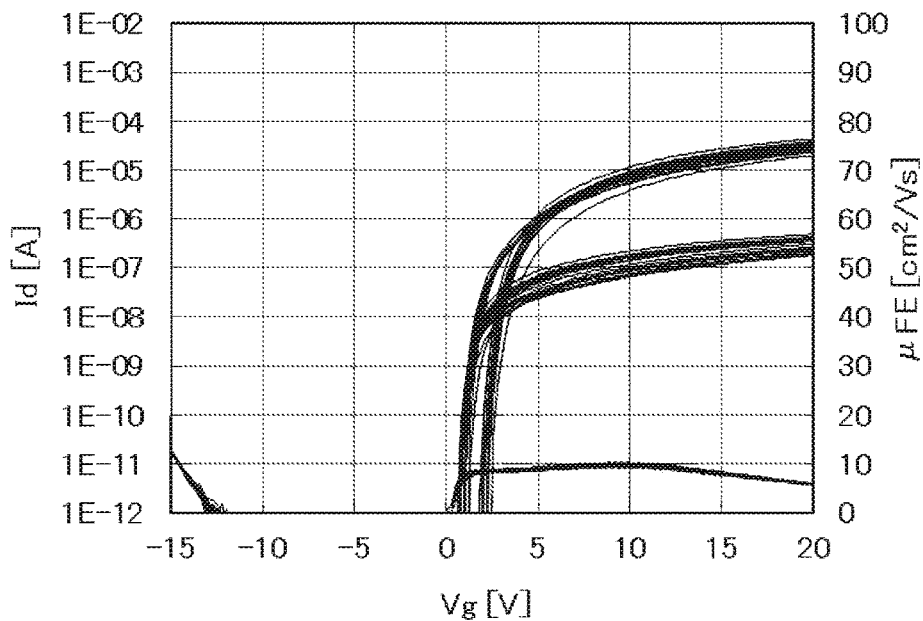
Figure 25E:
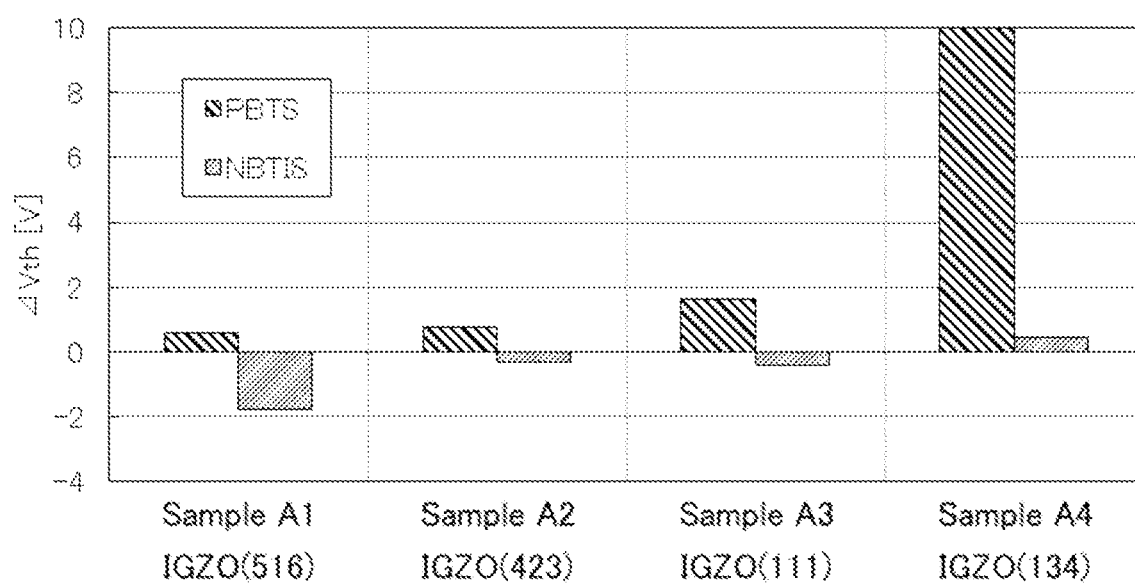
FIG. 25E shows results of a reliability test of the transistors.

FIG. 25E shows the amounts of changes in the threshold voltage (ΔVth) of the samples A1 to A4 after the PBTS test and the NBTIS test. As shown in FIG. 25E, ΔVth varies depending on the compositions of the semiconductor layers.

When the PBTS test is focused on, the amount of change in the threshold voltage is the smallest in the sample A1 (i.e., the sample A1 has favorable reliability), followed by in the sample A2, the sample A3, and the sample A4 in this order. In particular, the amount of change in the threshold voltage of the sample A4 is significantly larger than those of the other samples.

In contrast, when the NBTIS test is focused on, the amount of change in the threshold voltage of the sample A1 is slightly larger than those of the other samples; however, the amount of change in the threshold voltage of any of the samples is 2 V or less, which means that the samples have favorable reliability.

The above results show that a smaller gallium content in a metal oxide film used as a semiconductor layer enables a transistor with higher reliability. In particular, the results show that the use of a metal oxide film with a small gallium content can reduce the amount of change in the threshold voltage in the PBTS test. Furthermore, it is found that a transistor with both high field-effect mobility and high reliability can be provided with the use of a metal oxide film that has a larger indium content and a larger zinc content than a gallium content.

[Result 2]

Figure 26A:
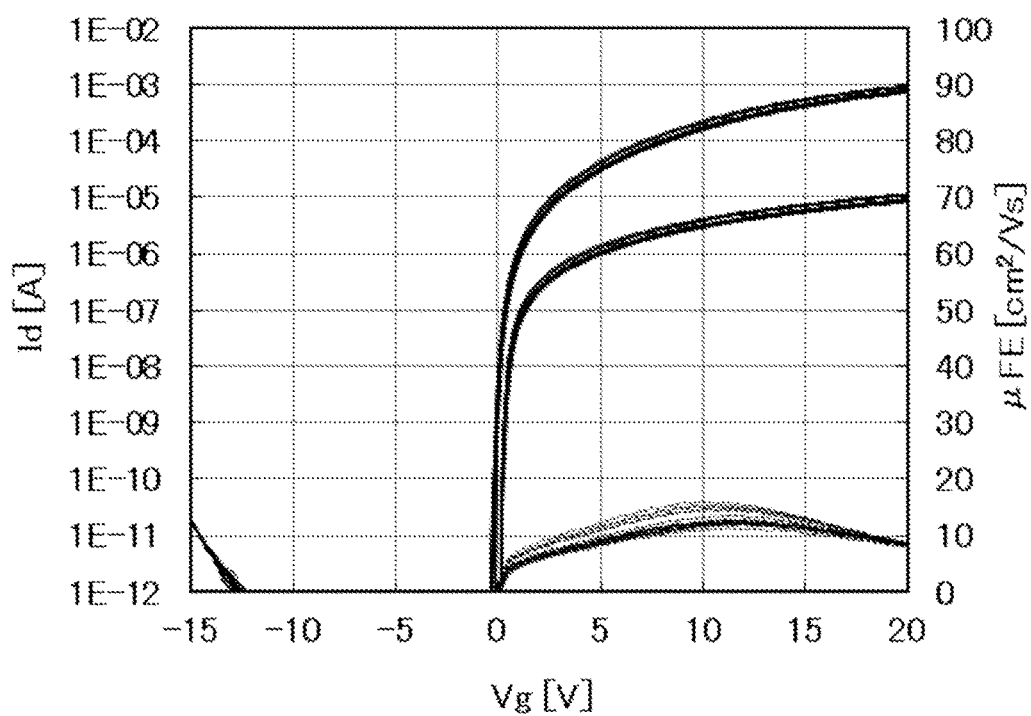
FIG. 26A shows Id-Vg characteristics of a transistor.

FIG. 26A shows the Id-Vg characteristics of the sample A5. As described above, the semiconductor layer of the transistor of the sample A5 is the stacked-layer film in which the second metal oxide film (IGZO(516)) is stacked over the first metal oxide film (IGZO(111)).

As shown in FIG. 26A, it is confirmed that the sample A5 has a smaller variation than the sample A1 (IGZO(516)) and thus has favorable electrical characteristics. In addition, it is confirmed that the sample A5 has higher on-state current and higher field-effect mobility than the sample A3 (IGZO(111)).

Figure 26B:
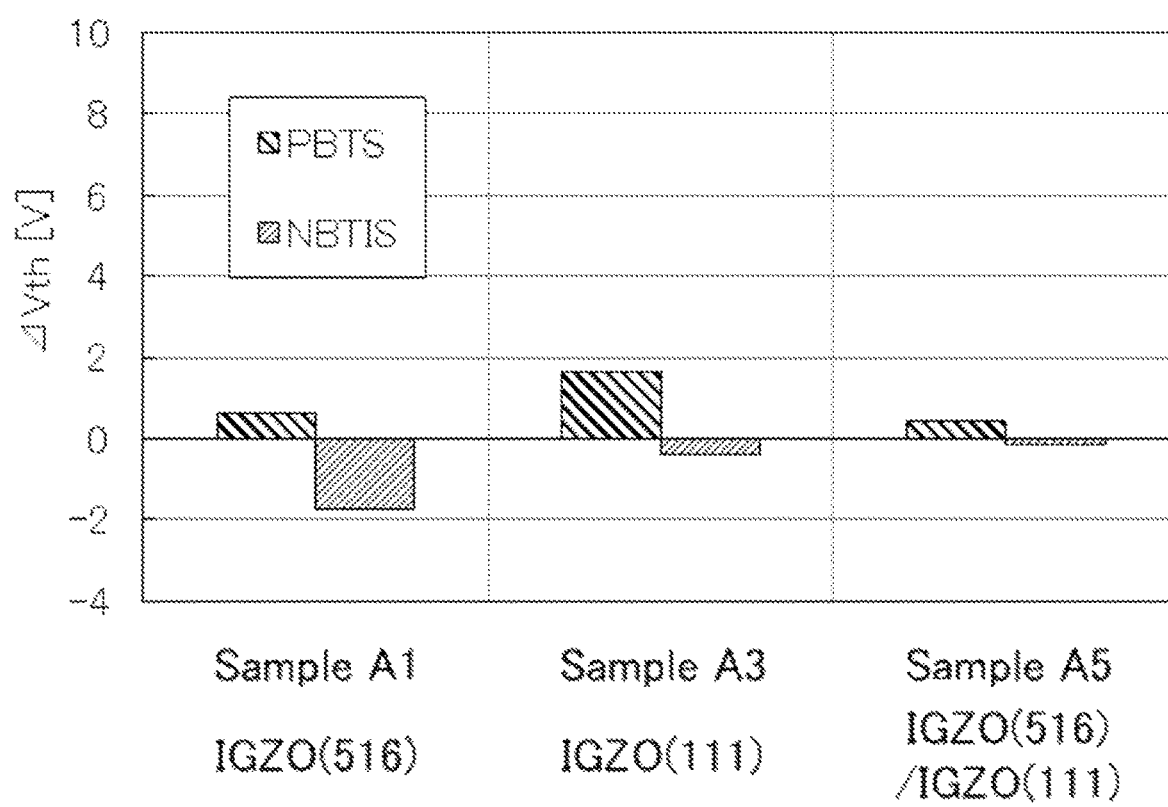
FIG. 26B shows results of a reliability test of the transistors.

FIG. 26B shows ΔVth of the sample A5 after the reliability tests. Here, the results of the samples A1 and A3 are also shown for comparison.

When the PBTS test is focused on, the amount of change in the threshold voltage of the sample A5 is smaller than that of the sample A1. In the NBTIS test, the amount of change in the threshold voltage of the sample A5 is smaller than that of the sample A3. That is, it is revealed that the sample A5 has much higher reliability than the samples including a single film of a metal oxide film.

Here, defect states in the interface between a gate insulating layer and a semiconductor layer or in the vicinity of the interface are considered as one of factors of the change in the threshold voltage in the PBTS test. Therefore, the result in FIG. 26B suggests that the defect states in the interface between a gate insulating layer and a semiconductor layer or in the vicinity of the interface can be reduced by providing, on the gate insulating layer side, a metal oxide film having an indium content percentage higher than a gallium content percentage.

The defect states due to oxygen vacancies in a semiconductor layer are considered as one of factors of the change in the threshold voltage in the NBTIS test. Therefore, the result in FIG. 26B suggests that the density of such defect states can be reduced by stacking, over a second metal oxide film in contact with a gate insulating layer, a first metal oxide film having higher gallium content than the second metal oxide film. Furthermore, considering that gallium is more easily bonded to oxygen than indium and zinc, oxygen vacancies is probably less likely to be generated in the first metal oxide film containing a relatively large amount of gallium.

In the sample A5, the second metal oxide film which has a low gallium content percentage and in which oxygen vacancies are relatively easily generated is sufficiently thinner than the first metal oxide film, and a sufficient amount of oxygen is supplied to the second metal oxide film from the gate insulating layer by heat treatment. It is probable that, as a result, the number of oxygen vacancies in the whole semiconductor layer is sufficiently reduced and that favorable transistor characteristics with small variation as in FIG. 26A are obtained.

The above results show that a transistor with extremely favorable electrical characteristics and extremely high reliability can be provided with the use of a semiconductor layer in which a second metal oxide film, which is in contact with a gate insulating layer and has an indium content percentage higher than a gallium content percentage, and a first metal oxide film, which is thicker than the second metal oxide film and has a high gallium content percentage, are stacked.

Example 2

In this example, samples in which metal oxide layers were formed over insulating layers under different deposition conditions were fabricated, and the results of measuring the amounts of oxygen and argon released from the insulating layers by thermal desorption spectrometry (TDS) analysis are described.

[Sample Fabrication]

First, as an insulating layer over a glass substrate, an approximately 5-nm-thick first silicon oxynitride film, an approximately 130-nm-thick second silicon oxynitride film, and an approximately 5-nm-thick third silicon oxynitride film were formed by a PECVD method under the same conditions as those of the second gate insulating layer described in Example 1.

Then, heat treatment was performed at 370° C. for one hour in a nitrogen atmosphere.

Next, an approximately 20-nm-thick metal oxide film was formed over the insulating layer by a sputtering method. The metal oxide film was formed using a metal oxide target having an atomic ratio of metal elements of In:Ga:Zn=4:2:4.1.

Here, five samples (samples B1 to B5) were fabricated using different formation gases in formation of the metal oxide films.

The samples B1 to B4 were each formed using a mixed gas of an argon gas and an oxygen gas as a formation gas. The sample B1 was formed at a proportion of the flow rate of the oxygen gas to the total flow rate of the formation gas (hereinafter referred to as a flow rate ratio) of 10%. The sample B2 was formed at a flow rate ratio of the oxygen gas of 30%. The sample B3 was formed at a flow rate ratio of the oxygen gas of 50%. The sample B4 was formed at a flow rate ratio of the oxygen gas of 70%. The sample B5 was formed using only an oxygen gas as a formation gas, which means that the flow rate ratio of the oxygen gas was 100%.

Next, heat treatment was performed on each sample at 370° C. for one hour in a mixed atmosphere of an oxygen gas and a nitrogen gas.

Then, the metal oxide film of each sample was removed by a wet etching method.

Through the above steps, the samples B1 to B5 were fabricated.

[TDS Analysis]

TDS analysis was performed on the samples B1 to B5. The TDS analysis was performed at a temperature rising rate of 30° C./min.

Figure 27:
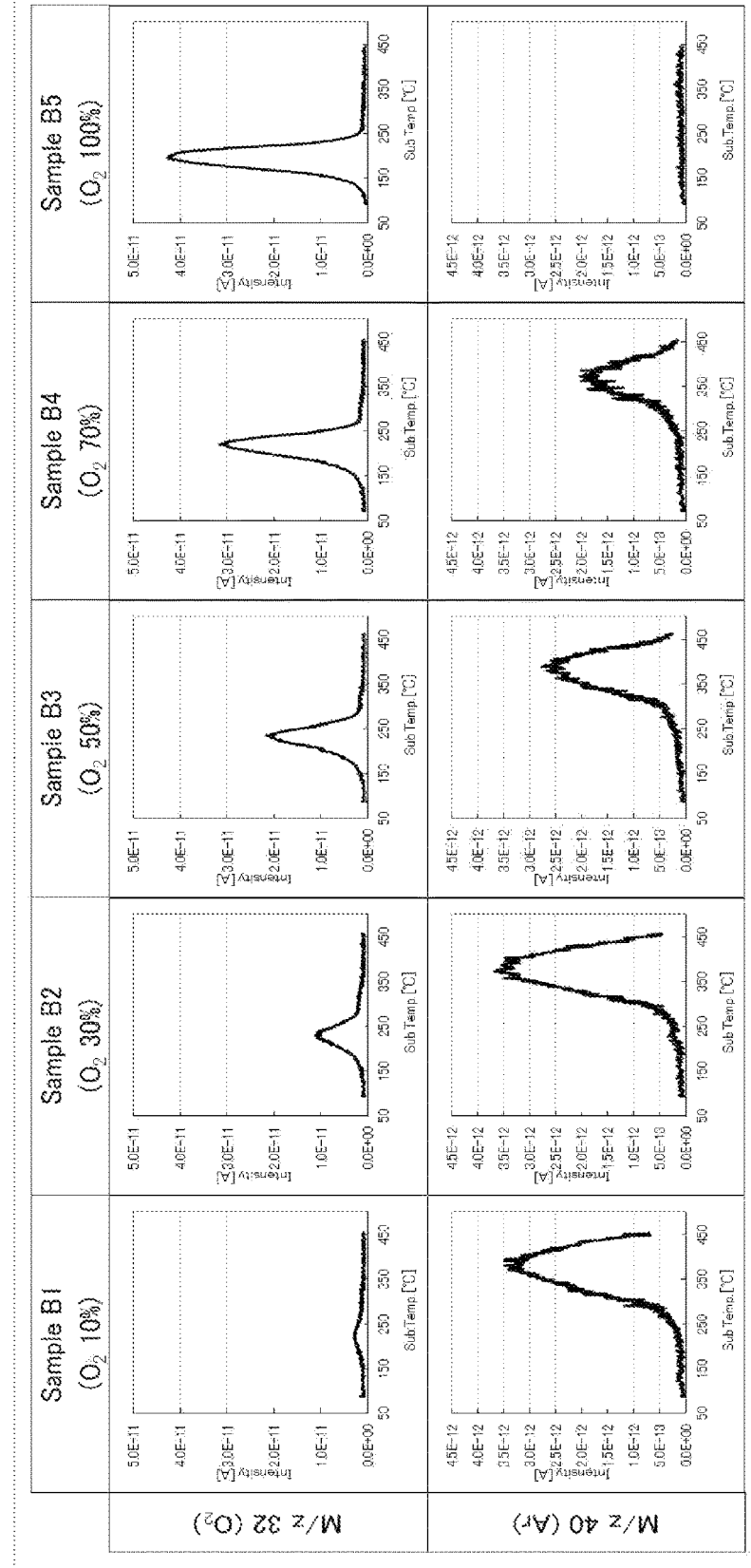
FIG. 27 shows results of TDS analysis.

FIG. 27 shows TDS analysis results of the samples. FIG. 27 shows the results of a mass-to-charge ratio (M/z) of 32, which corresponds to an oxygen molecule, and the results of a mass-to-charge ratio of 40, which corresponds to argon. The horizontal axis represents substrate temperature (Sub. Temp.) and the vertical axis represents detection intensity (Intensity).

As shown in FIG. 27, release of the oxygen molecule is noticeable in each of the samples at a temperature in the range of approximately 150° C. to 300° C., and peaks at a temperature in the range of 200° C. to 250° C. Furthermore, it is confirmed that the higher the oxygen flow rate ratio in forming the metal oxide film is, the larger the amount of oxygen released from the insulating layer is.

In contrast, release of argon is noticeable at a temperature in the range of approximately 250° C. to 450° C., and peaks at a temperature in the range of 350° C. to 400° C. Furthermore, it is confirmed that the higher the oxygen flow rate ratio in forming the metal oxide film is, the smaller the amount of released argon tends to be. In particular, release of argon is hardly observed at an oxygen flow rate ratio of 100%, which suggests that release of argon in the TDS analysis is caused by the formation gas of the metal oxide film.

Figure 28A:
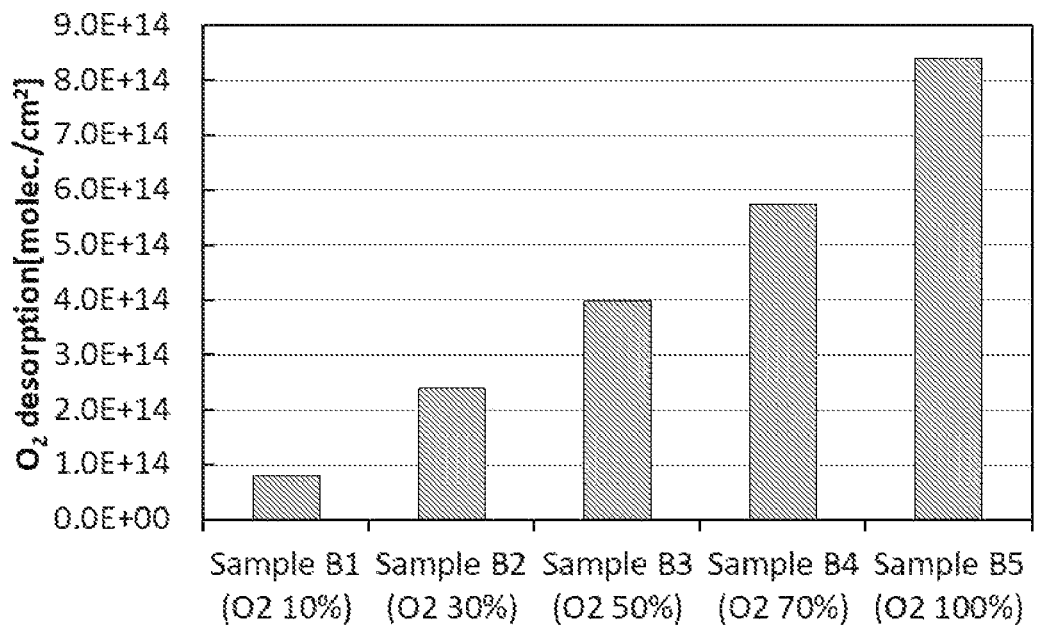
FIGS. 28A and 28B show results of TDS analysis.
Figure 28B:
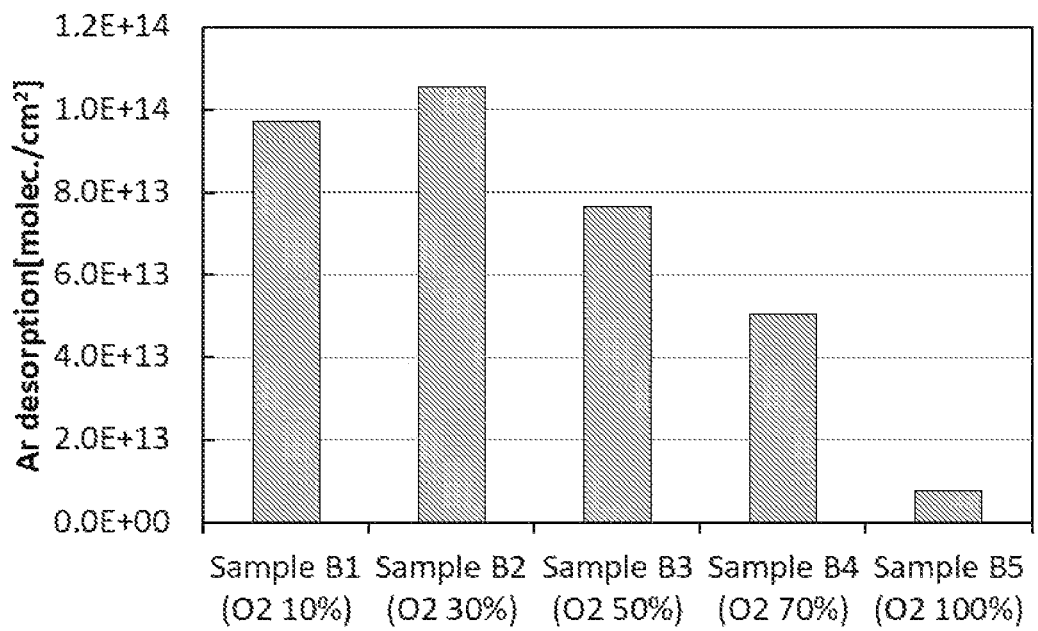

FIGS. 28A and 28B show quantitative values of the amounts (desorption) of released oxygen molecules and released argon calculated from the TDS analysis results in FIG. 27.

It is confirmed from FIG. 28A that the higher the oxygen flow rate ratio in forming the metal oxide film is, the larger the amount of oxygen molecules released from the insulating layer is. In other words, it is confirmed that in the case where the insulating layer is used as the second gate insulating layer, the higher the oxygen flow rate in forming the metal oxide film is, the larger the amount of oxygen supplied to the semiconductor layer can be.

It is confirmed from FIG. 28B that the amount of argon released from the insulating layer can also be controlled by the oxygen flow rate ratio in forming the metal oxide film.

Example 3

In this example, samples (samples C1 to C4) each having a stacked-layer structure of an insulating film and a metal oxide film were fabricated, and the influence of formation of the metal oxide film on the insulating film was evaluated.

[Sample Fabrication]

First, over a quartz substrate, an approximately 50-nm-thick first silicon nitride film, an approximately 200-nm-thick second silicon nitride film, an approximately 50-nm-thick third silicon nitride film, and an approximately 3-nm-thick silicon oxynitride film were stacked by a PECVD method.

The first silicon nitride film was formed under the following conditions: the flow rates of a silane gas, a nitrogen gas, and an ammonia gas were 200 sccm, 2000 sccm, and 100 sccm, respectively; the pressure was 100 Pa; the deposition power was 2000 W; and the substrate temperature was 350° C.

The second silicon nitride film was formed under the following conditions: the flow rates of a silane gas, a nitrogen gas, and an ammonia gas were 290 sccm, 2000 sccm, and 2000 sccm, respectively; the pressure was 200 Pa; the deposition power was 3000 W; and the substrate temperature was 350° C.

The third silicon nitride film was formed under the following conditions: the flow rates of a silane gas, a nitrogen gas, and an ammonia gas were 200 sccm, 2000 sccm, and 100 sccm, respectively; the pressure was 100 Pa; the deposition power was 2000 W; and the substrate temperature was 350° C.

The silicon oxynitride film was formed under the following conditions: the flow rates of a silane gas and a dinitrogen monoxide gas were 20 sccm and 3000 sccm, respectively; the pressure was 40 Pa; the deposition power was 3000 W; and the substrate temperature was 350° C.

Next, an approximately 30-nm-thick metal oxide film was formed over the silicon oxynitride film. The metal oxide film was formed by a sputtering method using a metal oxide target having an atomic ratio of metal elements of In:Ga:Zn=4:2:4.1. A mixed gas of an argon gas and an oxygen gas was used as a formation gas, and the flow rate ratio of the oxygen gas was set to 10%. The metal oxide film was formed under the following conditions: the pressure was 0.6 Pa; the power was 2.5 kW; and the substrate was not heated.

Next, heat treatment was performed. The sample C2 was subjected to heat treatment at 350° C. for one hour in a nitrogen gas atmosphere, and then another heat treatment at 350° C. for one hour in a mixed atmosphere of a nitrogen gas and an oxygen gas. The sample C3 was subjected to heat treatment at 370° C. for one hour in a nitrogen gas atmosphere, and then another heat treatment at 370° C. for one hour in a mixed atmosphere of a nitrogen gas and an oxygen gas. The sample C4 was subjected to heat treatment at 400° C. for one hour in a nitrogen gas atmosphere, and then another heat treatment at 400° C. for one hour in a mixed atmosphere of a nitrogen gas and an oxygen gas. The sample C1 was not subjected to heat treatment. Note that the mixed atmosphere had a volume ratio of the nitrogen gas to the oxygen gas of 4:1.

[ESR Measurement]

Next, the samples C1 to C4 were evaluated by electron spin resonance (ESR).

In the ESR measurement, the measurement temperature was 85 K, the high-frequency power (power of microwaves) of 9.2 GHz was 10 mW, and the direction of a magnetic field was parallel to a film surface of each sample. The lower detection limit was $3.5 \times 10^{17}$ spins/cm$^3$.

Figure 29A:
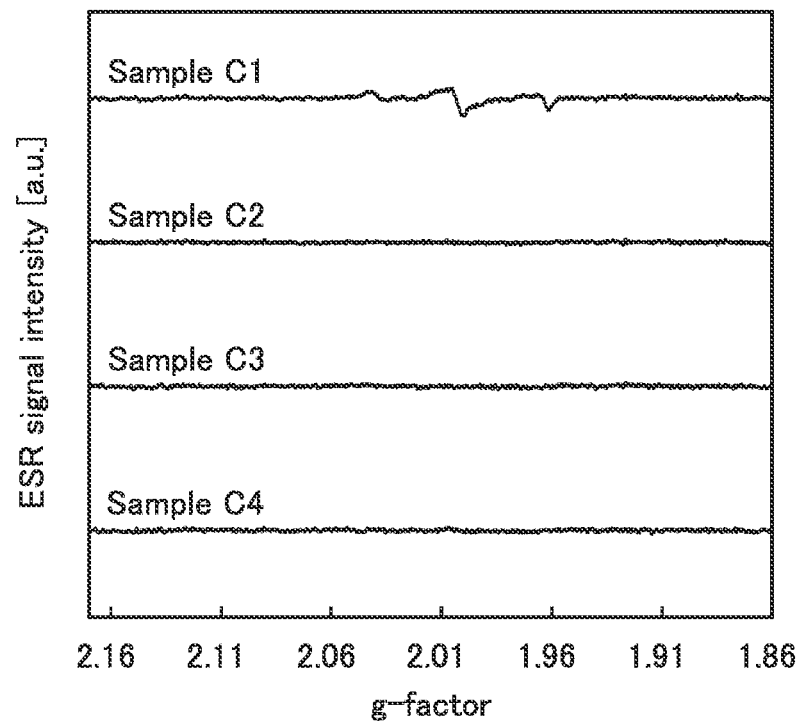
FIGS. 29A to 29C show results of ESR measurement.

FIG. 29A shows ESR spectra of the samples C1 to C4. In FIG. 29A, the horizontal axis represents a g value (g-factor) and the vertical axis represents ESR signal intensity. As shown in FIG. 29A, signals are observed in the sample C1. Signal intensities of the samples C2, C3, and C4 are lower than the lower detection limit.

Figure 29B:
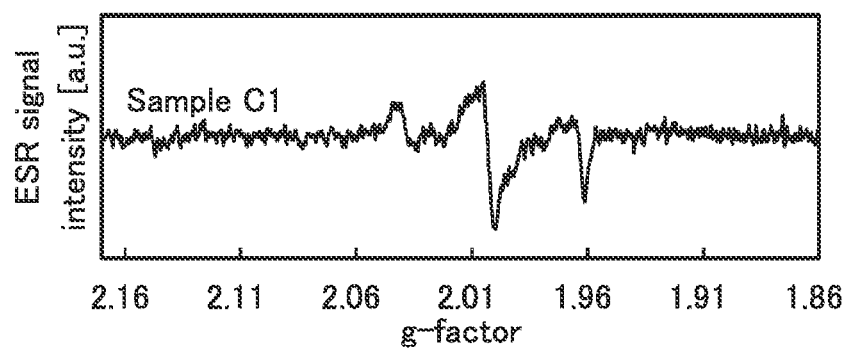

FIG. 29B is an enlarged view of the ESR spectrum of the sample C1. The shapes of the signals imply that a signal due to a peroxide radical (POR) in the silicon oxynitride film and a signal due to nitrogen dioxide (NO$_2$) in the silicon oxynitride film overlap.

Here, an asymmetric signal due to POR is observed at a g-factor of around 2.00. In contrast, according to the nitrogen nuclear spin, the signal due to NO$_2$ is divided into three signals, which are observed at a g-factor of around 2.04, 2.00, and 1.96.

Figure 29C:
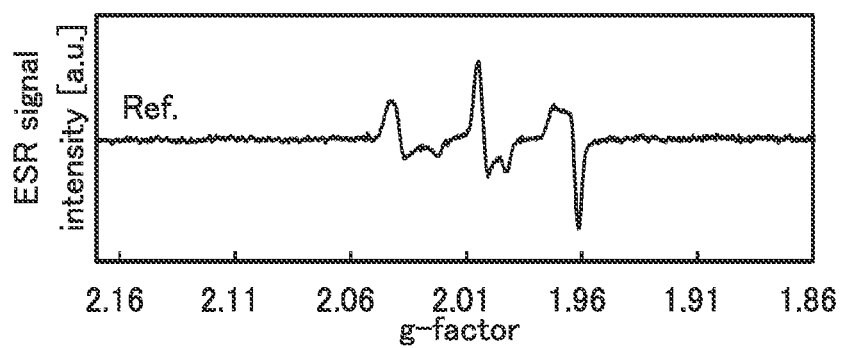

As a reference, FIG. 29C shows an ESR spectrum of a reference sample (Ref) in which a silicon oxynitride film is formed over a quartz substrate. FIG. 29C shows a typical example of the signal due to NO$_2$ in the silicon oxynitride film. As shown in FIGS. 29B and 29C, the signal due to POR and the signal due to NO$_2$ probably overlap in the ESR spectrum of the sample C1.

On the basis of the shape of the signal due to NO$_2$, the spin density of the signal due to NO$_2$ of the sample C1 is calculated to be $9.9 \times 10^{18}$ spins/cm$^3$. The spin density of the signal due to POR cannot be calculated because of the overlap of the signal due to POR and the signal due to NO$_2$.

It is found from the above results that when a metal oxide film is formed over a silicon oxynitride film, POR is formed in the silicon oxynitride film and POR is reduced by heat treatment. It is also found that NO$_2$ in the silicon oxynitride film is reduced by heat treatment.

Example 4

In this example, the evaluation results of the electrical characteristics and the reliability of transistors fabricated according to embodiments of the present invention are described.

[Sample Fabrication]

For the structures of the fabricated transistors, the transistor 100 and the transistor 100A described in Embodiment 1 can be referred to. That is, here, the transistor 100A including a back gate electrode and the transistor 100 without a back gate electrode were fabricated through the same steps.

First, an approximately 100-nm-thick tungsten film was formed over a glass substrate by a sputtering method, and the tungsten film was processed to form a first gate electrode. Then, as a first gate insulating layer, an approximately 240-nm-thick first silicon nitride film, an approximately 60-nm-thick second silicon nitride film, and an approximately 5-nm-thick silicon oxynitride film were stacked by a PECVD method.

The first to third silicon nitride films were formed under the same conditions as those in Example 1.

Next, over the first gate insulating layer, a single layer of a metal oxide film or a stacked layer of metal oxide films was formed to a total thickness of 30 nm, and was processed to form a semiconductor layer. Here, five kinds of samples including the metal oxide films having different structures were fabricated.

The metal oxide film of each of samples D1 and E1 was formed by a sputtering method using a metal oxide target to have an atomic ratio of metal elements of In:Ga:Zn=1:1:1. A mixed gas of an argon gas and an oxygen gas was used as a formation gas, and the flow rate ratio of the oxygen gas was set to 30%. The film formation was carried out without heating the substrate.

In each of samples D2 to D5 and samples E2 to E5, an approximately 25-nm-thick first metal oxide film and an approximately 5-nm-thick second metal oxide film were stacked. The first metal oxide film of each sample was formed under the same conditions. The first metal oxide film was formed by a sputtering method using a metal oxide target to have an atomic ratio of metal elements of In:Ga:Zn=1:1:1. A mixed gas of an argon gas and an oxygen gas was used as a formation gas, and the flow rate ratio of the oxygen gas was set to 30%. The film formation was carried out without heating the substrate.

The second metal oxide film of each of the samples D2 and E2 was formed by a sputtering method using a metal oxide target to have an atomic ratio of metal elements of In:Ga:Zn=4:2:3. A mixed gas of an argon gas and an oxygen gas was used as a formation gas, and the flow rate ratio of the oxygen gas was set to 10%. The film formation was carried out without heating the substrate. The second metal oxide film was formed successively after formation of the first metal oxide film without exposure to the air.

The second metal oxide film of each of the samples D3 and E3 was formed by a sputtering method using a metal oxide target to have an atomic ratio of metal elements of In:Ga:Zn=5:1:6. A mixed gas of an argon gas and an oxygen gas was used as a formation gas, and the flow rate ratio of the oxygen gas was set to 2%. The film formation was carried out without heating the substrate. The second metal oxide film was formed successively after formation of the first metal oxide film without exposure to the air.

The second metal oxide film of each of the samples D4 and E4 was formed by a sputtering method using a metal oxide target having an atomic ratio of metal elements of In:Zn=2:3. A mixed gas of an argon gas and an oxygen gas was used as a formation gas, and the flow rate ratio of the oxygen gas was set to 2%. The film formation was carried out without heating the substrate. The second metal oxide film was formed successively after formation of the first metal oxide film without exposure to the air.

The second metal oxide film of each of the samples D5 and E5 was formed by a sputtering method using a metal oxide target having an atomic ratio of metal elements of In:Sn:Si=80:9:11. A mixed gas of an argon gas and an oxygen gas was used as a formation gas, and the flow rate ratio of the oxygen gas was set to 6%. The film formation was carried out without heating the substrate.

After the semiconductor layer was formed, heat treatment was performed at 350° C. for one hour in a nitrogen gas atmosphere, and then another heat treatment was performed at 350° C. for one hour in a mixed atmosphere of a nitrogen gas and an oxygen gas.

Next, as a second gate insulating layer, an approximately 5-nm-thick first silicon oxynitride film, an approximately 140-nm-thick second silicon oxynitride film, and an approximately 5-nm-thick third silicon oxynitride film were formed by a PECVD method.

The first to third silicon nitride films were formed under the same conditions as those in Example 1.

Next, a metal oxide film was formed over the second gate insulating layer by a sputtering method. Here, the metal oxide film was formed under two conditions described below.

In the samples D1 to D5, an approximately 20-nm-thick metal oxide film was formed. The metal oxide film was formed to have an atomic ratio of metal elements of In:Ga:Zn=4:2:3 in an atmosphere containing oxygen and using a metal oxide target.

In the samples E1 to E5, an approximately 5-nm-thick metal oxide film was formed. The metal oxide film was formed by a reactive sputtering method using an aluminum target in an atmosphere containing oxygen.

After the metal oxide film was formed, heat treatment was performed at 350° C. for one hour in an atmosphere containing nitrogen and oxygen.

Then, an approximately 100-nm-thick molybdenum film was formed over the metal oxide film by a sputtering method. After that, the molybdenum film was removed by etching, so that a second gate electrode and a metal oxide layer were formed. In the samples D1 to D5, part of the molybdenum film and part of the metal oxide film were removed by this etching. In contrast, in the samples E1 to E5, only the molybdenum film was removed by this etching.

Then, boron was added as an impurity element with the use of the second gate electrode as a mask. A plasma ion doping apparatus was used for addition of the impurity. A $B_2H_6$ gas was used as a gas for supplying boron.

Next, as a protective insulating layer for covering the transistor, an approximately 300 nm-thick silicon oxynitride film was formed by a PECVD method. After that, openings were formed by partly etching the protective insulating layer and the second gate insulating layer, and a molybdenum film was formed by a sputtering method and processed to form a source electrode and a drain electrode. Then, an approximately 1.5-μm-thick acrylic film was formed as a planarization layer, and heat treatment was performed at 250° C. for one hour in a nitrogen atmosphere.

Through the above steps, the samples D1 to D5 and the samples E1 to E5 including the transistors formed over the glass substrates were obtained.

[Id-Vg Characteristics of Transistors]

Next, the Id-Vg characteristics of the fabricated transistors were measured.

The Id-Vg characteristics of the transistors were measured under the following conditions. A voltage applied to the gate electrode (hereinafter also referred to as gate voltage (Vg)) was changed from −15 V to +20 V in increments of 0.25 V. A voltage applied to the source electrode (hereinafter also referred to as source voltage (Vs)) was 0 V (comm), and a voltage applied to the drain electrode (hereinafter also referred to as drain voltage (Vd)) was 0.1 V or 10 V.

The measured transistors each had a designed channel width of 50 μm and a designed channel length of 1.5 μm, 2 μm, or 3 μm. Single-gate transistors of the samples D1 to D5, single-gate transistors of the samples E1 to E5, and dual-gate transistors of the samples E1 to E5 were measured. The number of the evaluated transistors was 20 for each sample.

[Reliability Evaluation]

Next, a GBT test was performed in order to evaluate the reliability of the transistors. In the GBT test, the substrate over which the transistor was formed was held at 60° C., a voltage of 0 V was applied to the source and the drain of the transistor, and a voltage of 20 V or −20 V was applied to the gate; this state was held for one hour. Here, a PBTS test and an NBTIS test are particularly described. Note that in the NBTIS test, the samples were irradiated with white LED light with approximately 10000 1x.

[Result 1]

Figure 30A:
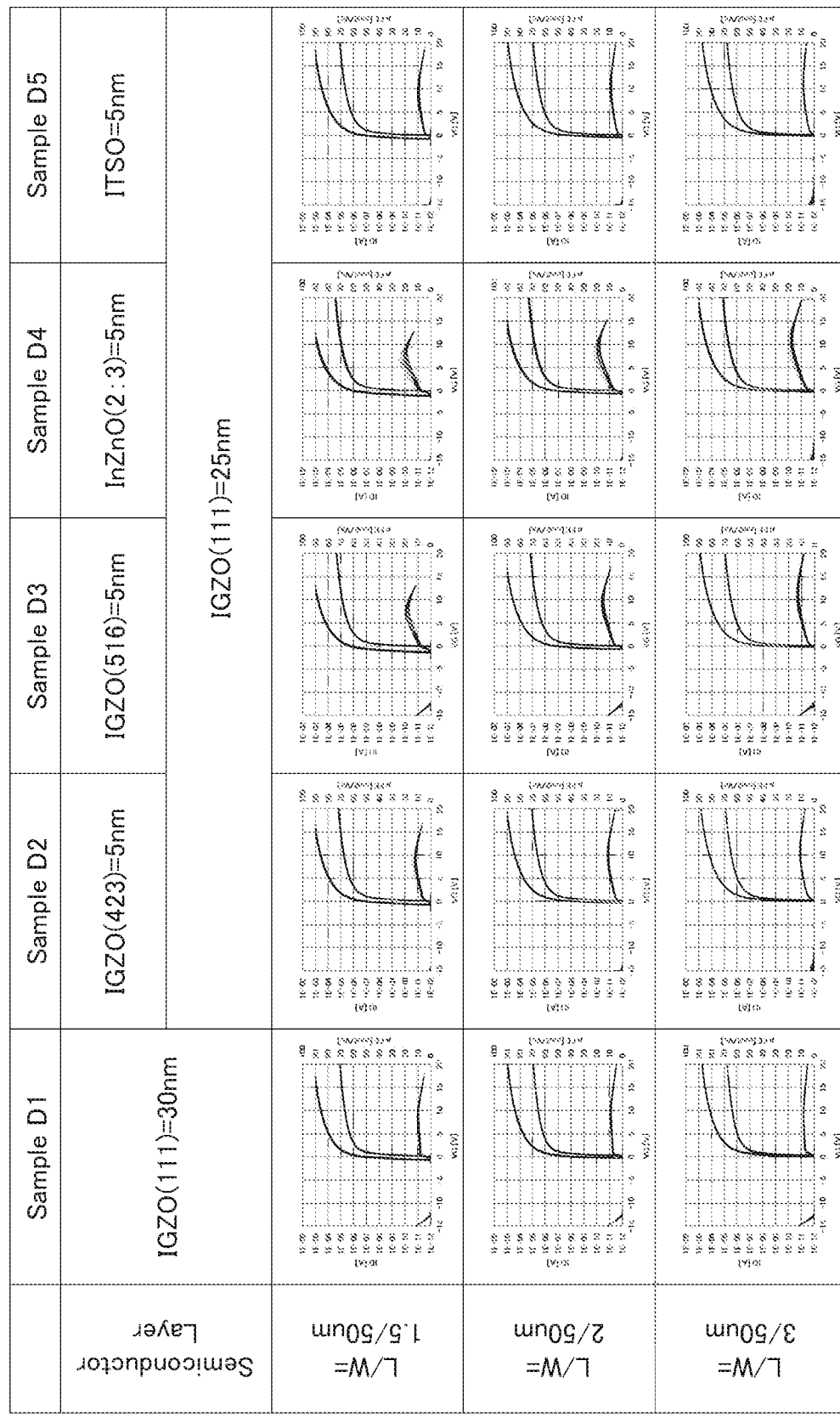
FIG. 30A shows Id-Vg characteristics of transistors.

FIG. 30A shows the Id-Vg characteristics of the transistors of the samples D1 to D5. Each graph shows two Id-Vg characteristics at different drain voltages (Vd) and field-effect mobility (μFE) calculated from the Id-Vg characteristics in the case of Vd=10 V.

In FIG. 30A and the following description, the composition and the kind of the metal oxide film included in the semiconductor layer are simply expressed as IGZO(111), IGZO(423), IGZO(516), InZnO(2:3), or ITSO.

As shown in FIG. 30A, all of the samples exhibit favorable characteristics even when the transistors have a channel length of as small as 1.5 μm. Furthermore, at the same Vg, a larger amount of current can flow through the samples D2 to D5 in an on state, each of which include a semiconductor layer having a stacked-layer structure, than through the sample D1 including a semiconductor layer having a single-layer structure.

FIG. 30B shows the amounts of changes in the threshold voltage (ΔVth) of the samples D1 to D5 after the PBTS test and the NBTIS test.

When the PBTS test is focused on, ΔVth of the sample D1 is the largest, and ΔVth of each of the samples D2 to D5 is smaller than or equal to half of ΔVth of the sample D1.

In contrast, when the NBTIS test is focused on, ΔVth of each of the samples D4 and D5 is slightly larger than those of the other samples; however, ΔVth of any of the samples is 2 V or less, which means that the samples have favorable reliability.

[Result 2]

Figure 31A:
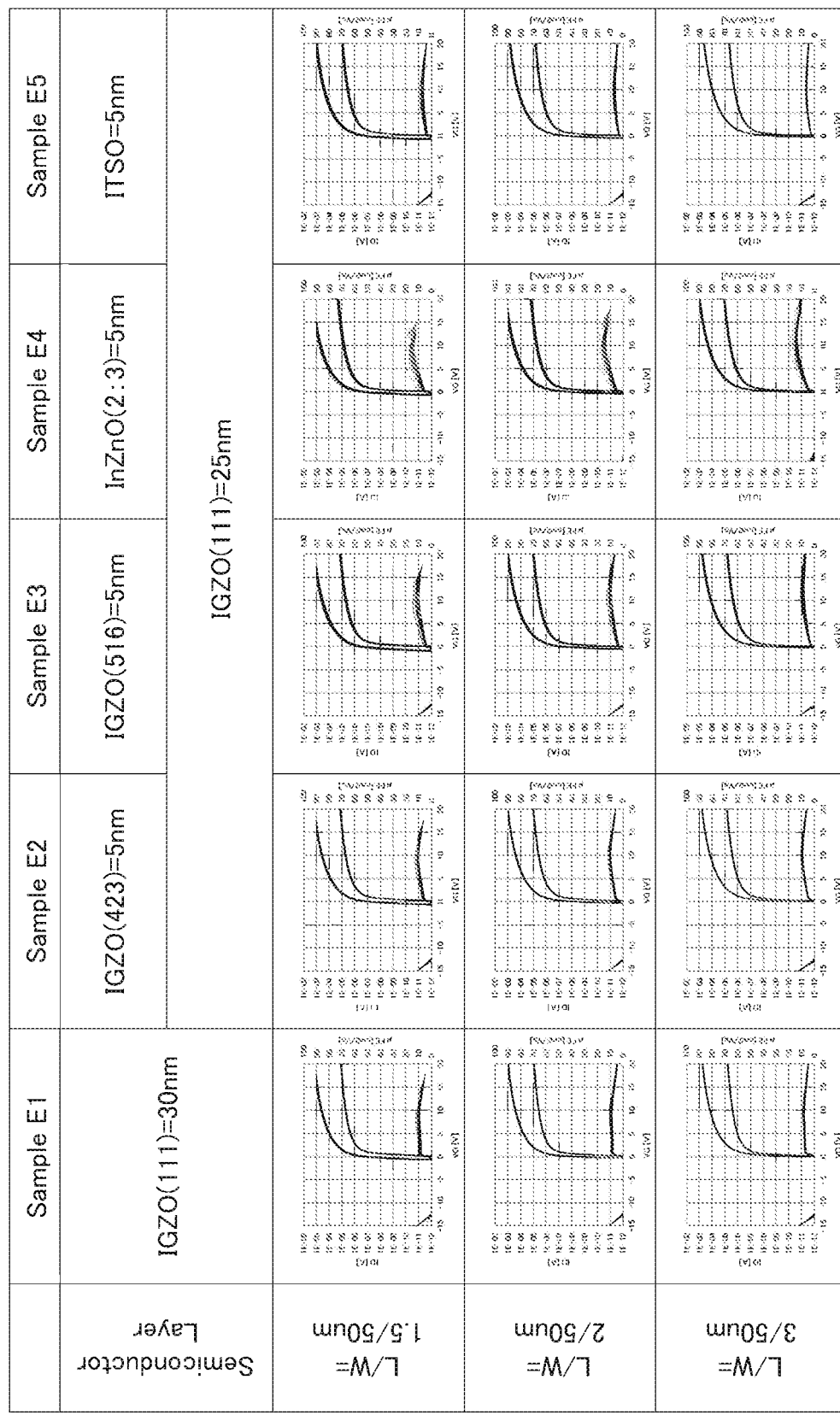
FIG. 31A shows Id-Vg characteristics of transistors.

FIG. 31A shows the Id-Vg characteristics of the transistors of the samples E1 to E5. Like the samples D1 to D5, the samples E1 to E5 have favorable electrical characteristics.

Figure 31B:
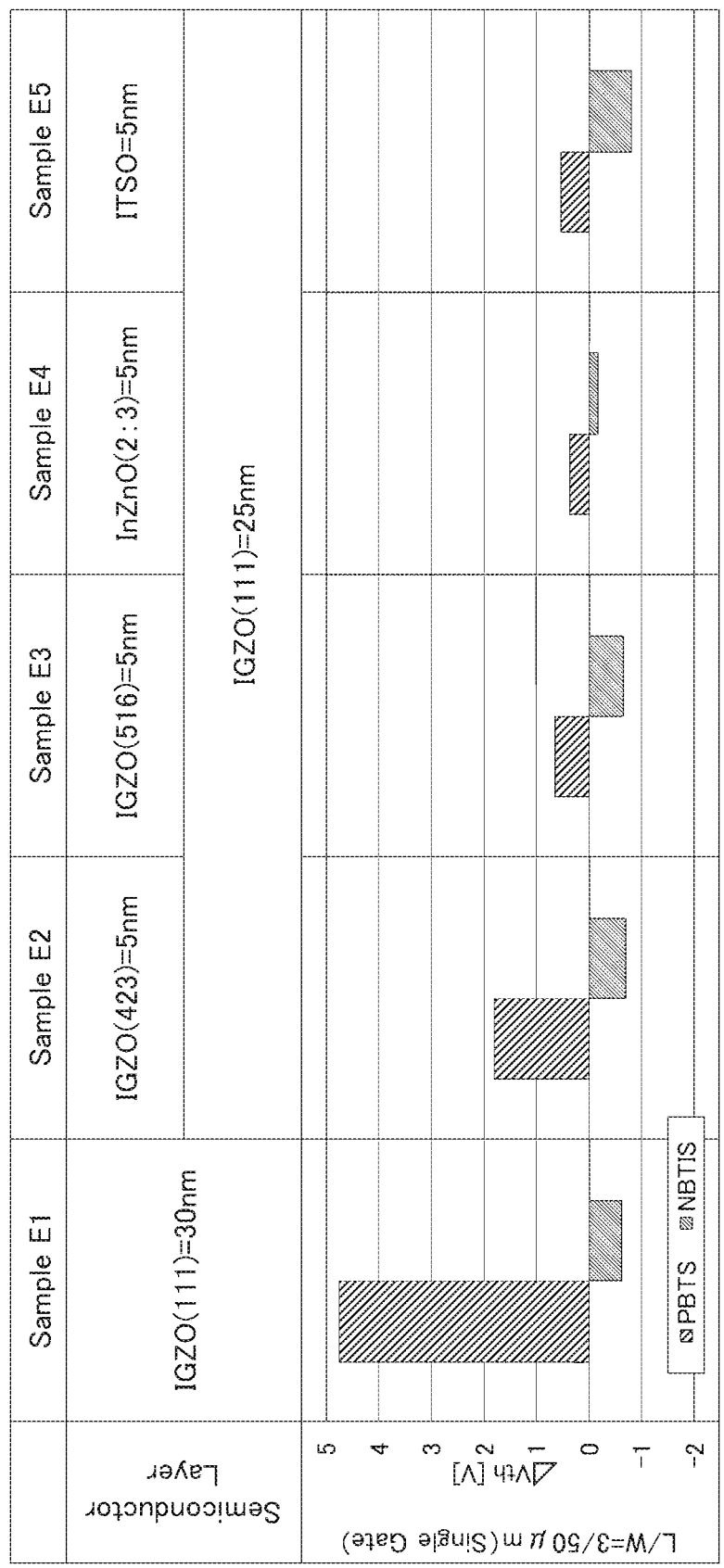
FIG. 31B shows results of a reliability test of the transistors.

FIG. 31B shows ΔVth of the samples E1 to E5 after the reliability tests.

In the sample E1, ΔVth in the PBTS test is large. This is probably due to an insufficient amount of oxygen supplied to the semiconductor layer, since the metal oxide film formed over the gate insulating layer of the sample E1 is different from that of the sample D1.

However, in the PBTS test, ΔVth of the samples E2 to E5 each including the semiconductor layer having a stacked-layer structure is much smaller than that of the sample E1. In particular, the lower the gallium content percentage of the second metal oxide film is, the smaller ΔVth in the PBTS test tends to be.

Meanwhile, in the NBTIS test, AVth of each sample is small, and AVth of the sample E4 is extremely small in particular.

[Result 3]

Figure 32A:
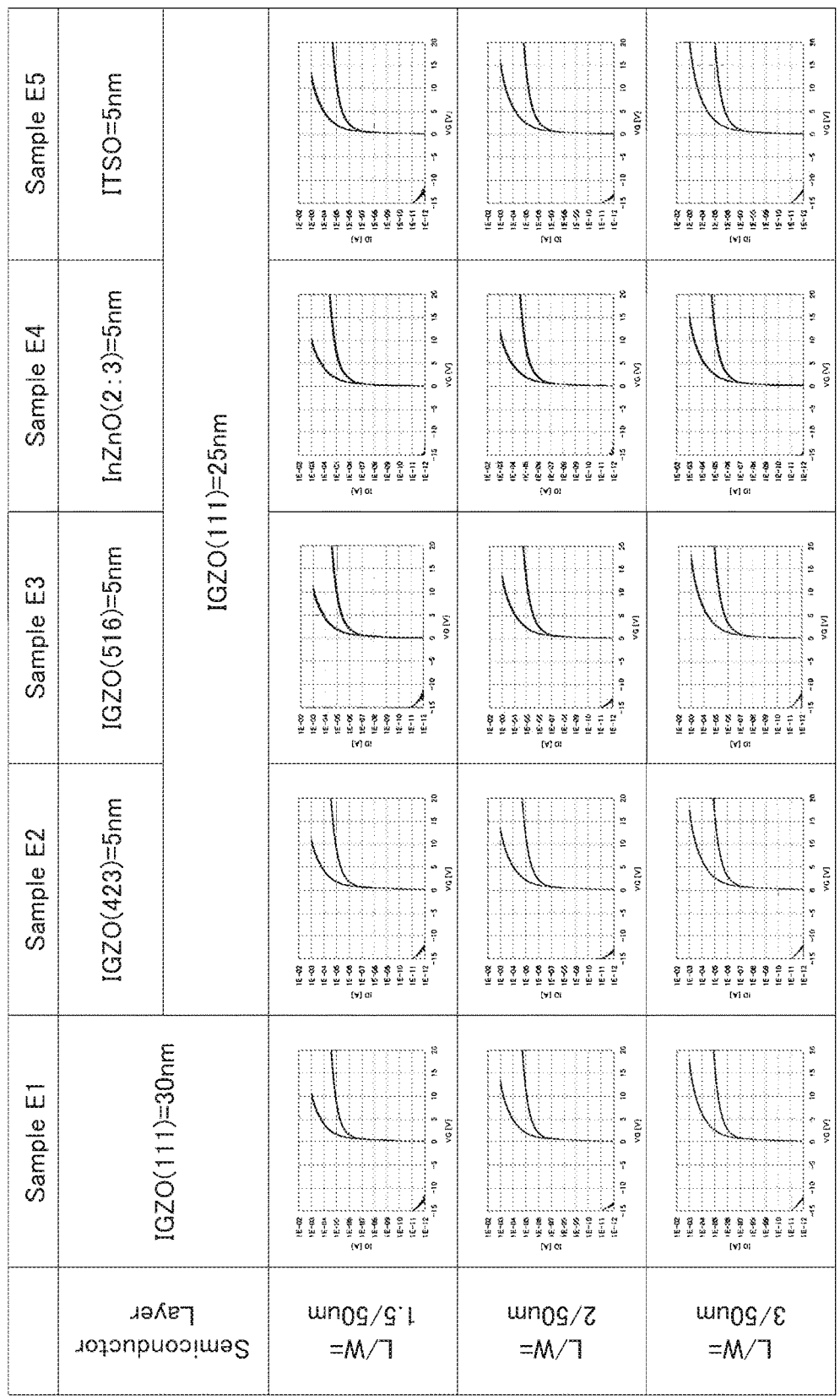
FIG. 32A shows Id-Vg characteristics of transistors.
Figure 32B:
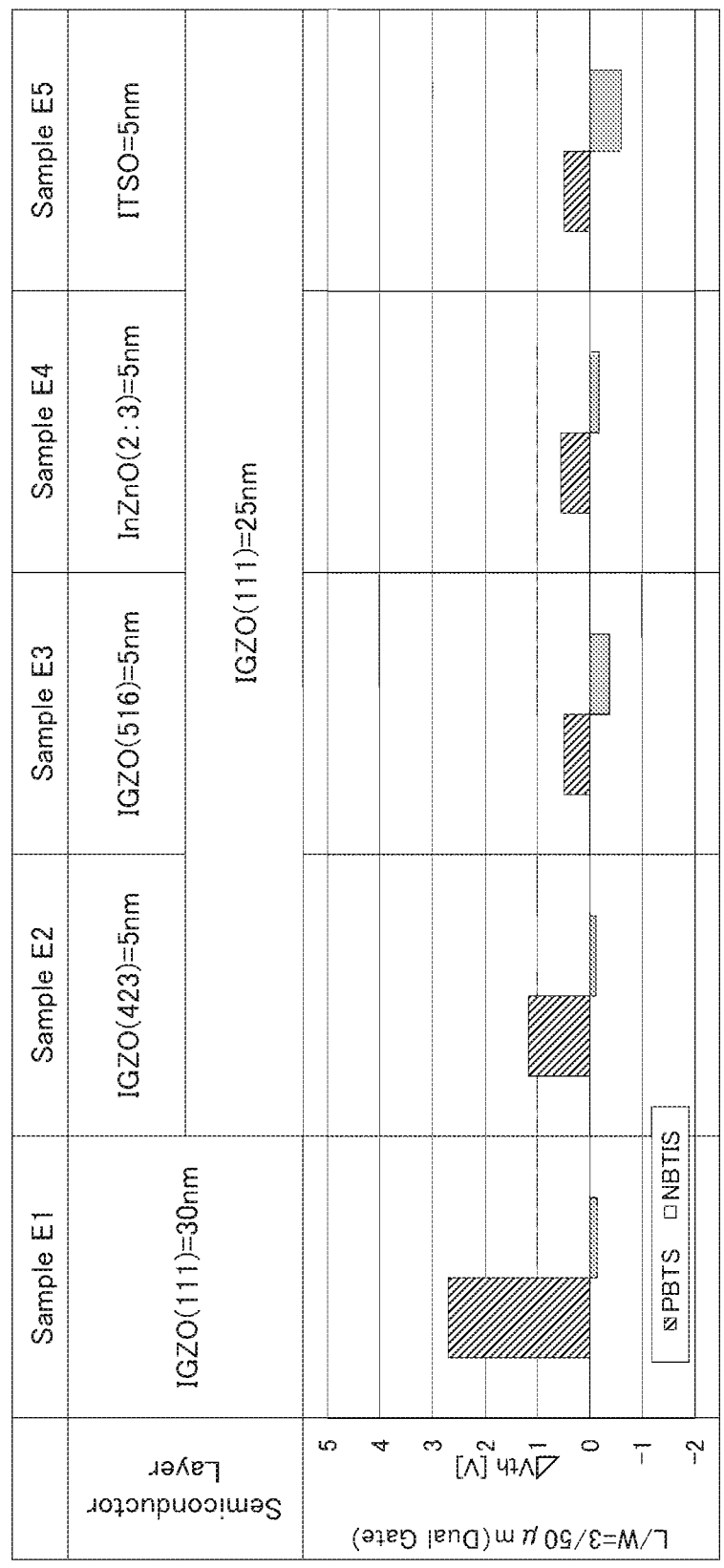
FIG. 32B shows results of a reliability test of the transistors.

FIGS. 32A and 32B show the results of the dual-gate transistors of the samples E1 to E5.

It is found from FIG. 32A that variations in the transistor characteristics of the dual-gate transistors are much smaller than those of the single-gate transistors.

As shown in FIG. 32B, it is confirmed that AVth of the dual-gate transistors is small particularly in the NBTIS test.

The above results show that a transistor with extremely favorable electrical characteristics and extremely high reliability can be provided with the use of a semiconductor layer in which a second metal oxide film, which is in contact with a gate insulating layer and has an indium content percentage higher than a gallium content percentage, and a first metal oxide film, which is thicker than the second metal oxide film and has a high gallium content percentage, are stacked. In particular, it is found that a transistor with extremely favorable electrical characteristics and extremely high reliability can be provided also by using a metal oxide film not containing gallium as the second metal oxide film. In addition, it is suggested that gallium in the metal oxide film in contact with the gate insulating layer is a factor of degradation of characteristics in the PBTS test.

Example 5

[Consideration of Change in Threshold Voltage in PBTS Test]

In this example, change in threshold voltage in a PBTS test is considered. Specifically, the reason why the amount of change in the threshold voltage in a PBTS test is increased by using, as the semiconductor layer 108, a metal oxide film that contains excess oxygen and has a high gallium content percentage is explained using results of the first-principles calculation.

It is presumed that an increase in the amount of change in the threshold voltage in the PBTS test is caused by formation of an acceptor defect trapping an electron and elimination of a donor defect releasing an electron. Here, formation of an acceptor defect is focused on as a mechanism by which the amount of change in the threshold voltage in the PBTS test is increased.

Here, a calculation model and calculation conditions which were used for the following calculation will be described.

As a calculation model, a region corresponding to 6 atomic layers was taken out of a crystal structure of an In—Ga—Zn oxide having an atomic ratio of In:Ga:Zn:O=1:1:1:4. The total number of atoms included in the region was 56. Note that in the case where the calculation model has a structure including excess oxygen described later, the total number of atoms included in the calculation model is 57.

Next, a vacuum layer was provided in the c-axis direction of the region. In other words, the calculation model had a slab structure having periodicity in the a-axis direction and the b-axis direction but no periodicity in the c-axis direction. Note that the uppermost layer of the slab structure was formed of 0 and one or both of Ga and Zn.

In the calculation, first-principles calculation software VASP (The Vienna Ab initio simulation Package) was used. Calculation conditions other than the above conditions are shown in Table 1. As for correction of the vacuum layer, a dipole layer method was used.

TABLE 1

| Software | VASP |
|---|---|
| Basis function | Plane wave |
| Functional | GGA/PBE |
| Pseudo potential | PAW |
| Cutoff energy | 500 eV |
| k-point grid | 4 × 4 × 1 |

In addition, the nudged elastic band (NEB) method, which is to find a chemical reaction path, was employed for the following calculation of the reaction path. The NEB method is used to search the minimum energy path between the initial and final states. The energy height (energy difference) from the initial state to the minimum energy path is referred to as a reaction barrier.

The above is the description of the calculation model and the calculation conditions used for the following calculation.

Next, possible defects of the defect before the PBTS test (in the initial state) and the defect during the PBTS test (in the final state) are described. In this example, the defect in the initial state and the defect in the final state are due to excess oxygen. Note that in this calculation, the defect is positioned in the uppermost layer of the slab structure.

Figure 33A:
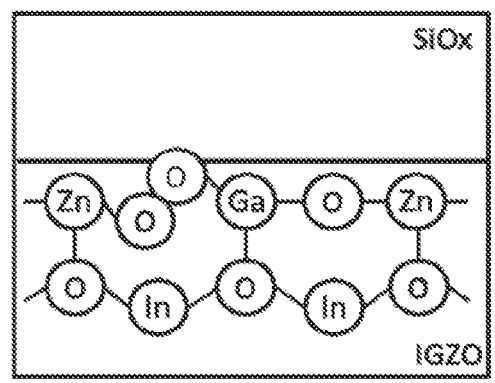
FIG. 33A is a conceptual view of a split structure.

In the initial state, a structure without an electron trap is employed. As the structure without an electron trap, a structure in which two oxygen atoms exist in an oxygen site is assumed. Note that a structure in which two oxygen atoms exist in an oxygen site is referred to as a split structure in some cases. FIG. 33A is a conceptual view of the split structure.

Figure 33B:
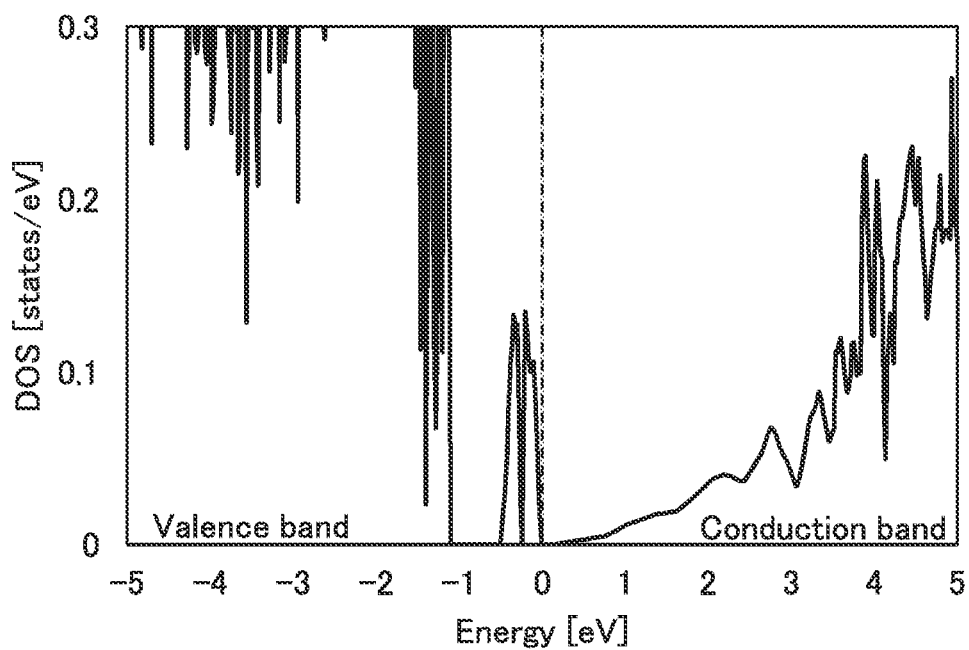
FIG. 33B shows the density of states of an oxide semiconductor having the split structure.

FIG. 33B shows the density of states obtained by performing calculation on a calculation model having the split structure. In FIG. 33B, the horizontal axis represents energy [eV], and the vertical axis represents the density of states (DOS) [states/eV]. The quasi-Fermi level is adjusted to be 0 eV in the horizontal axis.

According to FIG. 33B, the quasi-Fermi level is positioned on an upper side of a level in the gap (high energy side). Thus, it is found that an electron is not trapped by the split structure, that is, the split structure is not an acceptor. Accordingly, the calculation model having the split structure is used as the initial state.

Figure 34A:
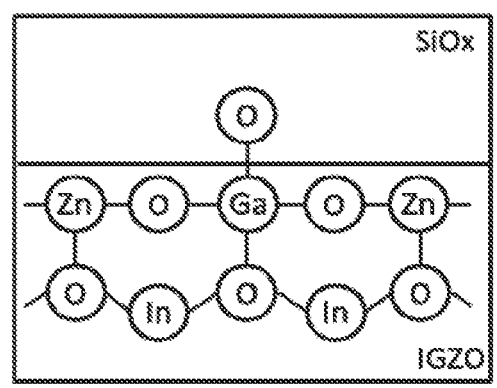
FIG. 34A is a conceptual view of a Ga—O structure.

The final state is the structure that traps electrons (acceptor defect). As the structure that traps electrons, oxygen that is bonded to a gallium atom and has a dangling bond is assumed. Note that the structure in which oxygen is bonded to a gallium atom and has a dangling bond is referred to as a Ga—O structure in some cases. FIG. 34A is a conceptual view of the Ga—O structure.

Figure 34B:
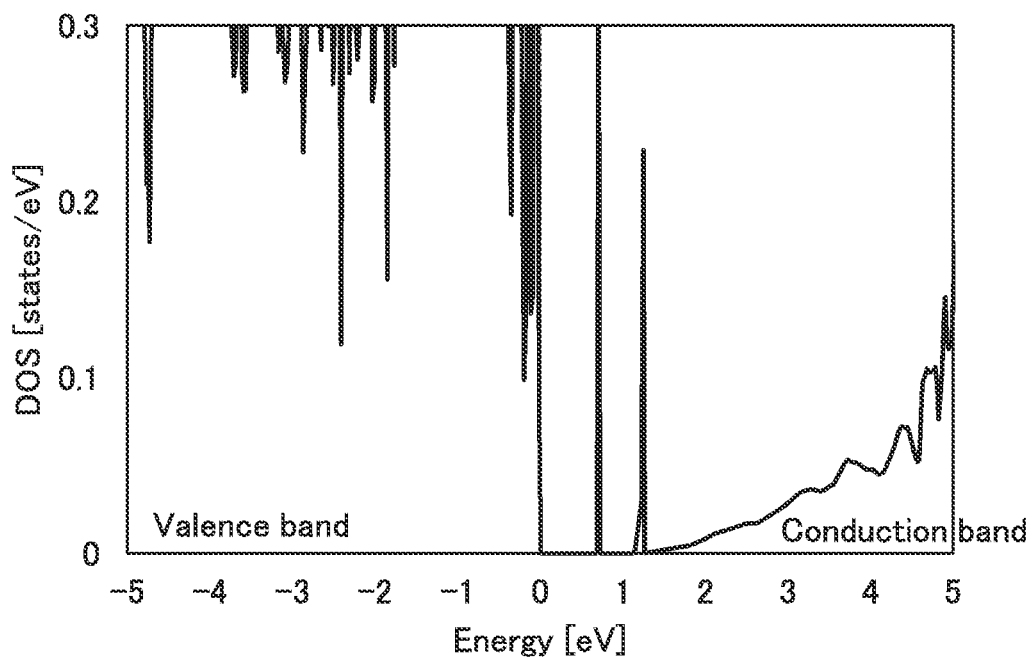
FIG. 34B shows the density of states of an oxide semiconductor having the Ga—O structure.

FIG. 34B shows the density of states obtained by performing calculation on a calculation model having the Ga—O structure. In FIG. 34B, the horizontal axis represents energy [eV], and the vertical axis represents the density of states (DOS) [states/eV]. The quasi-Fermi level (the highest occupied level of electrons) is adjusted to be 0 eV in the horizontal axis.

According to FIG. 34B, the quasi-Fermi level is positioned on an lower side of a level in the gap (low energy side). That is, the acceptor defect is formed. Thus, it is found that the Ga—O structure is an acceptor that traps electrons. Accordingly, the calculation model having the Ga—O structure is used as the final state.

Next, energy change in the reaction path from the initial state to the final state, and change in energy relationship between the initial state and the final state, before and during the PBTS test due to difference in composition of the uppermost layers of calculation models are evaluated by calculation.

Note that the transistor is assumed to be off before the PBTS test. In other words, carriers are not excited in the metal oxide film before the PBTS test. The transistor is assumed to be on during the PBTS test. In other words, carriers are excited in the metal oxide film during the PBTS test.

Note that carriers are generated when a defect in which hydrogen enters oxygen vacancies (such defect is denoted as VoH) is formed. Thus, in this calculation, the PBTS test is reproduced by providing one VoH in the calculation model. Note that VoH is positioned in an oxygen site that is close to the lowermost surface of the calculation model and in a layer formed of In and O.

Here, two models (calculation model 1A and calculation model 2A) with different compositions of the uppermost surface are prepared. The calculation model 2A is assumed to be a metal oxide film having a higher gallium content percentage than the calculation model 1A. In the metal oxide film having a high gallium content percentage, the uppermost layer is highly probably a layer having a high gallium content percentage. Thus, the calculation model 2A includes, as the uppermost layer, a layer having a higher gallium content percentage than the uppermost layer of the calculation model 1A. Specifically, the uppermost layer of the calculation model 1A has an atomic ratio of Ga:Zn:O=1:1:2. The uppermost layer of the calculation model 2A has an atomic ratio of Ga:O=1:1. Note that the atomic ratio of the calculation model 2A is equalized with that of the calculation model 1A by replacing, with Zn, part of Ga in a layer formed of O and one or both of Ga and Zn. This layer is located below the uppermost layer with a layer formed of In and O therebetween.

The results obtained by calculation of energy change in the reaction path from the initial state to the final state and change in energy relationship between the initial state and the final state are described with the use of the calculation model 1A.

The initial state is the calculation model 1A in which one split structure is provided, and the final state is the calculation model 1A in which one Ga—O structure is provided. Energy change in the reaction path from the initial state to the final state before and during the PBTS test is calculated using the NEB method. The calculation conditions are the same as those in Table 1.

Figure 35A:
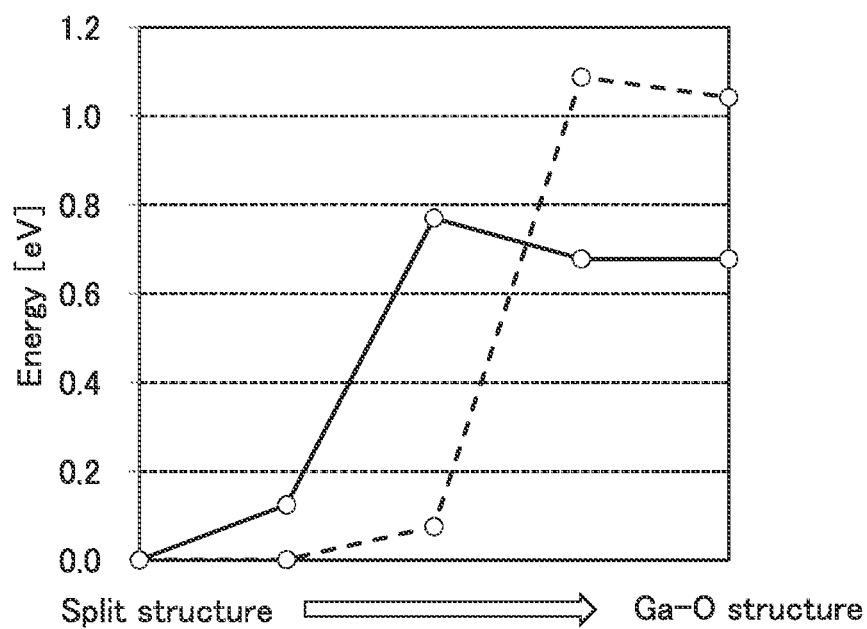
FIGS. 35A and 35B each show energy change in a reaction path.

FIG. 35A shows the calculation results of the energy change in the reaction path from the initial state to the final state in the case of the calculation model 1A. In FIG. 35A, the horizontal axis represents the reaction path. Note that the left side of FIG. 35A represents the initial state, and the right side thereof represents the final state. The vertical axis represents energy [eV]. A dashed line in FIG. 35A shows the calculation result on the assumption of the state before the PBTS test, while a solid line in FIG. 35A is the calculation result on the assumption of the state during the PBTS test.

From FIG. 35A, it is found that the reaction barrier is lower and the final state is more stabilized in the case of assuming the state during the PBTS test than in the case of assuming the state before the PBTS test. However, in either of the case of assuming the state before the PBTS test and the case of assuming the state during the PBTS test, the energy value in the initial state is smaller than the energy value in the final state. That is, it is suggested that the initial state is more stable than the final state. Accordingly, the amount of change in the threshold voltage in the PBTS test is assumed to be small.

Next, the results obtained by calculation of energy change in the reaction path from the initial state to the final state and change in energy relationship between the initial state and the final state are described with the use of the calculation model 2A.

Figure 35B:
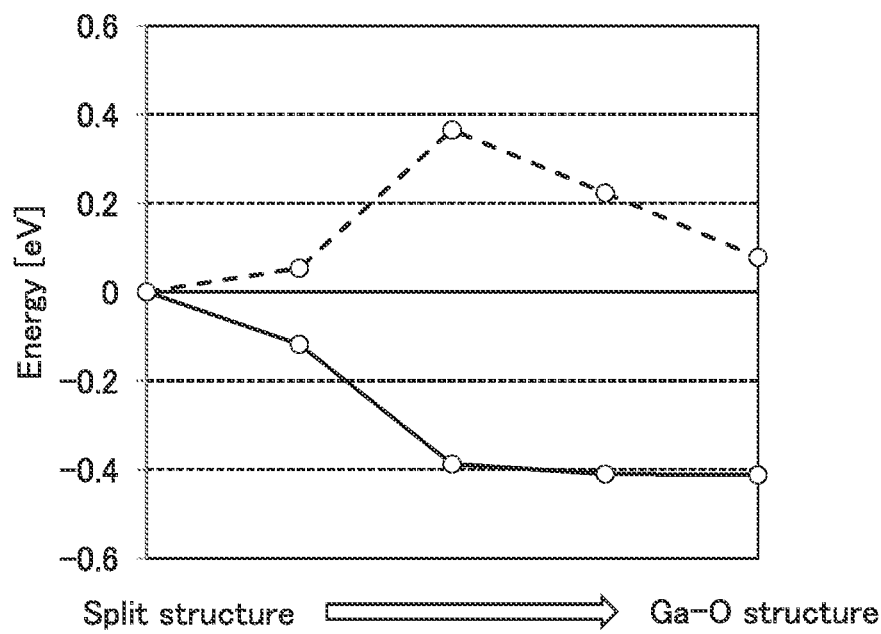

FIG. 35B shows the calculation results of the energy change in the reaction path from the initial state to the final state in the case of the calculation model 2A. In FIG. 35B, the horizontal axis represents the reaction path. Note that the left side of FIG. 35B represents the initial state, and the right side thereof represents the final state. The vertical axis represents energy [eV]. A dashed line in FIG. 35B shows the calculation result on the assumption of the state before the PBTS test, while a solid line in FIG. 35B is the calculation result on the assumption of the state during the PBTS test.

From FIG. 35B, it is found that the reaction barrier is lower and the final state is more stabilized in the case of assuming the state during the PBTS test than in the case of assuming the state before the PBTS test. Moreover, in the case of assuming the state during the PBTS test, the energy value in the final state is smaller than the energy value in the initial state. That is, it is suggested that the final state is more stable than the initial state. Accordingly, the amount of change in the threshold voltage in the PBTS test is assumed to be large.

From the above, it is assumed that the amount of change in the threshold voltage is increased by using a metal oxide film with a high gallium content percentage as the semiconductor layer 108. In other words, it is assumed that the amount of change in the threshold voltage in the PBTS test is decreased by using a metal oxide film with no gallium or a low gallium content percentage as the semiconductor layer 108.

EXPLANATION OF REFERENCE 10, 10A, 10B, 10C: transistor, 100, 100A, 100B, 100C: transistor, 102: substrate, 103: insulating layer, 103a, 103b, 103c, 103d: insulating film, 106: conductive layer, 108, 108a, 108b: semiconductor layer, 108f: metal oxide film, 108n: low-resistance region, 110: insulating layer, 110a, 110b, 110c: insulating film, 112: conductive layer, 112f: conductive film, 114: metal oxide layer, 114f: metal oxide film, 116: insulating layer, 118: insulating layer, 120a, 120b: conductive layer, 140: impurity element, and 141a, 141b, 142: opening.

This application is based on Japanese Patent Application Serial No. 2018-146787 filed with Japan Patent Office on Aug. 3, 2018, Japanese Patent Application Serial No. 2018-175352 filed with Japan Patent Office on Sep. 19, 2018, Japanese Patent Application Serial No. 2018-201126 filed with Japan Patent Office on Oct. 25, 2018, and Japanese Patent Application Serial No. 2019-061174 filed with Japan Patent Office on Mar. 27, 2019, the entire contents of which are hereby incorporated by reference.

The invention claimed is:
1. A semiconductor device comprising:
a first insulating layer;
a second semiconductor layer comprising indium, gallium, and oxygen, the second semiconductor layer being over the first insulating layer;
a first semiconductor layer over the second semiconductor layer;

a second insulating layer having a stacked-layer structure in which a first insulating film, a second insulating film, and a third insulating film are stacked in this order, the second insulating layer being over the first semiconductor layer; and
a first conductive layer over the second insulating layer,
wherein the first conductive layer is a gate electrode of a transistor,
wherein the first insulating film, the second insulating film, and the third insulating film each comprise an oxide,
wherein the first insulating film comprises a portion in contact with the first semiconductor layer, and
wherein the first semiconductor layer comprises a region having an indium content percentage higher than a gallium content percentage.

2. The semiconductor device according to claim 1,
wherein the first semiconductor layer comprises zinc, and
wherein the first semiconductor layer comprises a region having a zinc content percentage higher than a gallium content percentage.

3. The semiconductor device according to claim 1, wherein the first insulating film is formed at a lower deposition rate than the second insulating film.

4. The semiconductor device according to claim 1, further comprising a source electrode and a drain electrode,
wherein one of the source electrode and the drain electrode is electrically connected to the first semiconductor layer through an opening in the second insulating layer.

5. The semiconductor device according to claim 1, further comprising a metal oxide layer between the second insulating layer and the first conductive layer,
wherein the metal oxide layer comprises one or more elements selected from aluminum, hafnium, indium, gallium, and zinc.

6. The semiconductor device according to claim 5,
wherein the metal oxide layer comprises indium, and
wherein the metal oxide layer and the first semiconductor layer have substantially the same indium content percentage.

7. The semiconductor device according to claim 1, further comprising a second conductive layer,
wherein the second conductive layer comprises a region overlapping with the second semiconductor layer with the first insulating layer therebetween,
wherein the first insulating layer has a stacked-layer structure in which a fourth insulating film, a fifth insulating film, a sixth insulating film, and a seventh insulating film are stacked in this order,
wherein the seventh insulating film comprises oxygen, and
wherein the fourth insulating film, the fifth insulating film, and the sixth insulating film each comprise nitrogen.

8. The semiconductor device according to claim 7,
wherein the seventh insulating film comprises silicon oxide, and
wherein the fourth insulating film, the fifth insulating film, and the sixth insulating film each comprise silicon nitride.

9. A semiconductor device comprising:
a first insulating layer;
a second semiconductor layer comprising indium and oxygen, the second semiconductor layer being over the first insulating layer;
a first semiconductor layer over the second semiconductor layer;
a second insulating layer having a stacked-layer structure in which a first insulating film, a second insulating film, and a third insulating film are stacked in this order, the second insulating layer being over the first semiconductor layer; and
a first conductive layer over the second insulating layer,
wherein the first conductive layer is a gate electrode of a transistor,
wherein the first semiconductor layer does not comprise gallium,
wherein the first insulating film, the second insulating film, and the third insulating film each comprise an oxide, and
wherein the first insulating film comprises a portion in contact with the first semiconductor layer.

10. The semiconductor device according to claim 9, wherein the first semiconductor layer comprises zinc.

11. The semiconductor device according to claim 9, wherein the first insulating film is formed at a lower deposition rate than the second insulating film.

12. The semiconductor device according to claim 9, further comprising a source electrode and a drain electrode,
wherein one of the source electrode and the drain electrode is electrically connected to the first semiconductor layer through an opening in the second insulating layer.

13. The semiconductor device according to claim 9, further comprising a metal oxide layer between the second insulating layer and the first conductive layer,
wherein the metal oxide layer comprises one or more elements selected from aluminum, hafnium, indium, gallium, and zinc.

14. The semiconductor device according to claim 13,
wherein the metal oxide layer comprises indium, and
wherein the metal oxide layer and the first semiconductor layer have substantially the same indium content percentage.

15. The semiconductor device according to claim 9, further comprising a second conductive layer,
wherein the second conductive layer comprises a region overlapping with the second semiconductor layer with the first insulating layer therebetween,
wherein the first insulating layer has a stacked-layer structure in which a fourth insulating film, a fifth insulating film, a sixth insulating film, and a seventh insulating film are stacked in this order,
wherein the seventh insulating film comprises oxygen, and
wherein the fourth insulating film, the fifth insulating film, and the sixth insulating film each comprise nitrogen.

16. The semiconductor device according to claim 15,
wherein the seventh insulating film comprises silicon oxide, and
wherein the fourth insulating film, the fifth insulating film, and the sixth insulating film each comprise silicon nitride.

17. A semiconductor device comprising:
a first insulating layer;
a second semiconductor layer over the first insulating layer;
a first semiconductor layer over the second semiconductor layer;
a second insulating layer having a stacked-layer structure in which a first insulating film, a second insulating film, and a third insulating film are stacked in this order, the second insulating layer being over the first semiconductor layer; and a first conductive layer over the second insulating layer,
wherein the first insulating film, the second insulating film, and the third insulating film each comprise an oxide,
wherein the first insulating film comprises a portion in contact with the first semiconductor layer,
wherein the first semiconductor layer comprises indium and oxygen,
wherein the second semiconductor layer comprises indium, zinc, gallium, and oxygen, and
wherein the first semiconductor layer comprises a region having a higher indium content percentage than the second semiconductor layer.

18. The semiconductor device according to claim 17,
wherein the first semiconductor layer comprises zinc and gallium,
wherein the first semiconductor layer comprises a region having a gallium content percentage lower than an indium content percentage and a zinc content percentage higher than the gallium content percentage, and
wherein the first semiconductor layer comprises a region having a zinc content percentage higher than or equal to a zinc content percentage of the second semiconductor layer.

19. The semiconductor device according to claim 17, further comprising a metal oxide layer between the second insulating layer and the first conductive layer,
wherein the metal oxide layer comprises one or more elements selected from aluminum, hafnium, indium, gallium, and zinc.

20. The semiconductor device according to claim 19,
wherein the metal oxide layer comprises indium, and
wherein the metal oxide layer and the first semiconductor layer have substantially the same indium content percentage.

21. The semiconductor device according to claim 19, wherein the first insulating film is formed at a lower deposition rate than the second insulating film.

22. The semiconductor device according to claim 19, further comprising a second conductive layer,
wherein the second conductive layer comprises a region overlapping with the second semiconductor layer with the first insulating layer therebetween,
wherein the first insulating layer has a stacked-layer structure in which a fourth insulating film, a fifth insulating film, a sixth insulating film, and a seventh insulating film are stacked in this order,
wherein the seventh insulating film comprises oxygen, and
wherein the fourth insulating film, the fifth insulating film, and the sixth insulating film each comprise nitrogen.

23. The semiconductor device according to claim 22,
wherein the seventh insulating film comprises silicon oxide, and
wherein the fourth insulating film, the fifth insulating film, and the sixth insulating film each comprise silicon nitride.

24. A semiconductor device comprising:
a first insulating layer;
a second semiconductor layer over the first insulating layer;
a first semiconductor layer over the second semiconductor layer;
a second insulating layer over the first semiconductor layer;
a metal oxide layer over the second insulating layer; and
a first conductive layer over the metal oxide layer,
wherein the first insulating layer comprises a portion in contact with the second semiconductor layer,
wherein the first semiconductor layer comprises indium and oxygen,
wherein the second semiconductor layer comprises indium, zinc, gallium, and oxygen,
wherein the first semiconductor layer comprises a region having a higher indium content percentage than the second semiconductor layer,
wherein the metal oxide layer comprises indium, and
wherein the metal oxide layer and the first semiconductor layer have substantially the same indium content percentage.

25. The semiconductor device according to claim 24,
wherein the first semiconductor layer comprises zinc and gallium,
wherein the first semiconductor layer comprises a region having a gallium content percentage lower than an indium content percentage and a zinc content percentage higher than the gallium content percentage, and
wherein the first semiconductor layer comprises a region having a zinc content percentage higher than or equal to a zinc content percentage of the second semiconductor layer.

26. The semiconductor device according to claim 24, further comprising a second conductive layer,
wherein the second conductive layer comprises a region overlapping with the second semiconductor layer with the first insulating layer therebetween,
wherein the first insulating layer has a stacked-layer structure in which a fourth insulating film, a fifth insulating film, a sixth insulating film, and a seventh insulating film are stacked in this order,
wherein the seventh insulating film comprises oxygen, and
wherein the fourth insulating film, the fifth insulating film, and the sixth insulating film each comprise nitrogen.

27. The semiconductor device according to claim 26,
wherein the seventh insulating film comprises silicon oxide, and
wherein the fourth insulating film, the fifth insulating film, and the sixth insulating film each comprise silicon nitride.

* * * * *